(12) United States Patent
Shen

(10) Patent No.: US 9,683,283 B2
(45) Date of Patent: *Jun. 20, 2017

(54) HIGH STRAIN DAMPING METHOD INCLUDING A FACE-CENTERED CUBIC FERROMAGNETIC DAMPING COATING, AND COMPONENTS HAVING SAME

(71) Applicant: Mo-How Herman Shen, Dublin, OH (US)

(72) Inventor: Mo-How Herman Shen, Dublin, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/268,748

(22) Filed: Sep. 19, 2016

(65) Prior Publication Data

US 2017/0114443 A1 Apr. 27, 2017

Related U.S. Application Data

(63) Continuation of application No. 14/059,549, filed on Oct. 22, 2013, now Pat. No. 9,458,534.

(51) Int. Cl.

| | |
|---|---|
| *C23C 14/14* | (2006.01) |
| *C23C 14/16* | (2006.01) |
| *C23C 14/24* | (2006.01) |
| *C23C 14/06* | (2006.01) |
| *C23C 14/58* | (2006.01) |
| *B32B 15/04* | (2006.01) |
| *F04D 29/38* | (2006.01) |
| *F04D 29/32* | (2006.01) |
| *F01D 5/02* | (2006.01) |
| *F04D 29/66* | (2006.01) |
| *F01D 5/26* | (2006.01) |

(52) U.S. Cl.
CPC ............ *C23C 14/16* (2013.01); *B32B 15/043* (2013.01); *C23C 14/0635* (2013.01); *C23C 14/24* (2013.01); *C23C 14/5873* (2013.01); *F01D 5/02* (2013.01); *F01D 5/26* (2013.01); *F04D 29/324* (2013.01); *F04D 29/38* (2013.01); *F04D 29/668* (2013.01); *B32B 2255/06* (2013.01); *B32B 2603/00* (2013.01); *F05D 2220/30* (2013.01); *F05D 2230/30* (2013.01); *F05D 2300/1723* (2013.01)

(58) Field of Classification Search
CPC ....... C23C 14/24–14/325; C23C 14/14–14/16; F01D 5/288
USPC .................................. 427/248.1, 250, 255.7
See application file for complete search history.

(56) References Cited

U.S. PATENT DOCUMENTS

| | | |
|---|---|---|
| 2,829,048 A | 4/1958 | Cochardt et al. |
| 2,981,620 A | 4/1961 | Brown et al. |
| (Continued) | | |

FOREIGN PATENT DOCUMENTS

| | | |
|---|---|---|
| WO | WO2011094755 | 8/2011 |

OTHER PUBLICATIONS

Young-Kook Lee et al "Effects of thermal ε martensite content and deformation on damping capacity of a Co-32 wt. % Ni alloy," Materials Science and Engineering A 370 (2004) 468-472.

(Continued)

*Primary Examiner* — Elizabeth Burkhart
(74) *Attorney, Agent, or Firm* — Gallagher & Dawsey Co., LPA; David J. Dawsey; Michael J. Gallagher

(57) ABSTRACT

A method to increase the damping of a substrate using a face-centered cubic ferromagnetic damping coating.

18 Claims, 41 Drawing Sheets

(56) References Cited

U.S. PATENT DOCUMENTS

| | | | |
|---|---|---|---|
| 3,301,530 | A | 1/1967 | Lull |
| 3,331,715 | A | 7/1967 | Bulina et al. |
| 3,758,233 | A | 9/1973 | Newman et al. |
| 3,846,159 | A | 11/1974 | Bornstein et al. |
| 4,204,887 | A | 5/1980 | Masumoto et al. |
| 4,380,574 | A | 4/1983 | Gessinger et al. |
| 4,481,237 | A * | 11/1984 | Bosshart .................. C23C 4/02 427/376.4 |
| 4,569,889 | A | 2/1986 | Przybyszewski et al. |
| 4,657,823 | A | 4/1987 | Siemers et al. |
| 4,788,077 | A | 11/1988 | Kang |
| 5,077,140 | A | 12/1991 | Luthra et al. |
| 5,498,137 | A | 3/1996 | El-Aini et al. |
| 5,507,623 | A | 4/1996 | Kojima et al. |
| 5,634,990 | A | 6/1997 | Choi et al. |
| 5,820,348 | A | 10/1998 | Fricke |
| 5,924,845 | A | 7/1999 | Bagley et al. |
| 5,938,403 | A | 8/1999 | Okada et al. |
| 6,001,426 | A | 12/1999 | Witherspoon et al. |
| 6,059,533 | A | 5/2000 | Stoker et al. |
| 6,103,186 | A | 8/2000 | Sievers et al. |
| 6,471,484 | B1 | 10/2002 | Crall |
| 6,514,040 | B2 | 2/2003 | Lewis et al. |
| 6,547,049 | B1 | 4/2003 | Tomlinson |
| 6,679,788 | B1 | 1/2004 | Heinrich et al. |
| 6,780,458 | B2 | 8/2004 | Seth et al. |
| 6,796,408 | B2 | 9/2004 | Sherwin et al. |
| 6,815,099 | B1 | 11/2004 | Zajchowski et al. |
| 6,827,551 | B1 | 12/2004 | Duffy et al. |
| 7,445,685 | B2 | 11/2008 | Deakin et al. |
| 8,017,195 | B2 | 9/2011 | Darolia et al. |
| 9,458,534 | B2 * | 10/2016 | Shen ......................... C23C 14/14 |
| 2004/0043150 | A1 | 3/2004 | Movchan et al. |
| 2004/0096332 | A1 * | 5/2004 | Shipton .................... C23C 4/02 416/241 R |
| 2005/0196635 | A1 | 9/2005 | Johnson et al. |
| 2006/0231174 | A1 | 10/2006 | Yamamoto |
| 2006/0233951 | A1 | 10/2006 | DeBiccari et al. |
| 2007/0099014 | A1 | 5/2007 | McCullough et al. |
| 2008/0124480 | A1 | 5/2008 | Shen |
| 2008/0226879 | A1 | 9/2008 | Strock et al. |
| 2009/0053068 | A1 | 2/2009 | Hardwicke et al. |
| 2009/0075101 | A1 | 3/2009 | Kulkarni et al. |
| 2009/0317236 | A1 | 12/2009 | Hardwicke |
| 2010/0086397 | A1 * | 4/2010 | Varanasi ............... C23C 14/028 415/200 |
| 2010/0136254 | A1 | 6/2010 | Darolia et al. |
| 2011/0052406 | A1 | 3/2011 | Bruce et al. |
| 2012/0042807 | A1 | 2/2012 | Sato et al. |
| 2012/0064255 | A1 | 3/2012 | Willson et al. |
| 2012/0135272 | A1 * | 5/2012 | Shen ........................ B32B 15/01 428/660 |
| 2013/0004786 | A1 | 1/2013 | Croopnick et al. |
| 2013/0074993 | A1 | 3/2013 | Hilty et al. |
| 2013/0153089 | A1 | 6/2013 | Ajdelsztajn et al. |

OTHER PUBLICATIONS

Y. Yen and M.H. Herman Shen, "Passive Vibration Suppression of Beams Using Magnetomechanical Coating," Vibration and Noise Control, DE—vol. 97/DSC—vol. 65, ASME, 1998.

Y. Yen and M.H. Herman Shen, "Passive Vibration Suppression of Turbine Blades Using Magnetomechanical Coating" 4th National Turbine Engine High Cycle Fatigue Conference, Feb. 1999.

Y. Yen and M.H. Herman Shen, "Development of a Passive Turbine Blade Damper Using Magnetomechanical Coating," 5th National Turbine High Cycle Fatigue Conference Mar. 2000.

Y. Yen and M.H. Herman Shen, 2000-GT-366 "Development of a Passive Turbine Blade Damper Using Magnetomechanical Coating," Proceeding of ASME International Gas Turbine & Aeroengine Congress & Exhibition, May 2000.

Y. Yen and M.H. Herman Shen, "Passive Vibration Suppression of Turbine Blades Using Magnetomechanical Coating," Journal of Sound and Vibration, vol. 245, No. 4, pp. 701-744, 2001.

M.H. Herman Shen, "Development of a Free Layer Damper Using Hard Coatings," 7th National Turbine Engine High Cycle Fatigue Conference, May 2002.

Herman Shen, "Free Layer Damper by Magneto-Mechanical Coating," 10th National Turbine Engine High Cycle Fatigue Conference, Mar. 2005.

A. Karimi, CH. Azcoitia, and J. Degauque, "Relationships Between Magnetomechanical Damping and Magnetic Properties of Fe—Cr (Al,Mo) Alloys" Journal of Magnetism and Magnetic Materials 215-216, 2000.

CH. Azcoitia and A. Karimi, "Magnetomechanical Damping in Fe—Cr Alloys and Effect of Al and Mo Addition," Journal of Alloys and Compounds 310, pp. 160-164, 2000.

D. Pulino-Sagradi, M. Sagradi, A. Karimi and J.L. Martin,"Damping Capacity of Fe—Cr-X High-Damping Alloys and Its Dependence on Magnetic Domain Stucture," Scripta Materialia vol. 39, No. 2, pp. 131-138, 1998.

A. Karimi et al, "High Damping Capacity Coatings for Surface Vibration Control," Journal De Pysiques IV,Colloque C8, supplement au Journal de Physique III, vol. 6, Dec. 1996.

T. Lillo and R. Wright, Microstructure, Processing, Performance Relationships for High Temperature Coatings, 22nd Annual Conference on Fossil Energy Materials, Jul. 8-10, 2008.

C. Lyphout, P. Nylen, and J. Wigren, "Characterization of Adhesion Strength and Residual Stresses of HVOF Sprayed Inconel 718 for Aerospace Repair Applications," International Thermal Spray Conference and Exposition, May 14-16, 2007.

International Searching Authority (USPTO), International Search Report and Written Opinion for International Application No. PCT/US2012/040978, mailed Aug. 31, 2012, 8 pages.

A.I. Ustinov, B.A. Moychan, F. Lemke, and V.S. Skorodzievsky, Damping Capacity of Co—Ni and Co—Fe Coatings Produced by Electron Beam Deposition, Vibrations in Technique and Technology, 2001, 123-126, No. 4(20).

English Translation—A.I. Ustinov, B.A. Moychan, F. Lemke, and V.S. Skorodzievsky, Damping Capacity of Co—Ni and Co—Fe Coatings Produced by Electron Beam Deposition, Vibrations in Technique and Technology, 2001, 123-126, No. 4(20).

A. I. Ustinov,V. S. Skorodzievskii, N. S. Kosenkob, A Study of the Dissipative Properties of Homogeneous Materials Deposited as Coatings. Part 1. Method for the Determination of the Amplitude Dependence of the True Vibration Decrement of the Coating Material, Strength of Materials, vol. 39, No. 6, 2007 p. 663-670.

Colakoglu, "Factors Effecting Internal Damping in Aluminium." Journal of Theoretical and Applied Mechanics, 42, 1, 2004, pp. 95-105 (2004).

International Searching Authority (USPTO), International Search Report and Written Opinion for International Application No. PCT/US2014/058711, mailed Jun. 22, 2015, 16 pages.

Sep. 5, 2015, USPTO Non Final Rejection. U.S. Appl. No. 14/059,538.

Sep. 17, 2015, USPTO Non Final Rejection. U.S. Appl. No. 14/059,549.

* cited by examiner

HIGH STRAIN DAMPING METHOD INCLUDING A FACE-CENTERED CUBIC FERROMAGNETIC DAMPING COATING, AND COMPONENTS HAVING SAME

CROSS REFERENCE TO RELATED APPLICATIONS

This application is a continuation of U.S. application Ser. No. 14/059,549, filed on Oct. 22, 2013, the entire contents of which are hereby incorporated by reference.

STATEMENT REGARDING FEDERALLY SPONSORED RESEARCH OR DEVELOPMENT

Part of the invention herein described was made in the course of or under a contract with the U.S. Department of the Navy.

TECHNICAL FIELD

The present disclosure relates to coatings applied to a surface of a substrate. More specifically, the present disclosure is directed to a method to increase the high strain damping of a substrate using a face-centered cubic ferromagnetic damping coating to improve the durability, reliability, safety, and performance of gas turbines, steam turbines, and other metallic articles which operate under cyclic loading conditions.

BACKGROUND OF THE INVENTION

Engineering components, particularly rotating components such as turbine fan blades, compressor blades, impellers, blisks, and integrally bladed rotors (IBRs), commonly encounter vibrational stresses in operation. These vibrational stresses can fatigue the component and eventually cause the component to fail. In order to prevent component failure, researchers have investigated a number of approaches for attenuating the vibrations that develop under cyclic loading. Such approaches have included dry friction dampers, tuned-mass or particles, air cavities, shape memory alloys, viscoelastic dampers, and ceramic coatings. Another approach that has been considered for vibration damping is the application of a thin coating of a ferromagnetic material on a surface of a substrate. Examples of ferromagnetic materials are Fe alloys including combinations of one or more Al, Mo and Mn and Co alloys including combinations of one or more Ni, Cr, Mn, and Si. In particular, Fe—Cr based ferromagnetic materials comprising about 16% (by weight) chromium (Cr), either about 1% to about 6% aluminum (Al) or about 1% to about 4% molybdenum (Mo), and the balance iron (Fe), have been shown to exhibit high damping, as well as good mechanical strength and corrosion resistance. As a result, the ferromagnetic materials are considered well-suited for applications involving severe and hostile operating conditions, such as those experienced by turbine components. There are several drawbacks to prevent application of ferromagnetic materials for vibration damping enhancement. These drawbacks include: (I) ferromagnetic damping may be constrained by residual stresses during the coating processes; and (II) ferromagnetic damping is strain dependent and usually reaches to the maximum value at very low strain levels and quickly decays to low damping at high strain regions.

As mentioned, Fe—Cr based ferromagnetic materials have been shown to possess a high damping capacity. These ferromagnetic materials include magnetic domains, which are separated by magnetic domain walls. When the ferromagnetic material is exposed to external magnetic fields or stresses, the magnetic domain walls can move. When the movement of the magnetic domain walls is irreversible, a portion of the energy provided to the ferromagnetic material is dissipated as internal friction. This damping mechanism is commonly referred to as magnetomechanical damping. Thus, high damping in ferromagnetic materials is achieved due to the irreversible movement of the magnetic domain walls. If movement of the magnetic domain walls is constrained or hindered, the ferromagnetic material will not exhibit any appreciable damping. Unfortunately, conventional coating processes may create large residual stresses that act as obstacles to the movement of the magnetic domain walls. For example, in a conventional air plasma spray process, the residual stress is dominated by tensile quenching stresses; while in a conventional cold spray process, the residual stress is dominated by compressive peening stresses. As a result, a ferromagnetic coating applied to a substrate by conventional coating processes will provide no significant damping. In order to free up the movement of the magnetic domain walls, the common course of action is to subject the coated article to a high temperature annealing process. For example, one commonly suggested process includes an annealing process in a high vacuum at temperatures between 900° C. to 1200° C. for 6 hours. Such a high temperature annealing process is a critical drawback that has hindered the use of ferromagnetic materials in real world applications. For example, high temperature annealing of geometrically complex structural components, such as gas turbine engine components, can cause microstructural defects, decomposition, and precipitation in component substrate materials. Further, such high temperature annealing may warp or deform the structural component rendering the component unfit for its intended use. Thus there is a need in the art for a process capable of depositing a coating comprising a ferromagnetic damping material on a surface of a substrate without requirement of high temperature heat treatment.

The dependency of the strain or stress amplitude and the damping capability (characterized as loss factory $\eta$ or $Q^{-1}$) of ferromagnetic materials have been carefully evaluated. A number of vibration modal analyses/tests have been conducted on a flat polished beam specimen, made substantially entirely from the ferromagnetic material with composition contain of a mixture of Fe and Cr, and an active ingredient of Al or Mo. The weight ratios of Fe—Cr—Al or Mo are Fe-16% Cr-0% Al or Mo to Fe-16% Cr-6% Al or Fe-16%-4% Mo. As shown in FIG. 6, high damping capability and the damping dependence of the applied strain was obtained based on the experimental data at the first bending mode of a beam made entirely of the BCC Fe—Cr based ferromagnetic materials/alloys named as "low strain." The frequency response results clearly show that the damping capacity of the coating specimen improves as the forcing acceleration increases. However, the damping increases rapidly as the forcing accelerations increases and reaches a stationary value as the maximum strain of the beam approaching 80 to 100 micro-strains and then decreases relatively quickly at higher strain regions. Fatigue failure in real turbine hardware is usually occurs under high strain or stress operating conditions. Therefore, there is a need in the art for a new ferromagnetic material capable of providing high damping at high strain regions. Thus there is a need in the art for a process capable of depositing a coating comprising a face-centered cubic ferromagnetic damping material on a surface of a substrate that exhibits a high damping capacity, particularly at high strain levels, without having to undergo a high temperature annealing process.

SUMMARY OF THE INVENTION

In its most general configuration, the presently disclosed method for applying a face-centered cubic ferromagnetic damping coating advances the state of the art with a variety of new capabilities and overcomes many of the shortcomings of prior methods in new and novel ways. The method for applying a face-centered cubic ferromagnetic damping coating overcomes the shortcomings and limitations of the prior art in any of a number of generally effective configurations. The face-centered cubic ferromagnetic damping coating is applied to a surface of a substrate that is selected from the group consisting of Co—Ni based face-centered cubic compositions, Co—Mn based face-centered cubic compositions, and Fe—Mn based face-centered cubic compositions. The face-centered cubic ferromagnetic damping coating may be applied using several different processes and application parameters that ensure the coating has low residual stress and possesses good damping properties in high strain regions. Such processes include, but are not limited to, high velocity oxygen fuel (HVOF) system embodiments, cold spray process embodiments, and physical vapor deposition (PVD) process embodiments.

BRIEF DESCRIPTION OF THE DRAWINGS

Without limiting the scope of the claimed method and associated products, reference is now given to the drawings and figures:

These drawings are provided to assist in the understanding of exemplary embodiments as described in more detail below and should not be construed as unduly limiting. In particular, the relative spacing, positioning, and dimensions of the various elements are not drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings.

DETAILED DESCRIPTION OF THE INVENTION

The presently disclosed method for applying a high strain damping coating enables a significant advance in the state of the art. The preferred embodiments of the method accomplish this by new and novel arrangements of elements and steps that are configured in unique and novel ways and which demonstrate previously unavailable but preferred and desirable capabilities. The description set forth below in connection with the drawings is intended merely as a description of the embodiments of the claimed method, and is not intended to represent the only form in which the method may be constructed, carried out, or utilized. The description sets forth the designs, functions, means, and methods of implementing the method in connection with the illustrated embodiments. It is to be understood, however, that the same or equivalent functions and features may be accomplished by different embodiments that are also intended to be encompassed within the spirit and scope of the claimed method.

Figure 2:
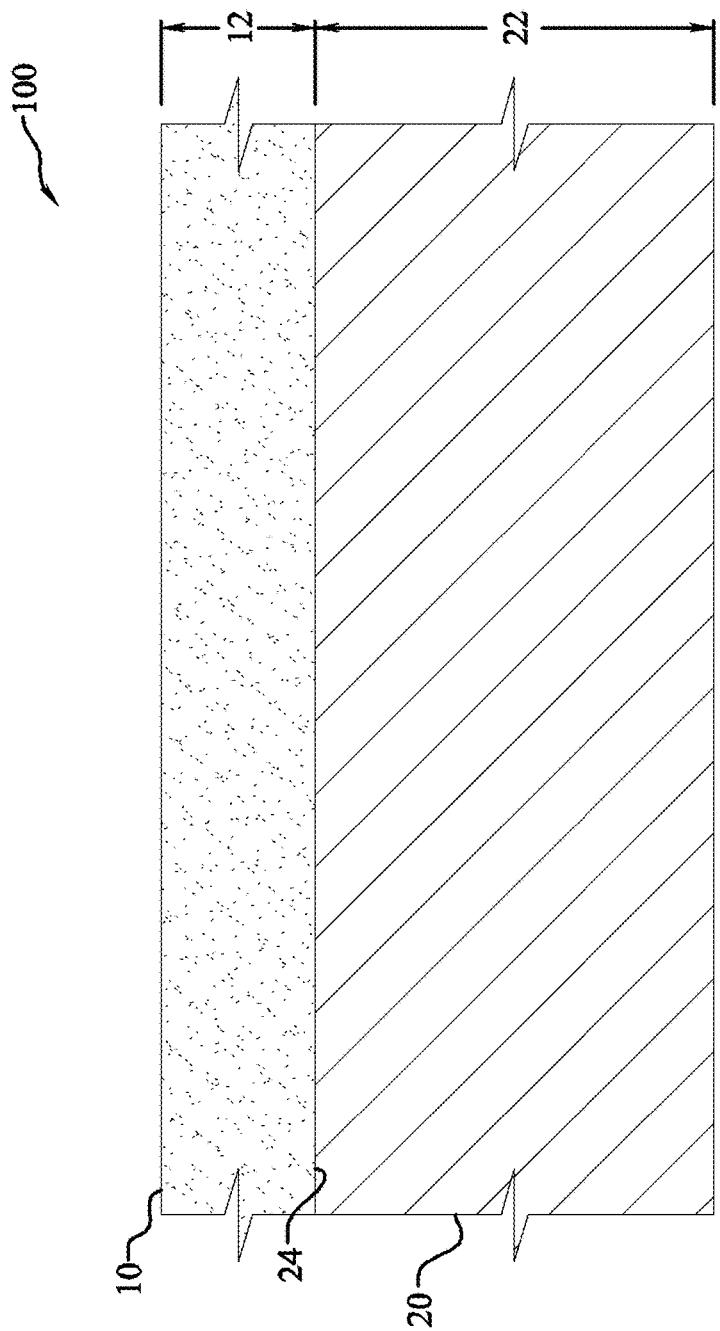
FIG. 2 is a cross-sectional view of a substrate with a face-centered cubic ferromagnetic damping coating applied to a surface thereof, not to scale.

With reference now to FIG. 2, a cross-sectional view of a substrate (20) having a face-centered cubic ferromagnetic damping coating (10) applied to a surface (24) of the substrate (20) is shown. The face-centered cubic damping powder is selected from the group consisting of Co—Ni based face-centered cubic compositions, Co—Mn based face-centered cubic compositions, and Fe—Mn based face-centered cubic compositions. In one embodiment, the face-centered cubic (FCC) ferromagnetic damping material utilized to create the face-centered cubic ferromagnetic damping coating (10) comprises a Co—Ni based face-centered cubic ferromagnetic damping material. In one embodiment the face-centered cubic damping powder includes 20-40 weight % nickel. In a further embodiment the face-centered cubic damping powder includes about 22% (by weight) to about 40% of nickel (Ni), with a majority of the balance being cobalt (Co). One particular Co—Mn based face-centered cubic composition includes at least 15-26 weight % manganese. Further, a Fe—Mn based face-centered cubic composition includes at least 13-25 weight % manganese. In a further embodiment the Fe—Mn face-centered cubic damping powder includes at least 15-22 weight % manganese. Further Co—Ni based face-centered cubic ferromagnetic damping material embodiments include 0.1-0.5 weight % aluminum to aid in the mixing of a powder and formation of an ingot, depending on the application process, thereby reducing porosity of the face-centered cubic ferromagnetic damping coating (10); and even further embodiments may include 0.5-1.5 weight % chromium to further reduce porosity.

Figure 1:
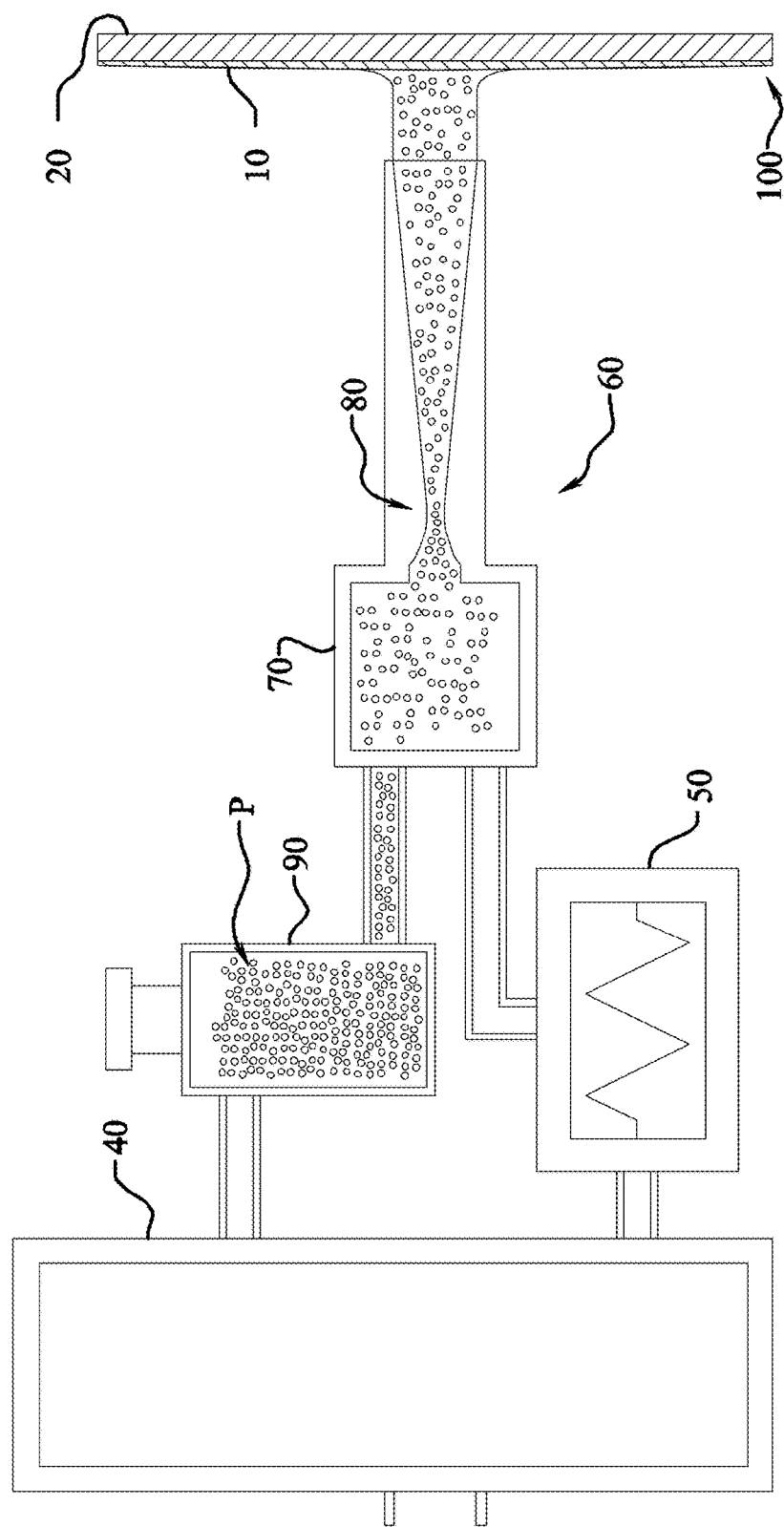
FIG. 1 is a schematic of equipment applying a face-centered cubic ferromagnetic damping coating on a surface of a substrate, not to scale.

With reference now to FIG. 1, an embodiment of a method for applying a low residual stress high strain face-centered cubic ferromagnetic damping coating (10) to a surface (24) of a substrate (20) will be described. As seen in FIG. 1, the components of a cold spray process generally include a gas supply (40) that is routed to a spray gun (60) and through a powder feed system (90) containing the face-centered cubic damping powder. The gas supply (40) that is routed directly to the spray gun (60) may pass through a heater (50). The powder feed system (90) is also fed to the spray gun (60) where it mixes prior to being accelerated in a nozzle (80). The gas and powder mixture are discharged from the spray gun (60) at a very high velocity, generally greater than 300 meters per second, and often supersonic.

In another embodiment the face-centered cubic damping powder is heated before it is fed into the spray gun (60). In this embodiment the face-centered cubic damping powder is heated to a temperature that is at least 5% less than the melting point of any component of the damping powder. In a further heated powder embodiment the face-centered cubic damping powder is heated to a temperature of at least 400 degrees Celsius. The face-centered cubic damping powder may be heated via a diode laser or high temp gas heater that is highly controlled so that the face-centered cubic damping powder is hot but not molten so that lower particle velocities may be used, thereby reducing the peening compressive stress and producing very low residual stress in face-centered cubic ferromagnetic damping coating (10).

In one embodiment the spray gun (60) may be from the CGT KINETIKS-4000/34-x cold spray system, which uses the energy stored in high press compressed gas, generally nitrogen or helium, to propel the face-centered cubic damping powder at very high velocities, generally 300-1500 meters per second. Compressed gas is fed into the gun via a heating unit through a nozzle at very high speed. The face-centered cubic damping powder is accelerated to a predetermined velocity where on impact with substrate it deforms and bonds to form a dense face-centered cubic ferromagnetic damping coating (10). The temperature of the face-centered cubic damping powder increases through the process, which in some embodiments includes a step of heating the powder, however in the cold spray process embodiment the powder always remains in the solid state, hence the bulk reaction on impact is solid state only and the coatings tend to be stressed and deformed under compression.

In one embodiment the low stress face-centered cubic ferromagnetic damping coating (10) is achieved by utilizing a very low application velocity in the range of approximately 300 meters per second to 750 meters per second, while utilizing a spray gun (60) temperature of 400-700 degrees Celsius. The high strain face-centered cubic damping powder of the present invention require tight control of these parameters because the associated high strength values of the high strain face-centered cubic damping powder can quickly foul the spray gun (60) if it becomes too soft as a result of overheating.

Unique process parameters are used to apply the face-centered cubic ferromagnetic damping coating (10) and achieve low residual stress and produce a damping coating (10) having relatively large grain sizes, which enhances the high strain damping performance. Conventional cold spray and HVOF process parameters are designed to achieve good bond strength and density, and would result in residual stress levels and small coating grain size that negatively impact the damping capabilities, particularly high strain damping. Conventional wisdom generally utilizes high velocity application of the face-centered cubic ferromagnetic damping powder, often indicated by a high gas pressure of greater than 40 Bar, applied very close to the substrate, generally a spray distance of less than 20 mm, with a gun temperature of 400-500° C. The present relationship of process parameters results in very low residual compressive stress and large coating grain size, thereby resulting in improved damping capabilities, particularly at high strain levels. A preferred relationship between spray gun temperature, gas pressure, gas flow rate, powder feed rate, powder size, and spray distance has been discovered. In one particular embodiment a preferred coated substrate (100) is produced when the face-centered cubic ferromagnetic damping powder is delivered within the spray parameters and ranges identified in Table 1 below.

TABLE 1

| # | PARAMETER | VALUE |
|---|---|---|
| 1 | Process Gas | Nitrogen or Helium |
| 2 | Gun Temperature (° C.) | 400-700 |
| 3 | Gas Pressure (Bars) | 20-45 |
| 4 | Carrier Gas (Nitrogen) Flow Rate (m3/Hr) | 2.0-3.0 |
| 5 | Powder Feed Rate (RPM) | 1.5-3.0 |
| 6 | Powder size (μm, microns) | 5-100 |
| 7 | Spray distance (mm) | 10-40 |

In a preferred embodiment the process parameter relationships produce a particularly low residual stress and large grain size by utilizing a low velocity characterized by a gas pressure of less than 30 Bar in combination with a relatively high gun temperature of at least 500° C. and a large spray distance of at least 25 mm. In an even further embodiment preferred high strain damping was achieved when the process parameter relationships produce a particularly low residual stress and large grain size by utilizing a gas pressure of less than 25 Bar in combination with a gun temperature of at least 600° C. and a spray distance of at least 35 mm. Further, another embodiment may deposit multiple layers face-centered cubic ferromagnetic damping coating (10) with each layer being applied using different process parameters to achieve different grain sizes and/or damping properties. For example a first layer may utilize process parameter relationships produce a particularly low residual stress and large grain size by utilizing a low velocity characterized by a first gas pressure and a first gun temperature, and a second layer may utilize process parameter relationships produce a different grain size by utilizing a second gas pressure and a second gun temperature, wherein the first gas pressure and the second gas pressure differ by at least 15% and the first gun temperature and the second gun temperature differ by at least 20%.

Figure 24:
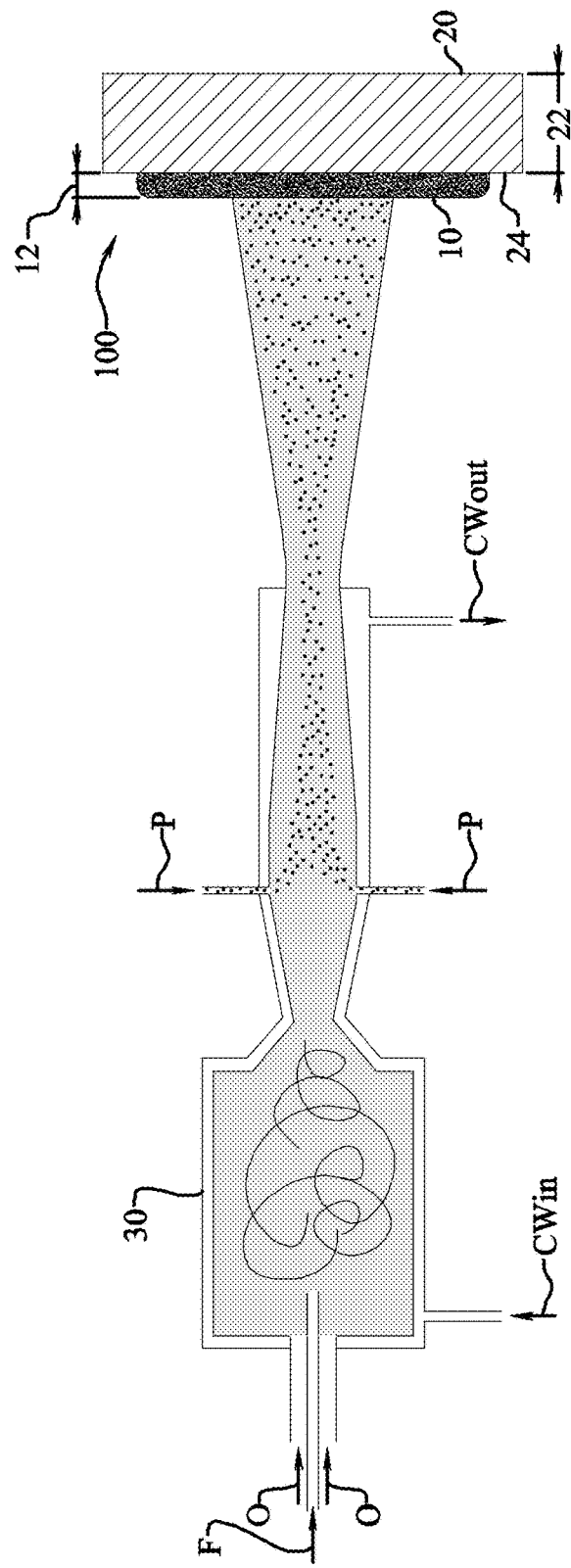
FIG. 24 is a schematic of equipment applying a face-centered cubic ferromagnetic damping coating on a surface of a substrate, not to scale.

In addition to the cold spray process embodiment just discussed, another embodiment utilizes a high velocity oxygen fuel (HVOF) system to apply the low residual stress high strain face-centered cubic ferromagnetic damping coating (10) to a surface (24) of a substrate (20). In this embodiment, as seen in FIG. 24, the HVOF method utilizes a spray torch (30) for applying the face-centered cubic damping powder to the surface (24) of the substrate (20). The spray torch (30) preferably comprises a high velocity oxygen fuel (HVOF) type torch, such as those used in connection with the Praxair-Tafa JP-5000 HVOF spray system and Jet Kote spray systems. In a HVOF spray system embodiment, a mixture of fuel (F) and oxygen (O) is fed to the spray torch (30) where the mixture is combusted. The face-centered cubic damping powder (P) is fed to the spray torch (30) where the powder (P) particles are entrained by the combustion gases and undergo heating and acceleration as they travel through and exit the spray torch (30). The spray torch (30) may be supplied with cooling water (CW) to help control the temperature of the process.

In one HVOF embodiment, the method includes heating the face-centered cubic damping coating powder so that it is at least partially molten. The heating step may be accomplished in the spray torch (30) from the hot combustion gases as described above. To ensure that the face-centered cubic damping coating powder is at least partially molten, it is preferable to heat the face-centered cubic damping coating powder to, or near, its melting point. Next, the at least partially molten face-centered cubic damping coating powder is directed at a surface (24) of the substrate (20) at a HVOF application velocity. The HVOF application velocity is such that the at least partially molten face-centered cubic damping coating powder adheres to the surface (24) of the substrate (20). After the at least partially molten face-centered cubic damping coating powder adheres to the surface (24) of the substrate (20), it cools to solidification within a solidification period to create the face-centered cubic ferromagnetic damping coating (10) on the surface (24) of the substrate (20), thus forming a coated substrate (100). The solidification period is relatively rapid, generally less than a few seconds.

In addition to the high velocity oxygen fuel (HVOF) system and the cold spray process embodiments just discussed, another embodiment utilizes an electron beam physical vapor deposition (EB-PVD) process to apply the low residual stress high strain face-centered cubic ferromagnetic damping coating (10) to a surface (24) of a substrate (20). As opposed to the HVOF process and the cold spray process that apply a face-centered cubic damping coating powder at significant velocity to the substrate, one skilled in the art will recognize that the EB-PVD process utilizes focused high-energy electron beams generated from electron guns to melt and evaporate ingots of the face-centered cubic damping coating material as well as to preheat the substrate inside a vacuum chamber. Thus, all the disclosure herein with respect the composition of the face-centered cubic damping coating powder is also applicable to an ingot, or ingots, of face-centered cubic damping coating material used in the EB-PVD process. Due to the change in pressure, the vapor rises and traverses the vacuum chamber where it condenses on the substrate to form the face-centered cubic ferromagnetic damping coating (10). To obtain more uniform coatings, the sample is often rotated during the coating process. In one particular embodiment the substrate (20) is heated and maintained at a temperature of 50° C. to 350° C. to ensure good fatigue performance.

When discussing electron beam (EB) evaporation techniques for compounds, one skilled in the art will know that there are three main methods used to obtain the proper stoichiometry or phase of the compound; namely, direct evaporation, reactive ion beam evaporation, and co-evaporation. Further, references used herein to the ED-PVD process include derivatives of the EB-PVD process such as ion plating and activated reactive evaporation, as well as ion beam assisted deposition (IBAD), which is often used in conjunction with one of the conventional evaporation or PVD techniques to change the properties and microstructure of the depositing coating. In one embodiment the state of the internal stresses developed in the coating can be changed from tensile to compressive stress by the forcible injection of high-energy atoms (i.e., ion implantation). Thus, the ability to control the stress level is an additional feature of the IBAD. Ion bombardment during deposition has a tendency to reduce the tensile stress and often changes the intrinsic stress from tensile to compressive.

In another embodiment ion beam assisted deposition (IBAD) is used to increase the hardness of the coated substrate (100). The increase in hardness is obtained by increasing the density, decreasing grain size, changing stress state, and/or controlling the crystallographic texture of the coating. A further embodiment includes ion implantation, which is a higher degree of energy than IBAD, of Ni and Ti to increase the hardness of the coated substrate (100).

In one embodiment the EB-PVD process is preceded by a bombardment of the substrate surface prior to deposition (i.e., sputter cleaning) to promote better adhesion of the face-centered cubic damping coating. This sputter cleaning serves to remove adsorbed hydrocarbons and water molecules, and increase the density of nucleation sites for condensation.

Multiple test beams were coated with the face-centered cubic damping coating (10) using the EB-PVD method to develop the data contained in the figures. In fact multiple specimens of varying sizes were coated using the EB-PVD method and tested. The thickness of the face-centered cubic ferromagnetic damping coating (10) on the test specimens was approximately 0.002-0.005 inches.

The cold spray process embodiment, the HVOF process embodiment, and the EB-PVD process embodiment produce a face-centered cubic ferromagnetic damping coating (10) with a low residual stress. In this HVOF embodiment the low residual stress includes at least a tensile quenching stress component and a compressive peening stress component. The tensile quenching stress component is contributed by the cooling and contraction of the at least partially molten face-centered cubic ferromagnetic damping coating powder on the surface (24) of the substrate (20). On the other hand, the compressive peening stress component is induced by the at least partially molten face-centered cubic ferromagnetic damping coating powder impacting the surface (24) of the substrate (20), or coating (10), at high velocity causing a slight plastic deformation of the substrate (20) or coating (10). It has been appreciated that by carefully controlling the application temperature and the application velocity of the face-centered cubic ferromagnetic damping coating powder, the compressive peening stress component may be increased and the tensile quenching stress component may be decreased. As a result, the face-centered cubic ferromagnetic damping coating (10) of the HVOF embodiment may have a low residual stress, where the compressive peening stress component and the tensile quenching stress component effectively cancel, or balance, one another to provide an approximately balanced coating residual stress.

Figure 4:
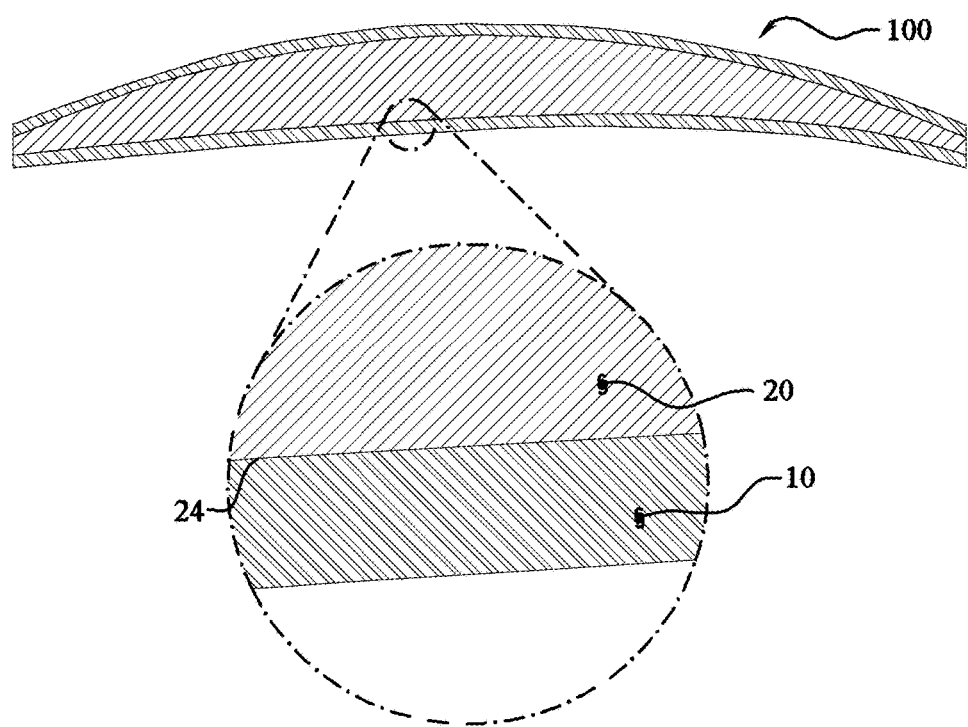
FIG. 4 is a cross-sectional view of a substrate with a face-centered cubic ferromagnetic damping coating applied to a surface thereof, not to scale.
Figure 5:
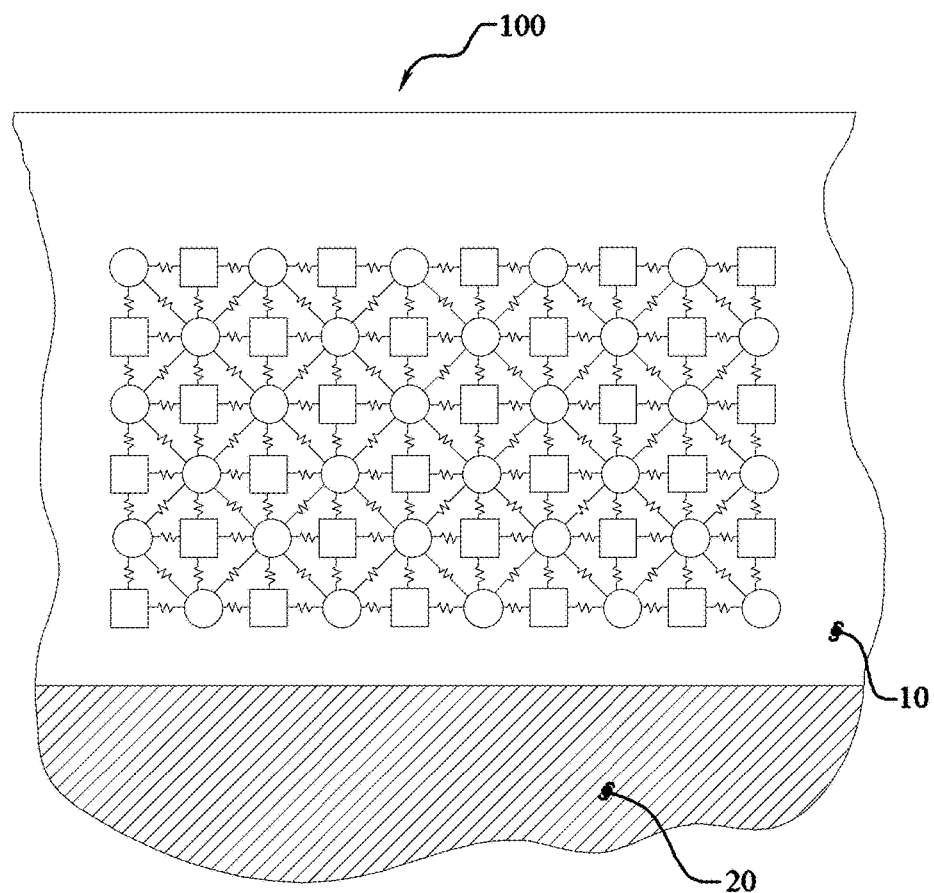
FIG. 5 is a cross-sectional view of a substrate with a face-centered cubic ferromagnetic damping coating applied to a surface thereof, not to scale.

The cold spray process embodiment, the HVOF process embodiment, and the EB-PVD process embodiment provide the ability to apply a face-centered ferromagnetic damping coating (10) on a surface (24) of a substrate (20) that achieves high damping without having to subject the coated substrate (100) to a high temperature annealing process, such as annealing at an annealing temperature of above 700° C. for an annealing period of longer than 30 minutes, followed by a controlled furnace cooling. The high damping is due in part to the face-centered cubic ferromagnetic damping coating's (10) low residual stress, which is believed to create a substantially smaller amount of obstacles (i.e., pinning sites) that hinder the movement of the magnetic domain walls within the ferromagnetic damping coating (10). Applicant has found that a residual stress within a range of ±50 MPa (with positive values representing a tensile residual stress and negative values representing a compressive residual stress) allows a high level of damping in the face-centered cubic ferromagnetic damping coating (10). As used herein, the phrases "balanced coating residual stress" and "low residual stress" refer to a residual stress of the coating (10) within a range of ±50 MPa. As a result of the low residual stress, geometrically complex structural components, such as gas turbine components as seen in FIG. 4, may be damped with a face-centered cubic ferromagnetic damping coating (10) without suffering the drawbacks associated with the high temperature annealing process.

In a particular HVOF embodiment, the at least partially molten face-centered cubic ferromagnetic damping coating powder is directed at the substrate at an application temperature of at least 800° C. and at an application velocity of at least 450 meters per second. These application parameters provide a delicate balance between the thermal and kinetic energy imparted upon the face-centered ferromagnetic damping coating powder to obtain a low residual stress within the ±50 MPa range to achieve a high level of high strain damping from the face-centered cubic ferromagnetic damping coating (10).

In one embodiment the method to increase the damping of a substrate (20) having a substrate thickness (22) comprises the steps of (a) creating a face-centered cubic damping powder having an average particle size of 5-100 micrometers; and (b) directing the damping powder at a surface (24) of the substrate (20) at an application velocity of at least 300 meters/second using a carrier gas at an application pressure such that at least a portion of the damping powder bonds to the surface (24) of the substrate (20) to create a face-centered cubic ferromagnetic damping coating (10) on the surface (24) of the substrate (20), resulting in a coated substrate (100). In this embodiment the face-centered cubic ferromagnetic damping coating (10) has a coating thickness (12) of about 1% to about 30% of the substrate thickness (22), and in one embodiment the substrate (20) is preferably coated on each side with each side having a coating thickness (12) of 5-14% of the substrate thickness (22).

Figure 26:
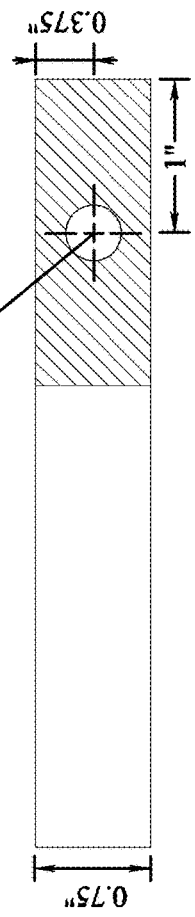
FIG. 26 is a top plan view of a dimensioned cast test beam, not to scale.
Figure 27:
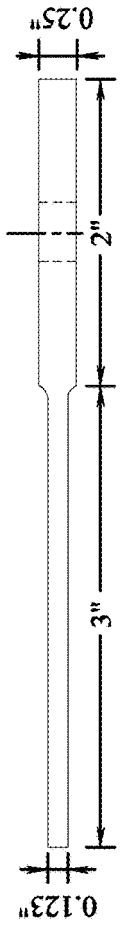
FIG. 27 is a side elevation view of a dimensioned cast test beam, not to scale.
Figure 28:
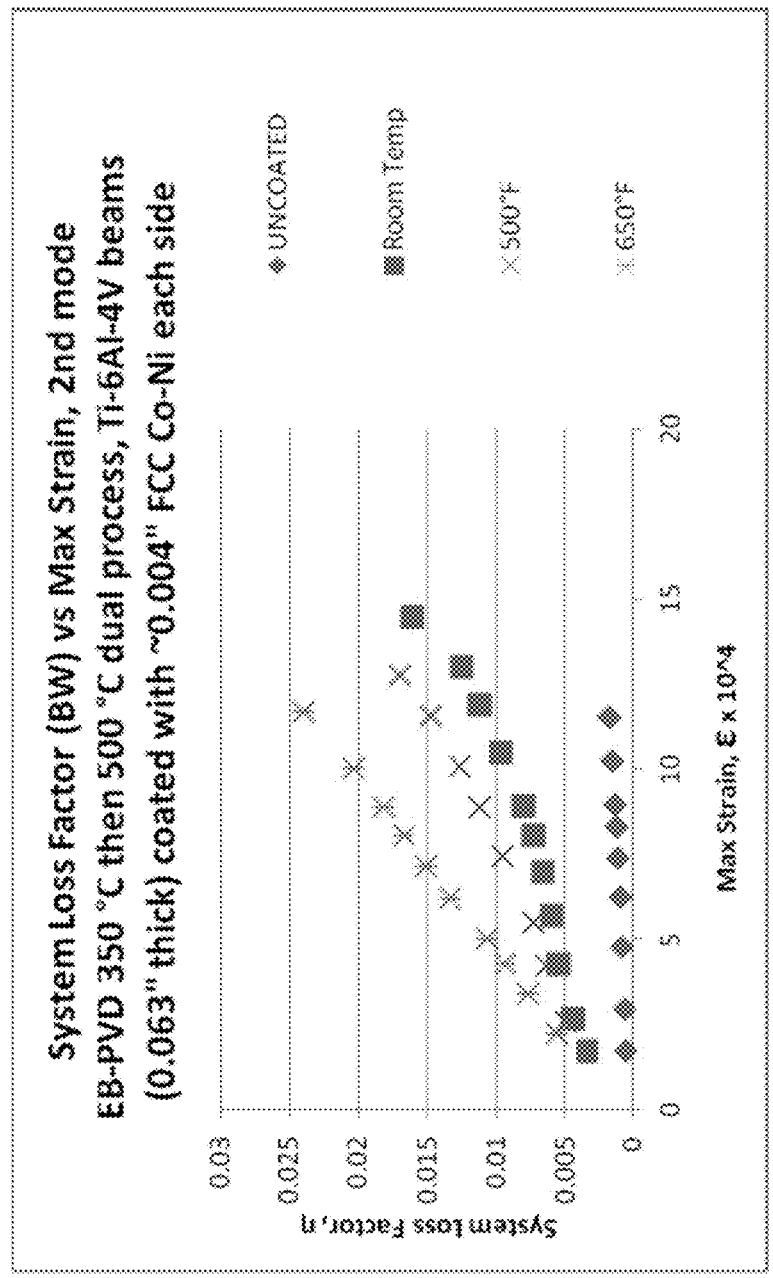
FIGS. 28 & 29 show a graph of a coated beam system loss factor versus max strain at the second bending mode for several test specimens.
Figure 29:
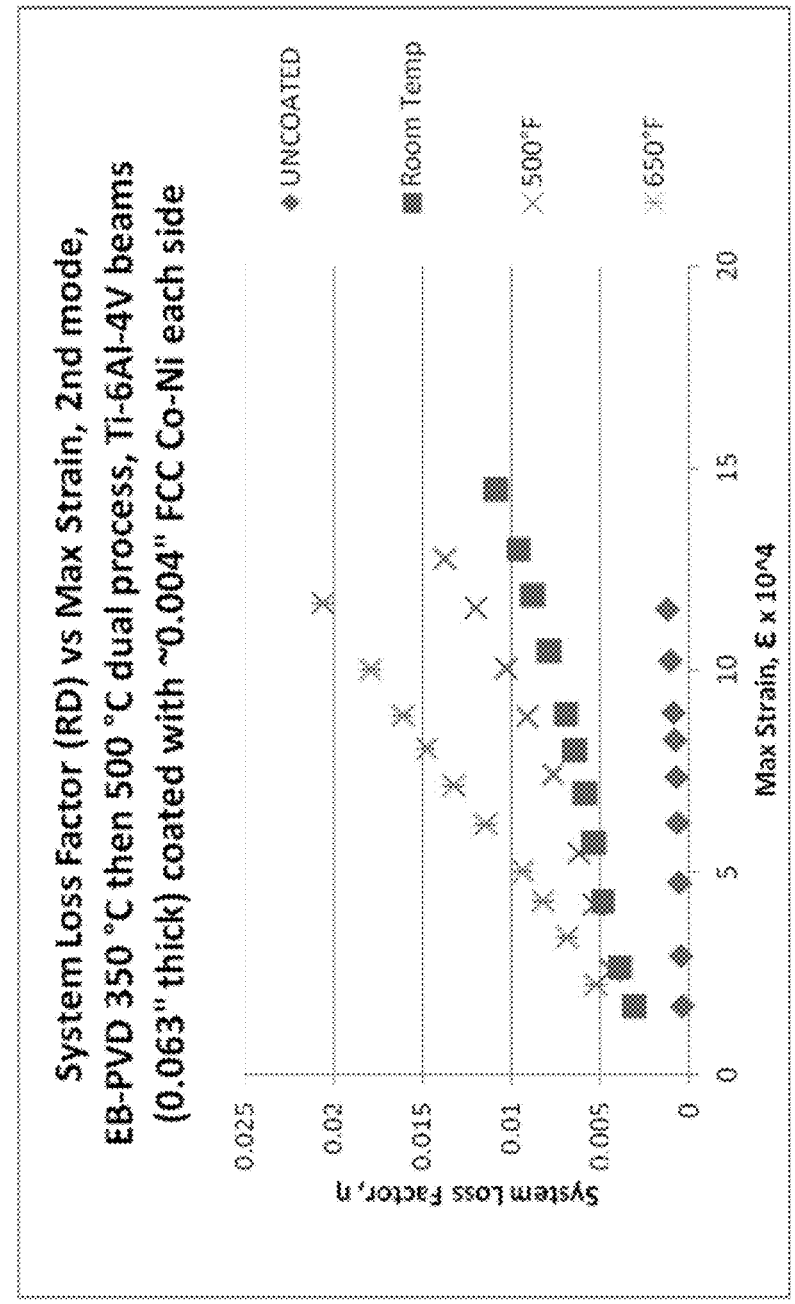
Figure 30:
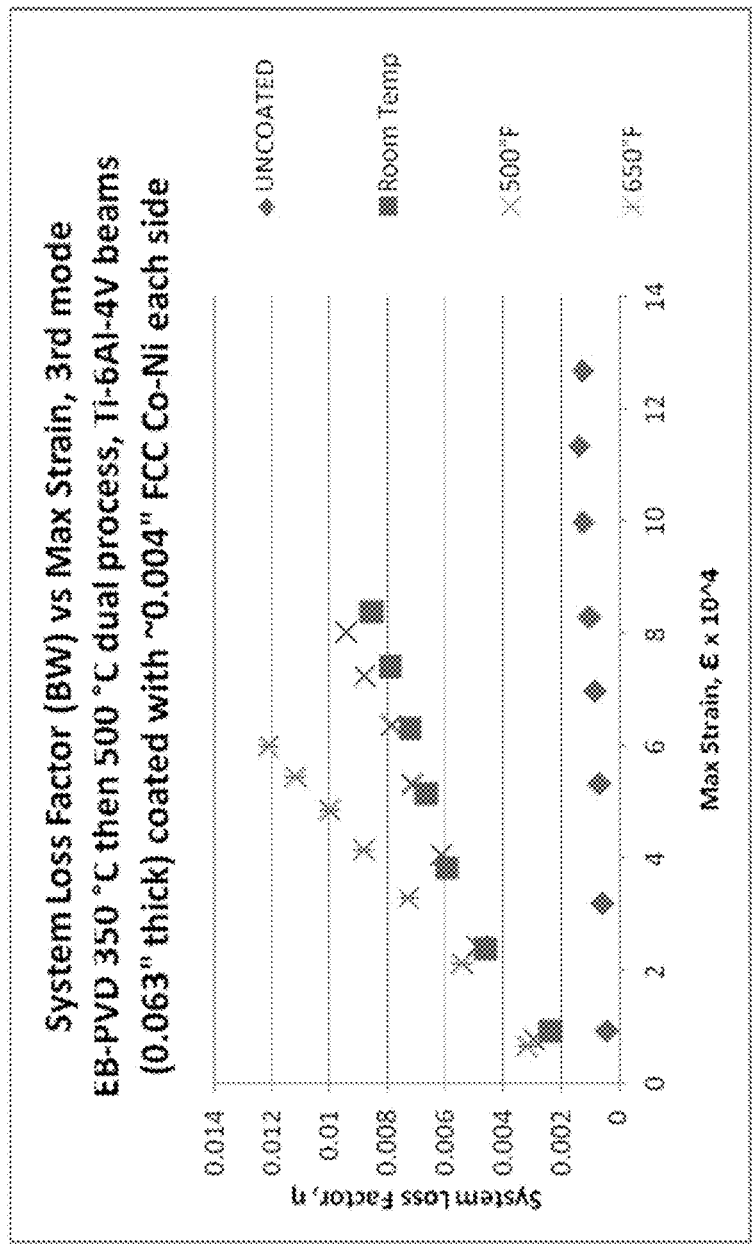
FIGS. 30 & 31 show a graph of a coated beam system loss factor versus max strain at the third bending mode for several test specimens.
Figure 31:
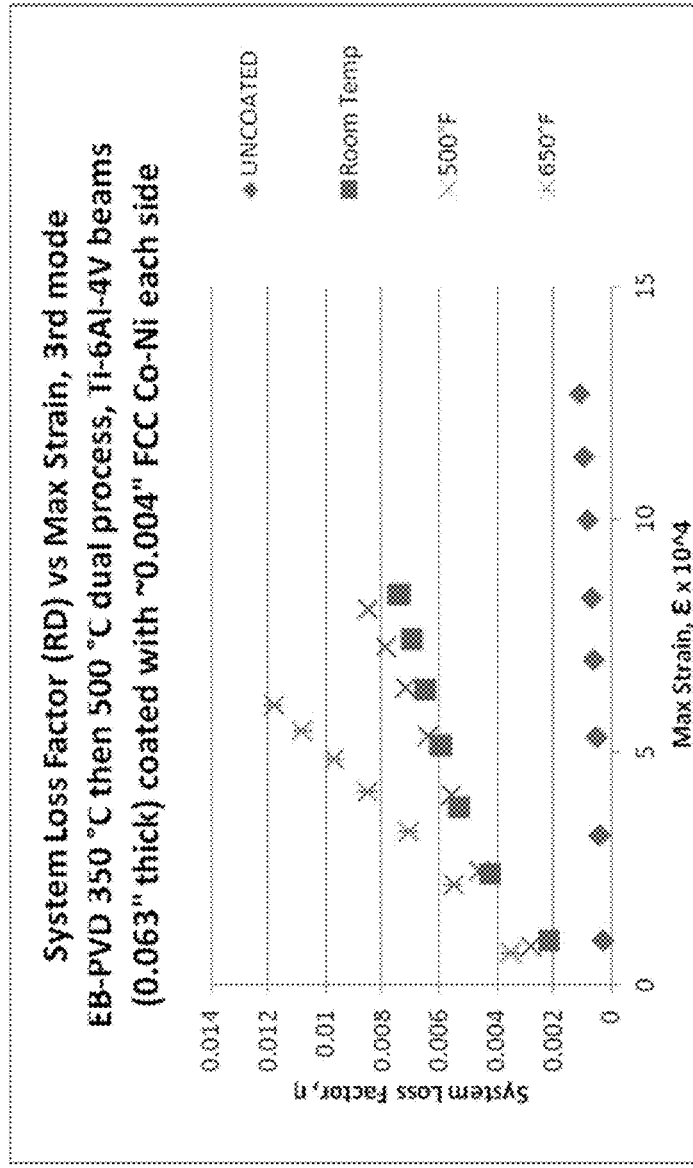
Figure 32:
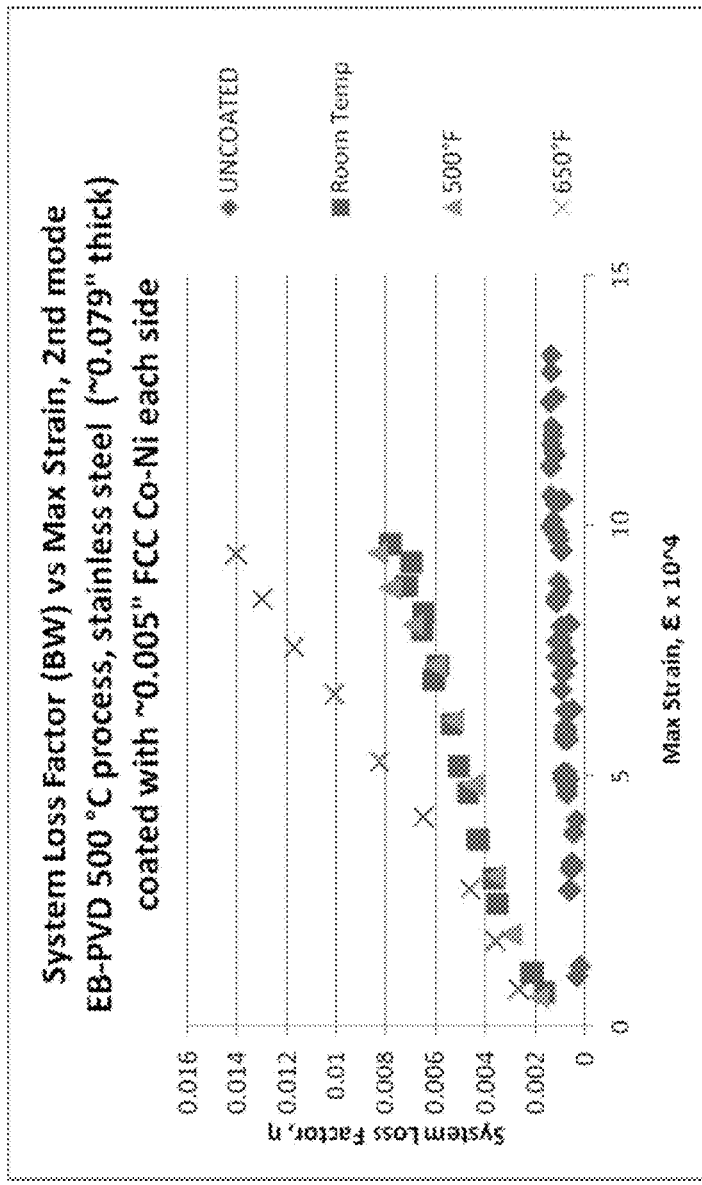
FIGS. 32 & 33 show a graph of a coated beam system loss factor versus max strain at the second bending mode for several test specimens.
Figure 33:
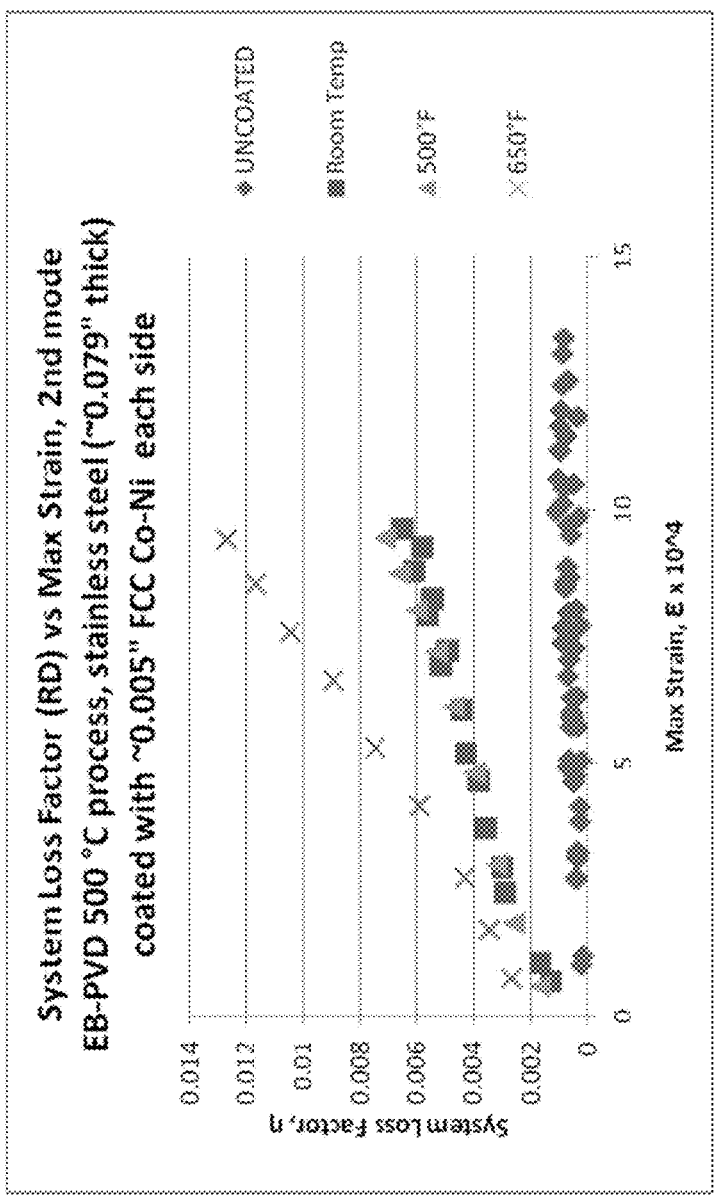
Figure 34:
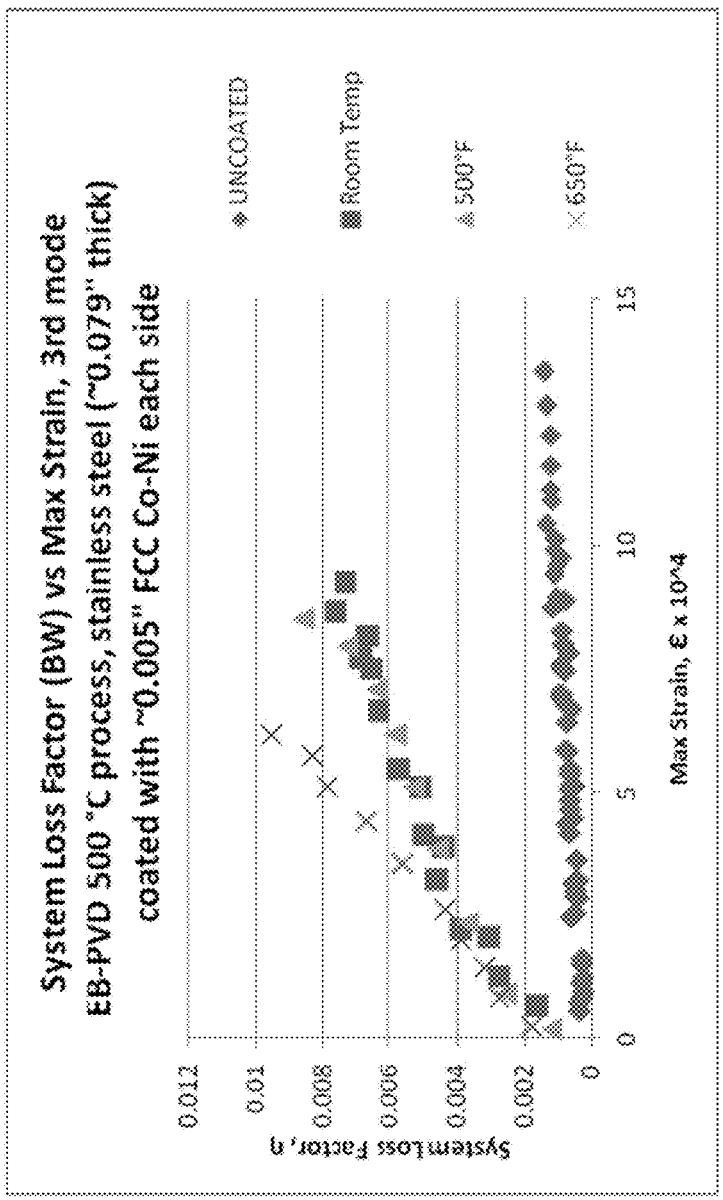
FIGS. 34 & 35 show a graph of a coated beam system loss factor versus max strain at the third bending mode for several test specimens.
Figure 35:
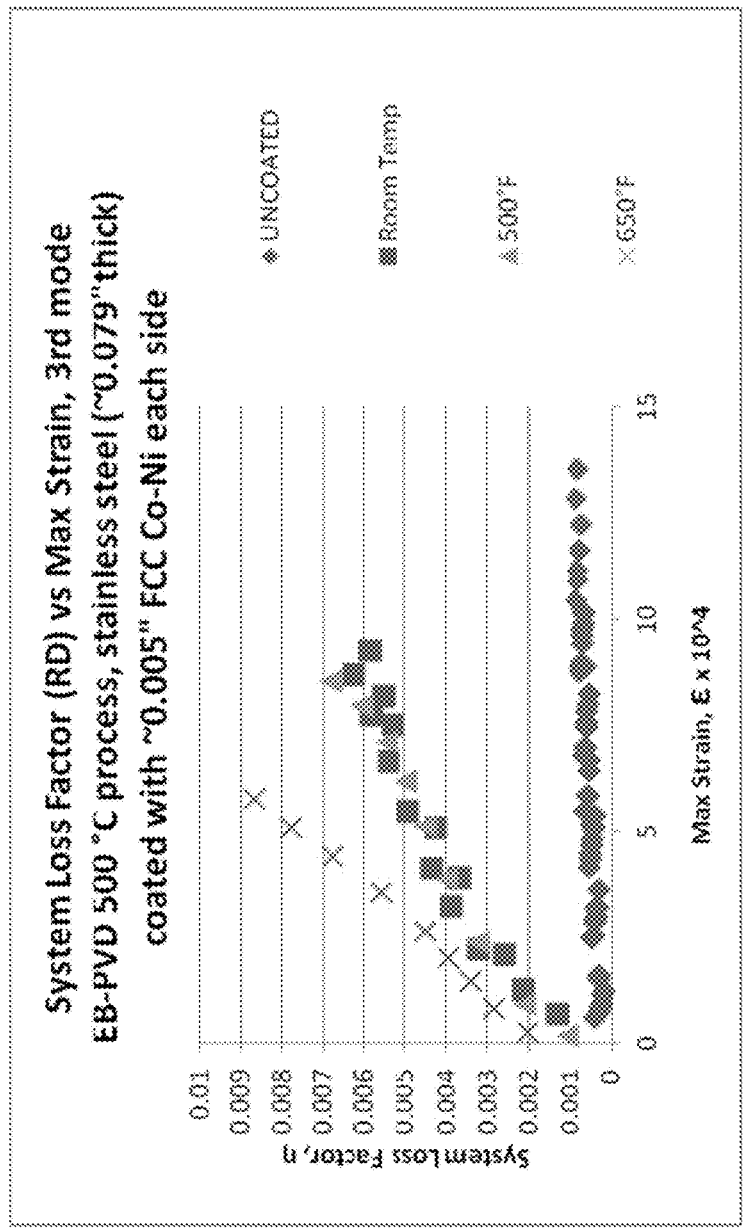

At this point it is important to introduce the concept of a face-centered cubic ferromagnetic damping material test beam to assist in defining the damping attributes of the invention. The face-centered cubic ferromagnetic damping material test beam is specifically defined as a tapered beam and is made entirely from the face-centered cubic ferromagnetic damping material; specifically a cast test beam of the dimensions shown in FIGS. 26-27. Introduction of the face-centered cubic ferromagnetic damping material test beam is due to the complexity of the stress/strain induced energy dissipation damping mechanism of the damping materials and the need to introduce an explicit test procedure that is reliable and easily repeated. For example, one skilled in the art can easily identify the composition of a damping coating with common laboratory equipment and cast a test beam to a specified size, which can then be used in a standardized test procedure to determine the damping capabilities of the coating.

Figure 6:
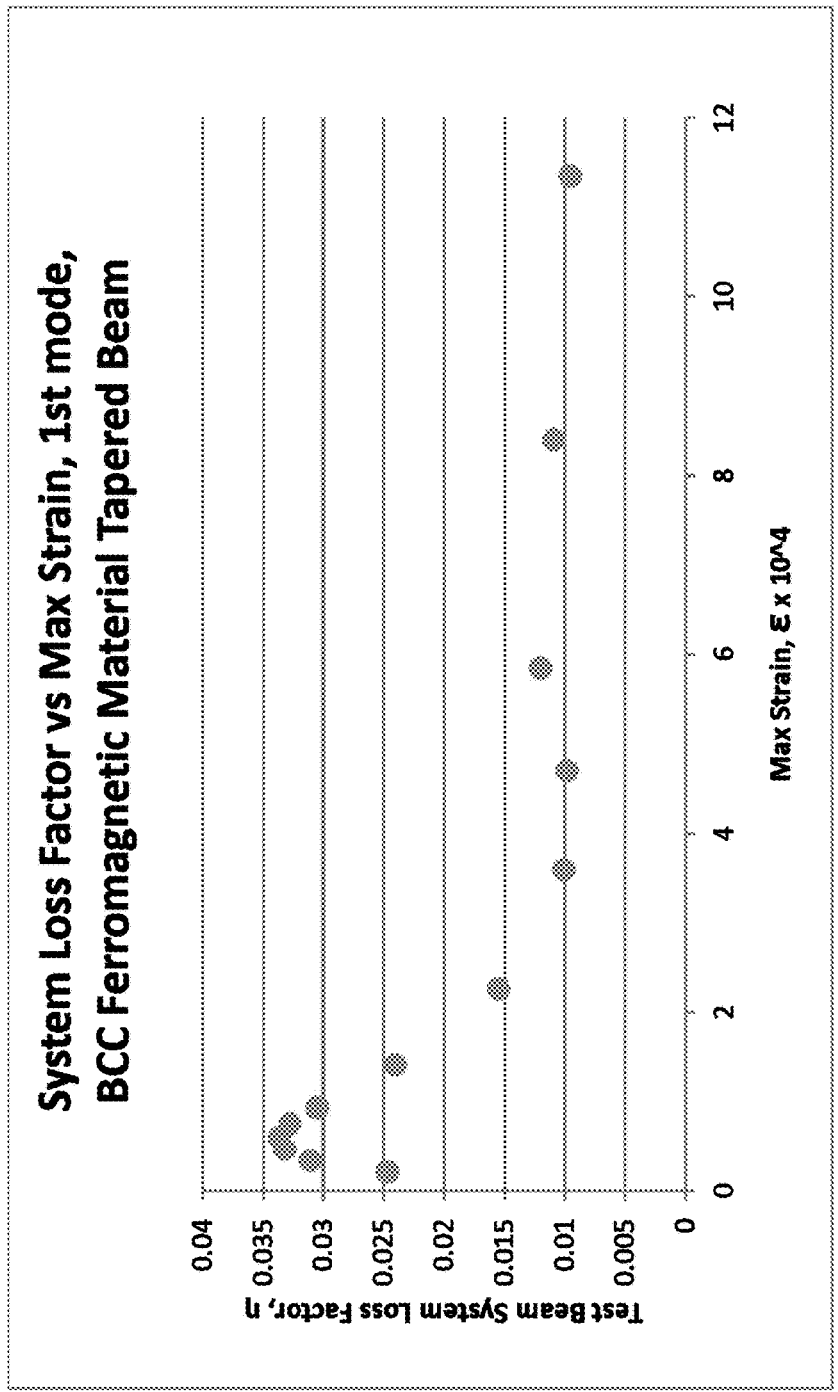
FIG. 6 shows a graph of a test beam system loss factor versus max strain at the first bending mode for a body-centered cubic (BCC) ferromagnetic material test beam.
Figure 7:
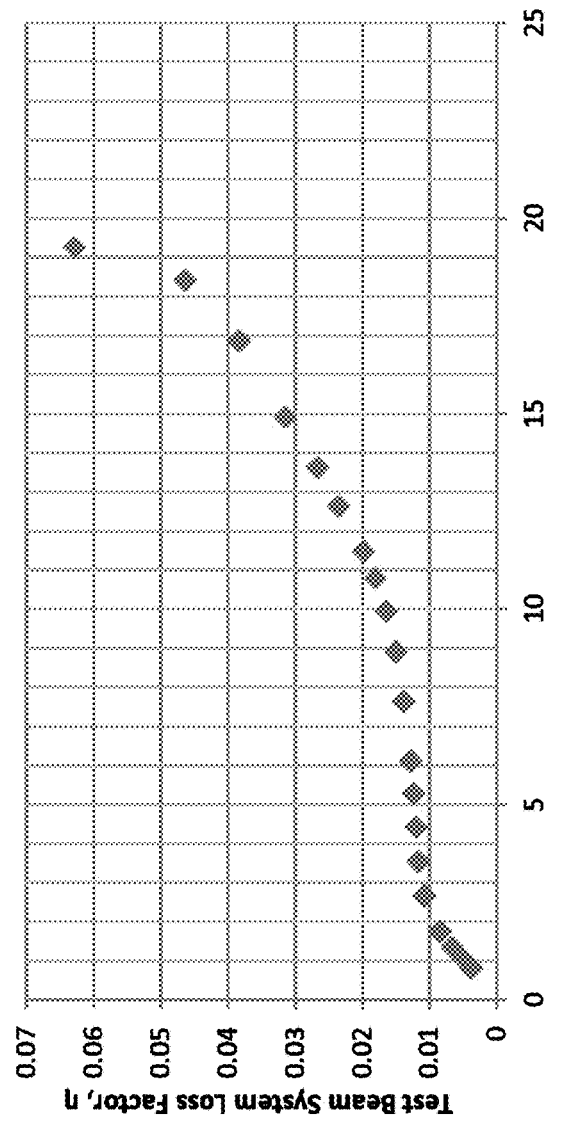
FIG. 7 shows a graph of a test beam system loss factor versus max strain at the first bending mode for a face-centered cubic (FCC) ferromagnetic material test beam.

For instance, the experiments (vibration runs) performed in developing FIGS. 6 & 7 were conducted on a Unholtz-Dickie 6,000 lb electro-dynamic shaker. The system is set up such that the tests are controlled by a PC which has Unholtz-Dickie control software installed. The software has many functions for different tests of interest, including sine sweep test and a resonant dwell test, as well as a manual mode in which the user is responsible for control. There are two primary instruments to be used in collecting data for the tests; namely strain gages and a laser vibrometer system (Ploytec laser sensor head and Polytec vibrometer controller).

The face-centered cubic ferromagnetic damping material test beam, in the case of FIG. 7, or for comparison purposes a similarly dimensioned test beam formed of body-centered cubic ferromagnetic damping material, in the case of FIG. 6, was cantilever clamped with two clamping blocks on a cylindrical fixture (diameter is 10 inches and 6.5 inches high) mounted on the top of the shaker head. The two clamping blocks having dimensions of 2"×5.5"×0.25" and 2"×5.5"×1.5" inches (each has two outside side holes and a center hole) were used to clamp the test beams. Three specimen clamping bolts were carefully regulated to minimize specimen slippage, with 125-150 ft-lb applied on the two 0.75 in outer bolts and at 50-75 ft-lb on the central 0.375 inch bolt.

The test beam tip response velocity (v) at a resonant frequency (f) was measured the laser vibrometer system and then covered to the tip displacement (d) via the known relationship d=v/(2πf). Then a standard finite element analysis, using the software package ANSYS, was conducted on the tapered beams to calculate the maximum element strain with the corresponding tip displacement measured from the laser head.

The graph illustrated in FIG. 7 shows the results of an experiment conducted at room temperature on a face-centered cubic ferromagnetic damping material test beam made entirely of a Co—Ni embodiment of the face-centered cubic ferromagnetic damping material. The vibration damping was depicted graphically in terms of the first mode test beam system loss factor (η) versus max strain (ϵ) as shown in FIG. 7. The system loss factor was calculated using the half-power bandwidth method.

With continued reference to FIG. 7, one embodiment the face-centered cubic ferromagnetic damping material test beam has a first mode test beam system loss factor of at least 0.010 when the strain amplitude is 500-2000 micro-strain, while an even further embodiment has a first mode test beam system loss factor of at least 0.015 when the strain amplitude is above 1000 micro-strain. A still further embodiment has a first mode test beam system loss factor that is at least 0.020 where the strain amplitude is greater than 1250 micro-strain. An even further high strain embodiment has a first mode test beam system loss factor of at least 0.020 when the strain amplitude is above 1500 micro-strain. Additionally, the damping properties of the face-centered cubic ferromagnetic damping material may be characterized by the strain amplitude at the point of the maximum first mode test beam system factor. Thus, in one embodiment the face-centered cubic ferromagnetic damping material test beam has a maximum first mode test beam system factor occurs where the strain amplitude is greater than 250 micro-strain, which is a significant improvement over the body-centered cubic ferromagnetic damping material test beam illustrated in FIG. 6. In fact, in another embodiment the face-centered cubic ferromagnetic damping material test beam has a maximum first mode test beam system loss factor occurs where the strain amplitude is greater than 500 micro-strain, while an even further embodiment has a maximum where the strain amplitude is greater than 1000 micro-strain. Achieving maximum damping performance above 1000 micro-strain is particularly beneficial in high speed rotating turbines.

Additionally, many applications that benefit from damping coatings particularly benefit from predicable damping characteristics over a wide strain range. As such, a further embodiment is characterized by a first mode test beam system loss factor that is greater than 0.010 throughout a consistent strain range wherein the consistent strain range is specifically defined any continuous range of strain that is at least 250 micro-strain from the lower end of the range to the upper end of the range, and the consistent strain range is above the level of 500 micro-strain. Further the a first mode test beam system loss factor preferably remains constant or increases through the consistent strain range; in other words, it is preferably that the first mode test beam system loss factor does not have any increases followed by a decrease in value as the strain increases because such variations create equipment design difficulties. In one embodiment the first mode test beam system loss factor varies by no more than twenty-five percent throughout the consistent strain range. For example, in one such embodiment the local loss factor is greater than 0.010 throughout a consistent strain range that stretches from 750-1000 micro-strain and varies by no more than twenty-five percent throughout the range of 750-1000 micro-strain, as illustrated in FIG. 7. Additional examples include the range of 250-500 micro-strain and between the range of 500-750 micro-strain.

In another embodiment the consistent strain range is expanded to any range of at least 500 micro-strain above the level of 500 micro-strain and the variation of first mode test beam system loss factor is expanded only from twenty-five percent to fifty percent. For example, in one such embodiment the first mode test beam system loss factor is greater than 0.010 throughout a consistent strain range that stretches from 500-1000 micro-strain and varies by no more than fifty percent throughout the range of 500-1000 micro-strain. An additional example range seen in FIG. 7 includes the range of 250-750 micro-strain.

Such a predictable first mode test beam system loss factor throughout a consistent strain range is particularly desirable and offers excellent predictability for the designers of equipment subject to undesirable vibrations. Further, a drawback with only using a ferromagnetic damping coating that is governed by either of the high and low strain coatings is that there will be a strain regime were the damping is weak. For example, the body-centered cubic ferromagnetic damping coating of FIG. 6 has strong damping, i.e. high first mode test beam system loss factors, only at low strain (50-100 micro-strain). If the strain is higher than a modest level of 200-300 micro-strain then the damping level is mostly saturated to the baseline level. On the other hand, for a high strain damping coating, the high damping occurs only at high strain. If the strain level is lower than 150 micro-strain then there less damping in the high strain than there would be for the low strain damping coating. Instead of accepting a trade-off between high damping in one strain regime and low damping in another strain regime, the present face-centered cubic ferromagnetic damping materials, coatings, and methods can achieve a highly damped system for low and high strains as shown in FIG. 7.

Figure 14:
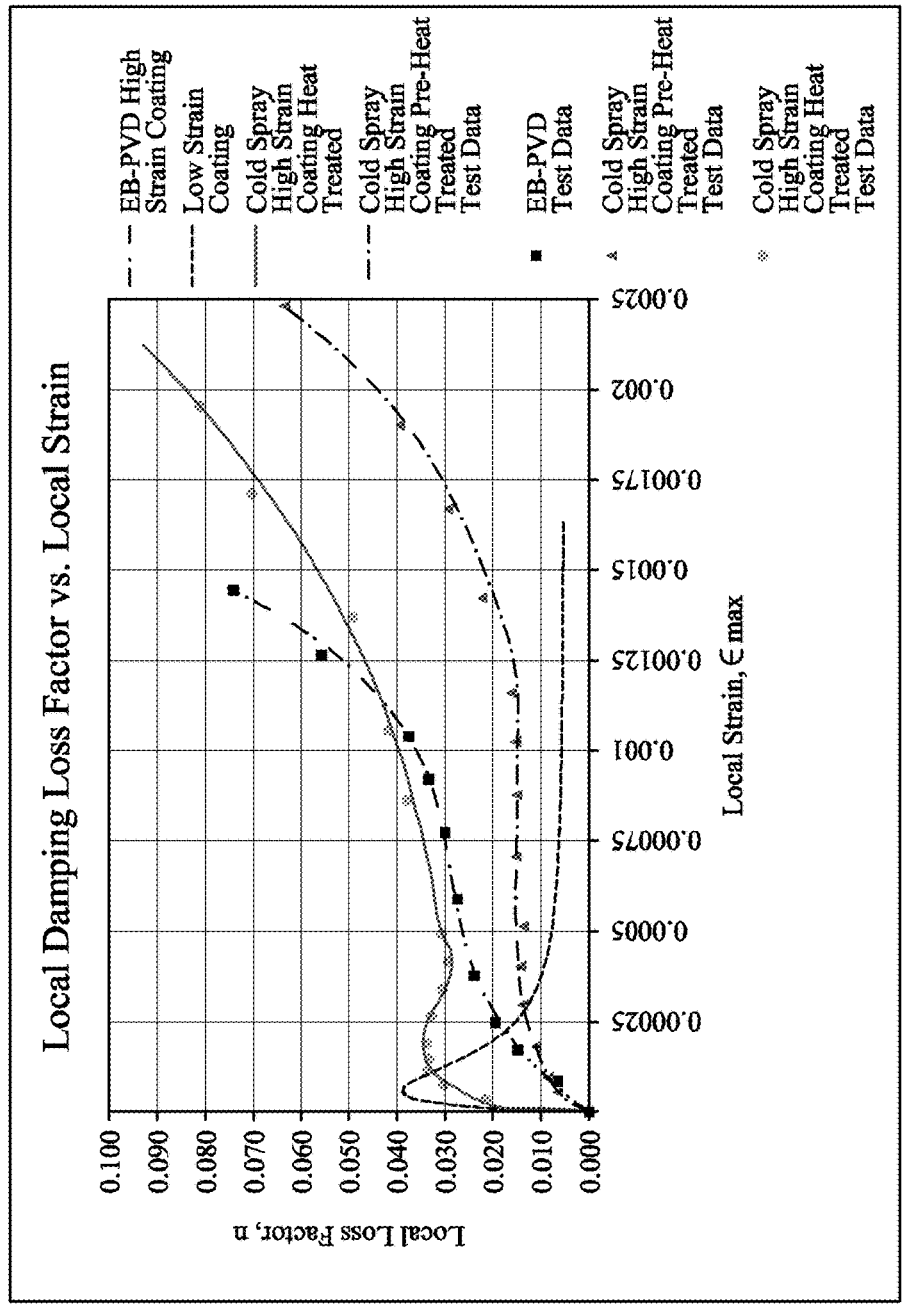
FIG. 14 shows a graph of a local loss factor versus local strain for several test specimens.

While the above disclosure describes the damping capabilities afforded by the face-centered cubic ferromagnetic damping materials, coatings, and methods with reference to the face-centered cubic ferromagnetic damping material test beam and its associated first mode test beam system loss factors for convenience and simplicity, one skilled in the art will appreciate that the damping capabilities may also be expressed in terms of a local loss factor, seen in FIG. 14, and/or a coated beam system loss factor, as seen in 8-13, 15-25, and 30-45, and/or a test beam system loss factor, as seen in FIGS. 6-7.

As one skilled in the art will recognize, damping is stress or strain dependent which means the damping in the coating is a function of the strain field (and hence, stress field). In order to make damping be a function of strain we need a mechanism to vary local damping with local strain values. For that, the local damping models/formulations of the body-centered cubic (BCC) low strain damping coating and the face-centered (FCC) high strain damping coating deposited by a cold spray process, an electron beam physical vapor deposition (EB-PVD) process, and a HVOF process have been determined via an integrated analytical and experimental procedure. A local damping formulation as a function of local strain level was established by using a cubic local damping function versus local strain as a baseline for comparison with experimental data in finite element runs. The results of the finite element harmonic frequency sweep runs at known levels of strain amplitude were compared with the actual experimental results and the ratio of the damping values between finite element predictions and experimental data. Therefore, the stresses are extracted from finite element analysis and used to update the damping model in a loop. Every finite element in the coating has its own damping value based on the damping model. Finally, an iterative procedure based on the convergence of element stresses accomplished a converged local damping function/model. The results of the finite element runs along with the damping functions for several coating configurations are shown in the FIG. 14.

Figure 25:
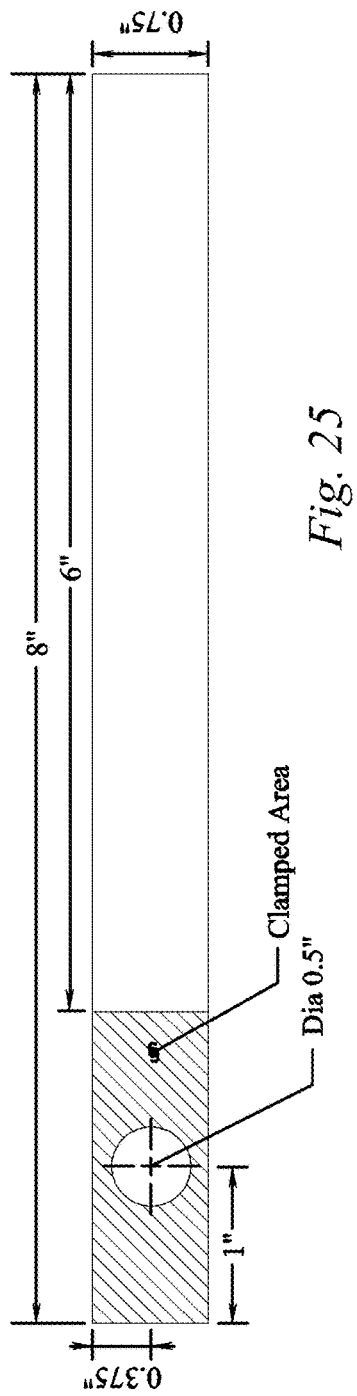
FIG. 25 is a top plan view of a dimensioned coated test beam, not to scale.

The concept of a face-centered cubic ferromagnetic damping material test beam to assist in defining the damping attributes of the invention was previously introduced. At this point it is helpful to introduce another concept to further aide in characterizing embodiments of the invention, namely a face-centered cubic ferromagnetic damping coating coated beam, or "FCC coated beam" for short. The FCC coated beam is specifically defined as a flat beam of the dimensions illustrated in FIG. 25, unless noted otherwise. Introduction of the FCC coated beam is due to the complexity of the stress/strain induced energy dissipation damping mechanism of the damping materials and the need to introduce an explicit test procedure that is reliable and easily repeated, plus it enables one to define damping characteristics after undergoing an annealing process, which was not possible with the previously defined cast face-centered cubic ferromagnetic damping material test beam. For example, one skilled in the art can easily identify the composition of a damping coating with common laboratory equipment and then create a FCC coated beam by applying the face-centered cubic ferromagnetic damping coating to the standardized beam of FIG. 25 using one of the application technique embodiments disclosed herein. A standardized test procedure can then be used on the FCC coated beam to determine the damping capabilities of the coating. Unless noted otherwise the flat beam of FIG. 25 is Ti-6Al-4V with a uniform thickness of 0.063 inches and is coated on both sides with the face-centered cubic ferromagnetic damping material, specifically a Co—Ni embodiment, to a thickness of 0.0035-0.0075 inches on each side, thereby producing a coated substrate (100). The face-centered cubic ferromagnetic damping coating (10) may be applied using one of the low residual stress processes described herein.

The experiments (vibration runs) were conducted on a Unholtz-Dickie 6,000 lb electro-dynamic shaker. The system is set up such that the tests are controlled by a PC which has an Unholtz-Dickie control software installed. The software has many functions for different tests of interest, including sine sweep test and a resonant dwell test as well as a manual mode in which the user is responsible for control. There were two primary instruments to be used in taking data for the tests: strain gages and a laser vibrometer system (Ploytec laser sensor head and Polytec vibrometer controller). The FCC coated beam was clamped with two clamping blocks on a cylindrical fixture (diameter is 10 inches and 6.5 inches high) mounted on the top of the shaker head. The two clamping blocks with dimension 2"×5.5"×0.25" and 2"×5.5"×1.5" (each has two outside side holes and a center hole) were used to clamp the beam. Three specimen clamping bolts were carefully regulated to minimize specimen slippage, with 125-150 ft-lb applied on the two 0.75 in outer bolts and at 75-100 ft-lb on the central 0.5 inch bolt. Tests were conducted using a piezoelectric control accelerometer positioned immediately behind the specimen clamping block. The beam tip response velocity (v) at a resonant frequency (f) was measured the laser vibrometer system and then covered to the tip displacement (d) via equation $d=v/(2\pi f)$. Then a standard finite element analysis using the software package ANSYS was conducted of the beam to calculate the maximum element strain which corresponding the tip displacement measured from the laser head. The maximum element strain was also confirmed with the calculation from the beam theory.

The uncoated beams were first checked for damages or cracks using dye and fault finder. If there are no damages already present the beams, then the natural frequencies and damping loss factor of the uncoated beams were measured by conducting the vibration experiments under harmonic excitation in $2^{nd}$, $3^{rd}$, and $4^{th}$ bending modes. The damping loss factor was calculated using the half-power bandwidth (BW) and resonant dwell (RD) methods (Ref. Granick, N. and Stern, J. E. "*Material Damping of Aluminum by Resonance-Dwell Technique*", Shock and Vibration Bulletin, Vol. 34, No. 5, pp. 177-195. 1966). The uncoated beams test results were used as baseline data for comparisons with the test results of the FCC coated beams.

Figure 15:
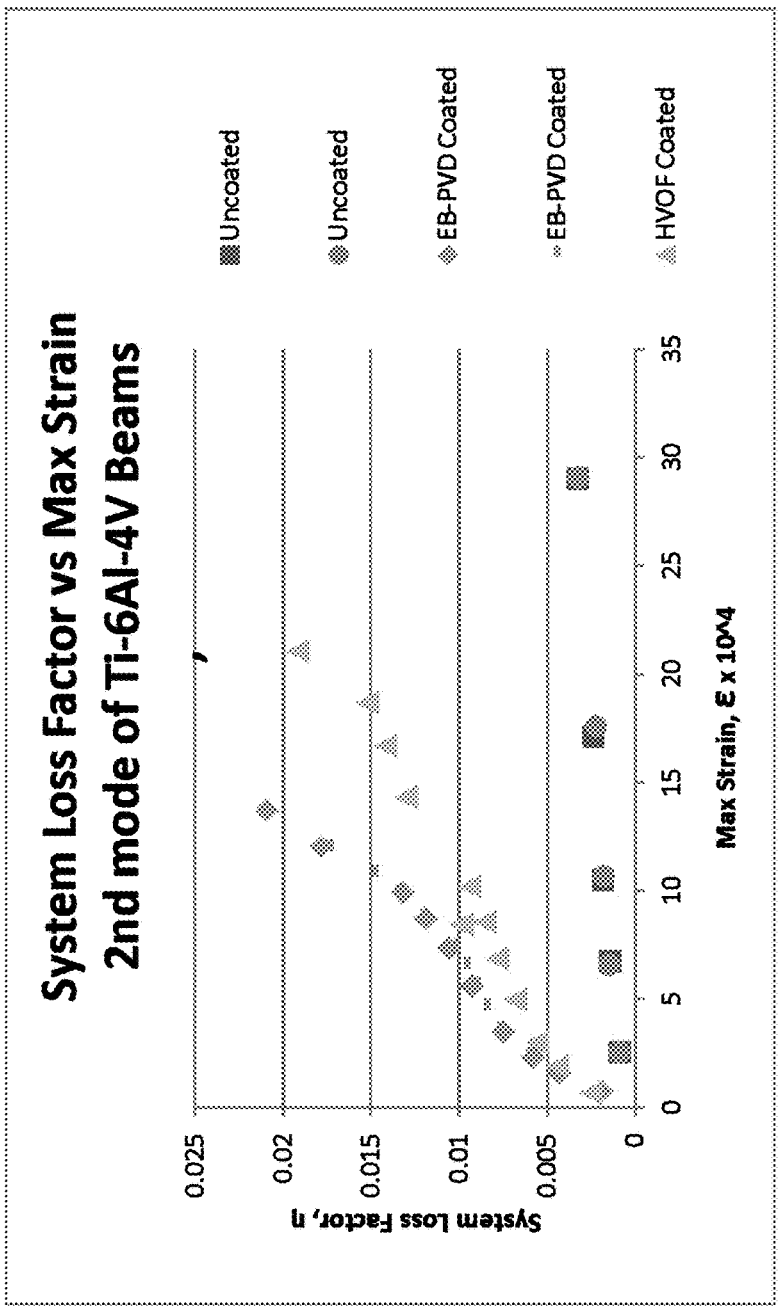
FIG. 15 shows a graph of a coated beam system loss factor versus max strain at the second bending mode for several test specimens.
Figure 16:
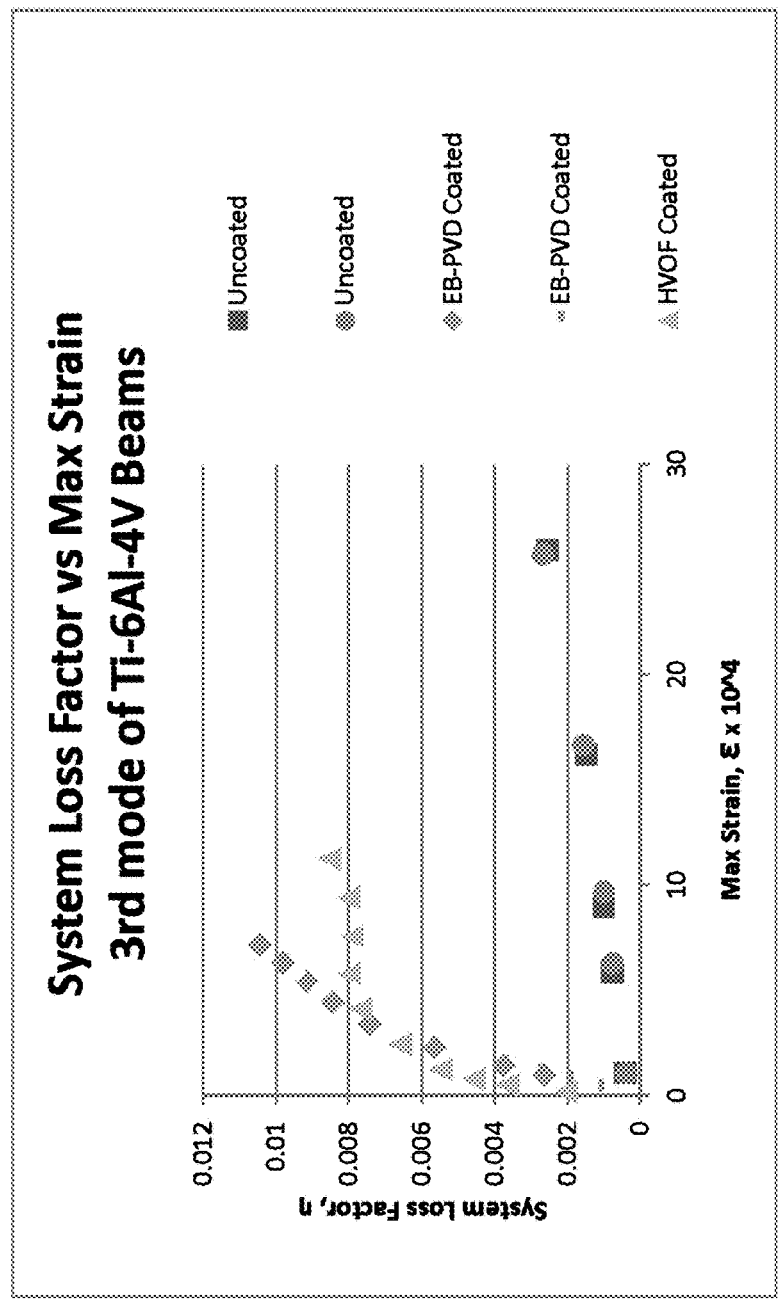
FIG. 16 shows a graph of a coated beam system loss factor versus max strain at the third bending mode for several test specimens.
Figure 17:
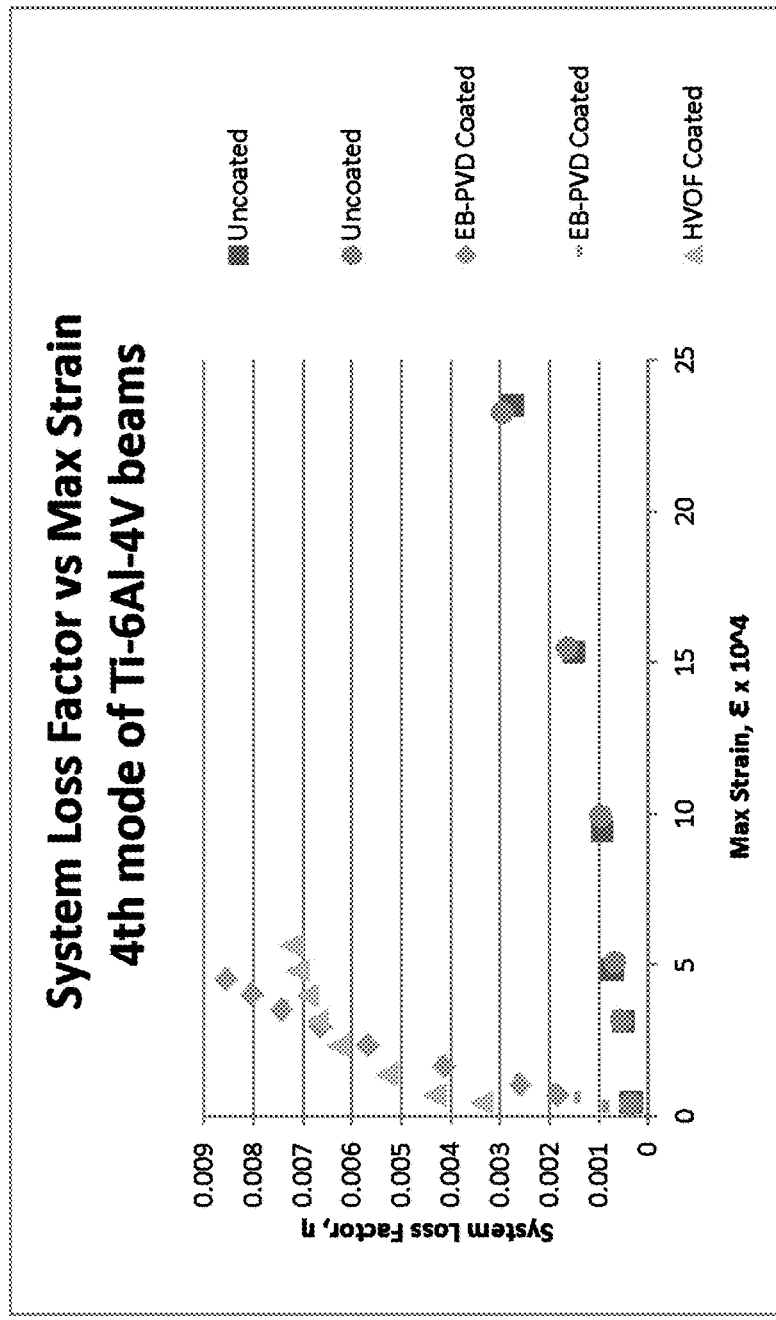
FIG. 17 shows a graph of a coated beam system loss factor versus max strain at the fourth bending mode for several test specimens.
Figure 18:
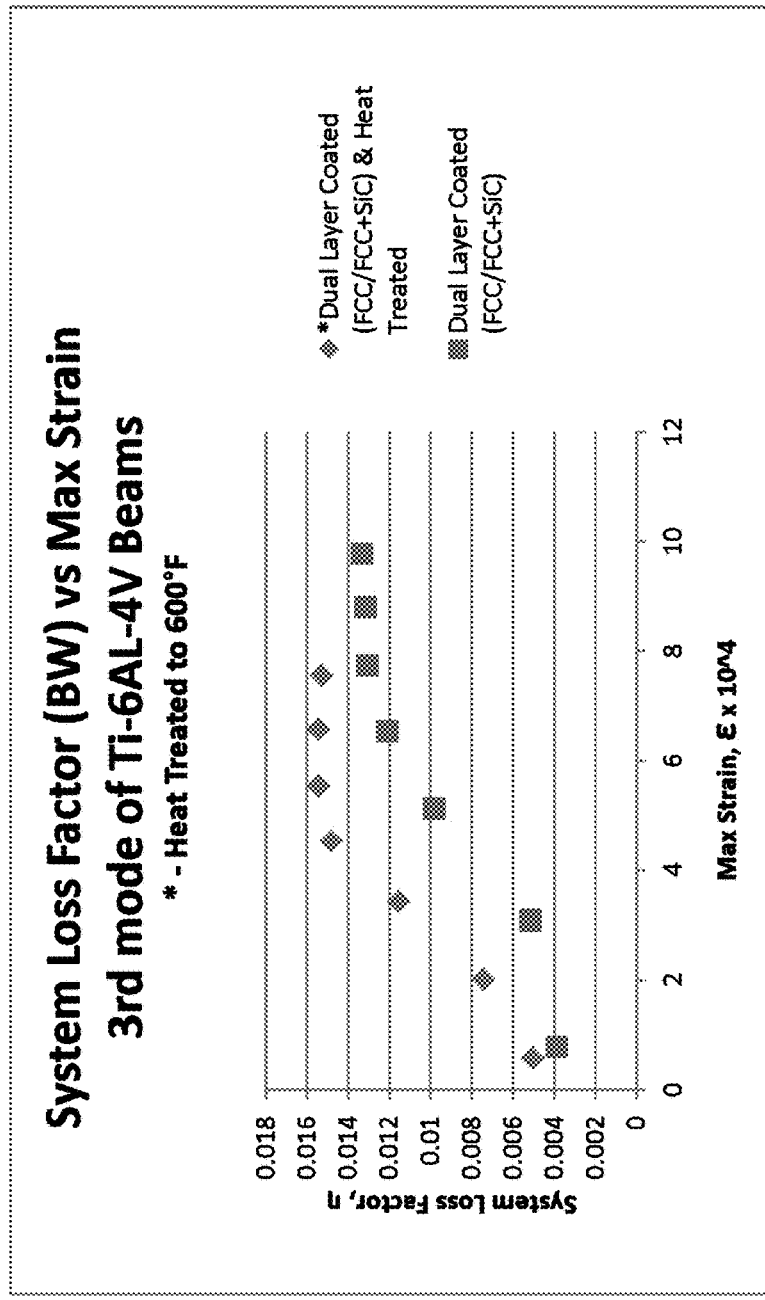
FIG. 18 shows a graph of a coated beam system loss factor versus max strain at the third bending mode for several test specimens.
Figure 19:
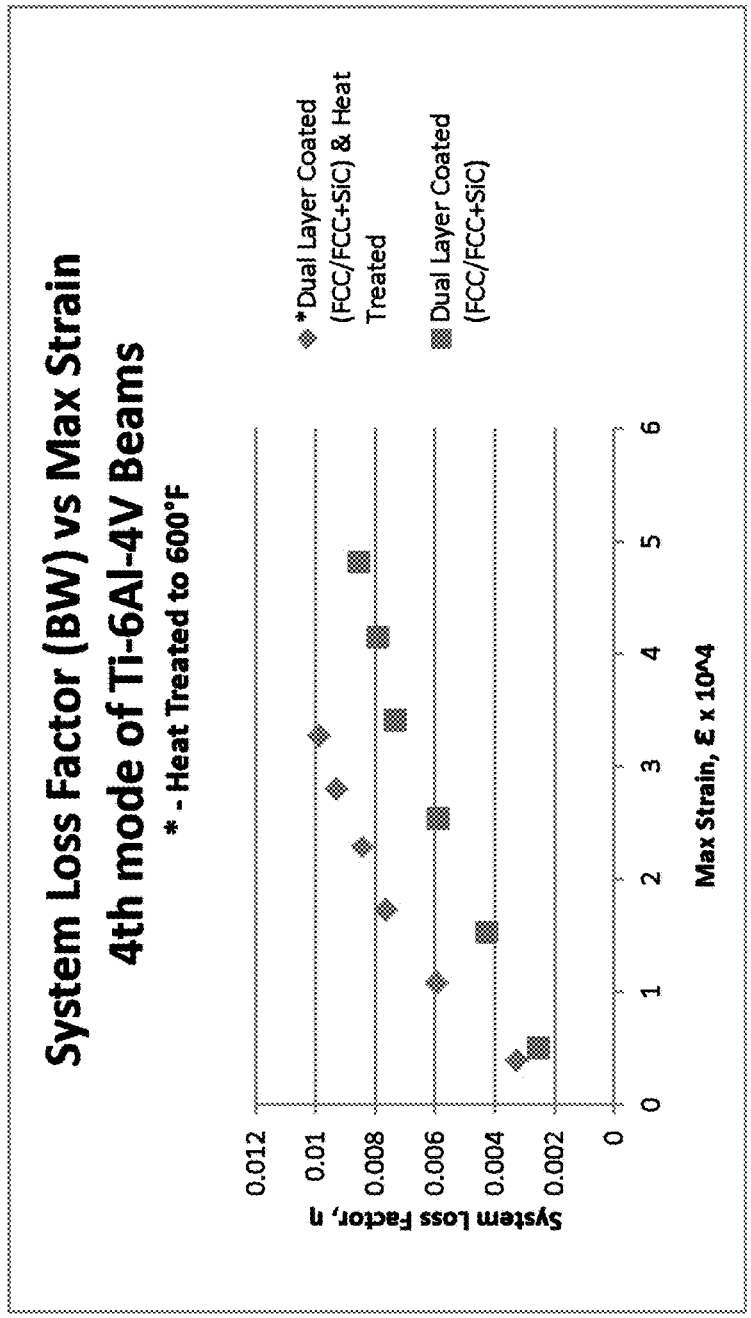
FIG. 19 shows a graph of a coated beam system loss factor versus max strain at the fourth bending mode for several test specimens.
Figure 20:
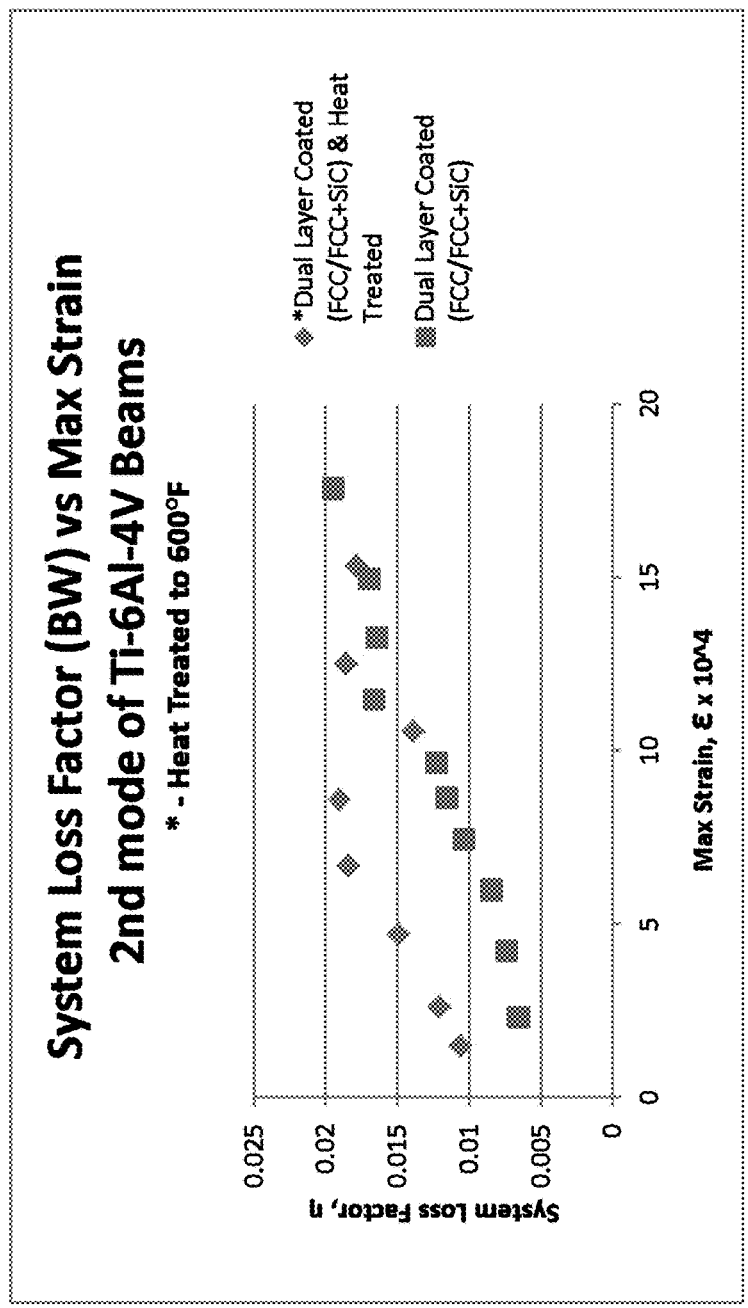
FIGS. 20 & 21 show a graph of a coated beam system loss factor versus max strain at the second bending mode for several test specimens.
Figure 21:
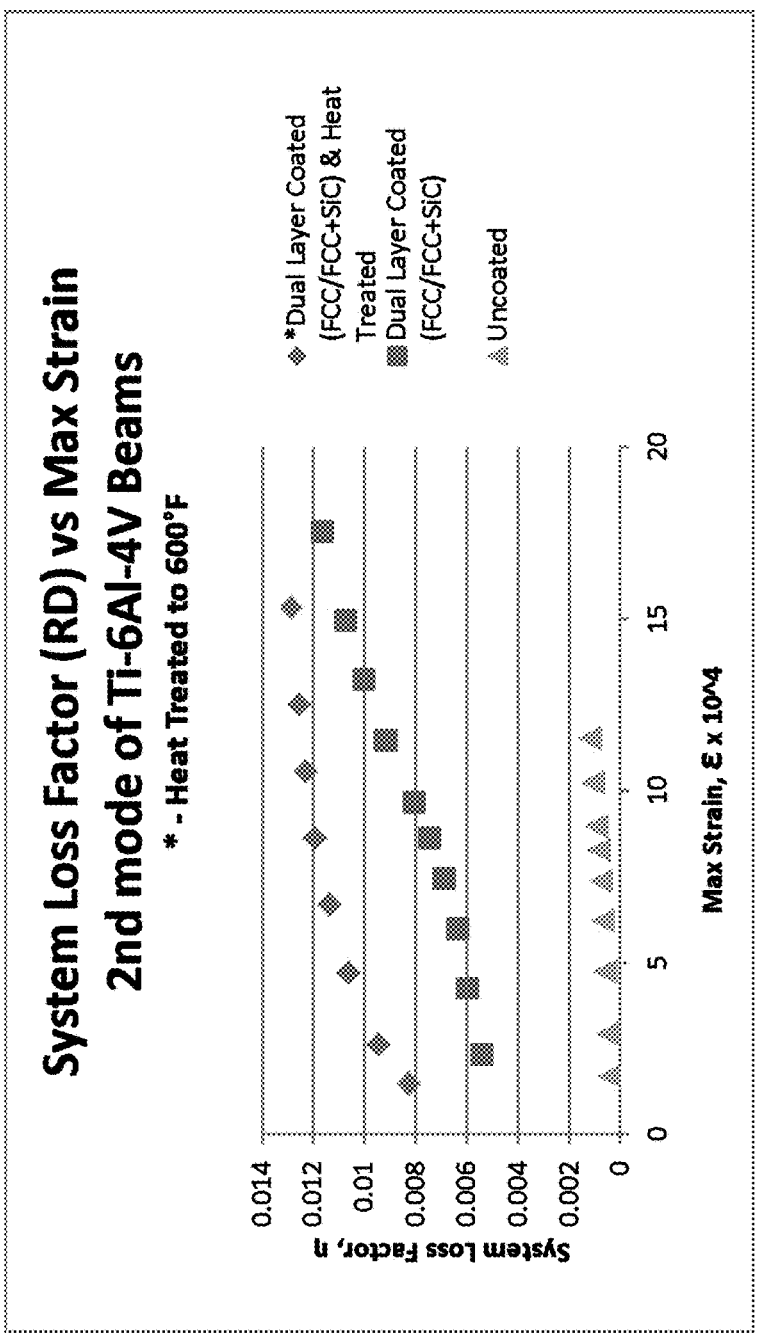
Figure 22:
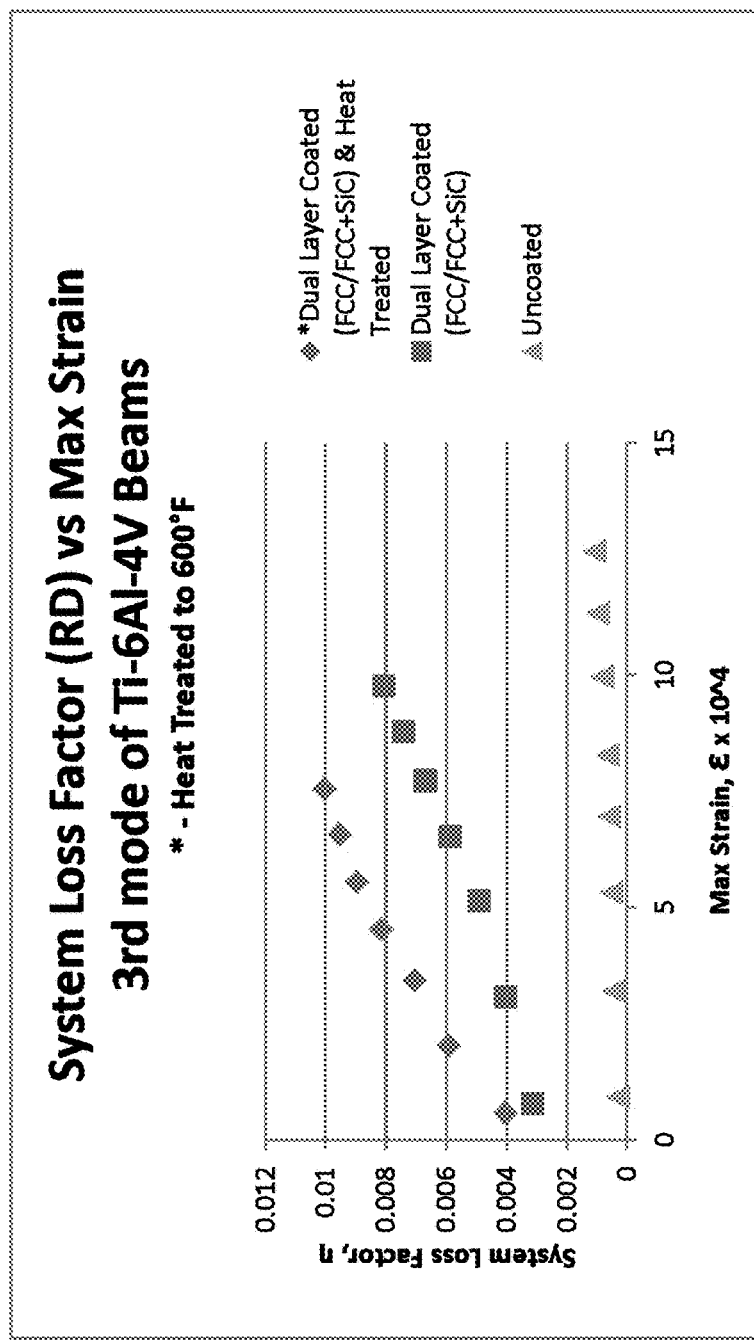
FIG. 22 shows a graph of a coated beam system loss factor versus max strain at the third bending mode for several test specimens.
Figure 23:
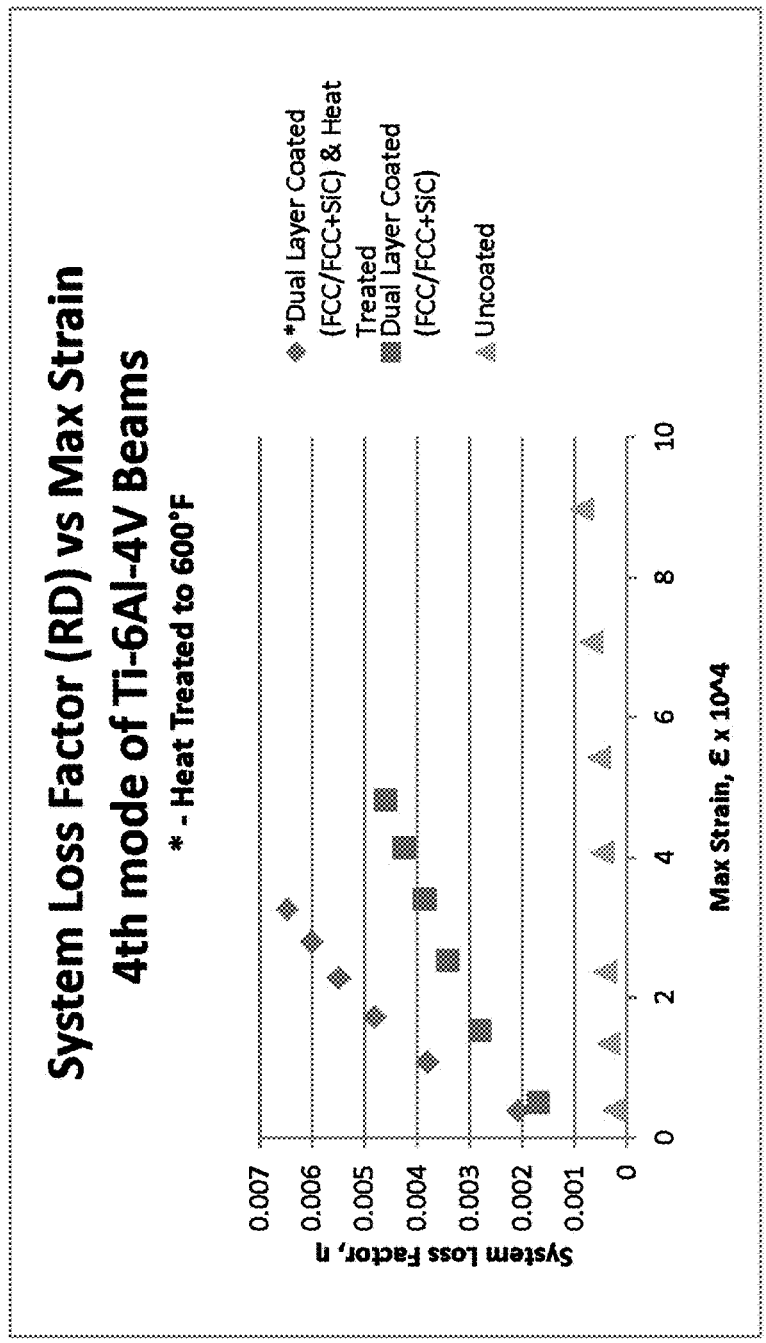
FIG. 23 shows a graph of a coated beam system loss factor versus max strain at the fourth bending mode for several test specimens.

FIGS. 15-17 illustrate the coated beam system loss factor for Ti-6Al-4V specimens having a uniform thickness of 0.063 inches. The graphs illustrate the test results of two uncoated beam system loss factor in the $2^{nd}$, $3^{rd}$, and $4^{th}$ modes; and the coated beam system loss factor for three 0.063" thick Ti-6Al-4V FCC coated beams in the $2^{nd}$, $3^{rd}$, and $4^{th}$ modes, one coated via the HVOF application embodiment and two coated with the EB-PVD application embodiment. Each coated test beam was coated on both sides with the face-centered cubic ferromagnetic damping material, specifically a Co—Ni embodiment, to a thickness of 0.0035-0.0075 inches on each side. Each coated beam system loss factor was at least 0.005, and increasing, at 500 micro-strain, for the $2^{nd}$, $3^{rd}$, and $4^{th}$ modes, whether an HVOF embodiment or an EB-PVD embodiment. Further, each coated beam system loss factor was at least 0.0075, and increasing, at 1000 micro-strain, for the $2^{nd}$ mode, whether an HVOF embodiment or an EB-PVD embodiment.

Figure 8:
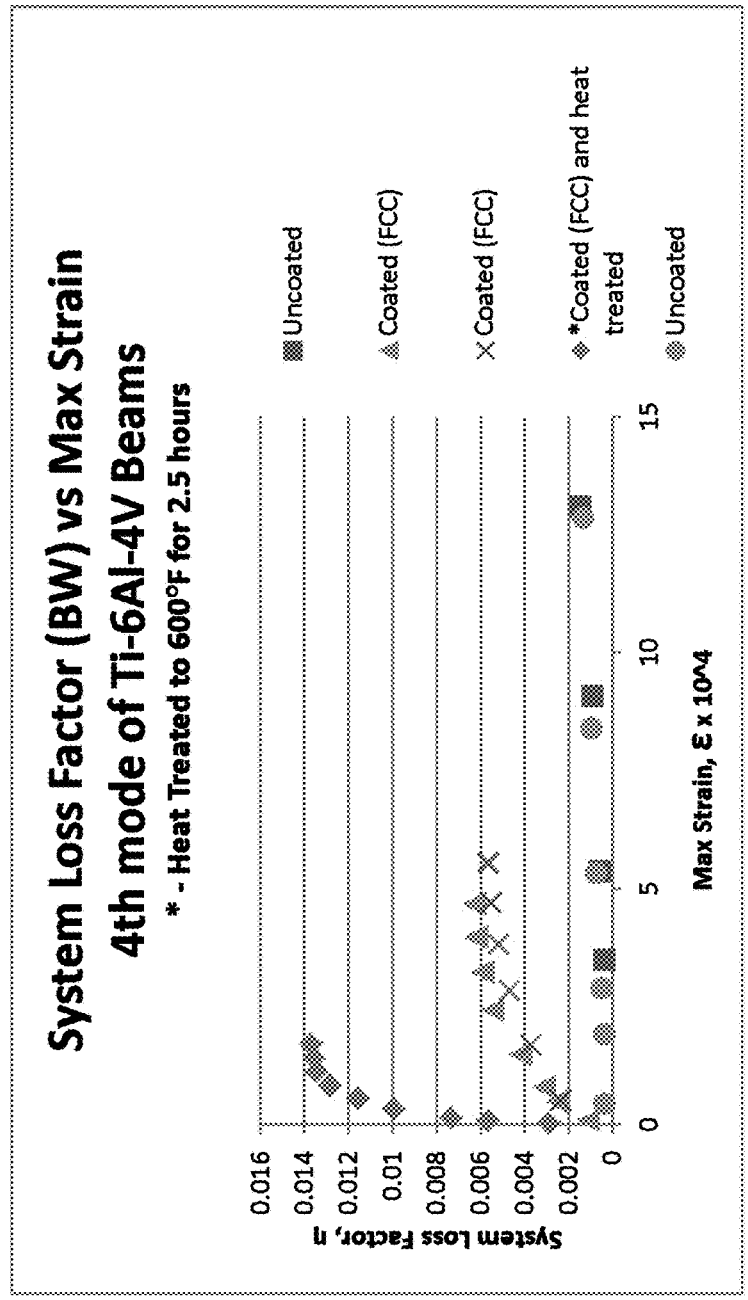
FIGS. 8 & 9 show a graph of a coated beam system loss factor versus max strain at the fourth bending mode for several test specimens.
Figure 9:
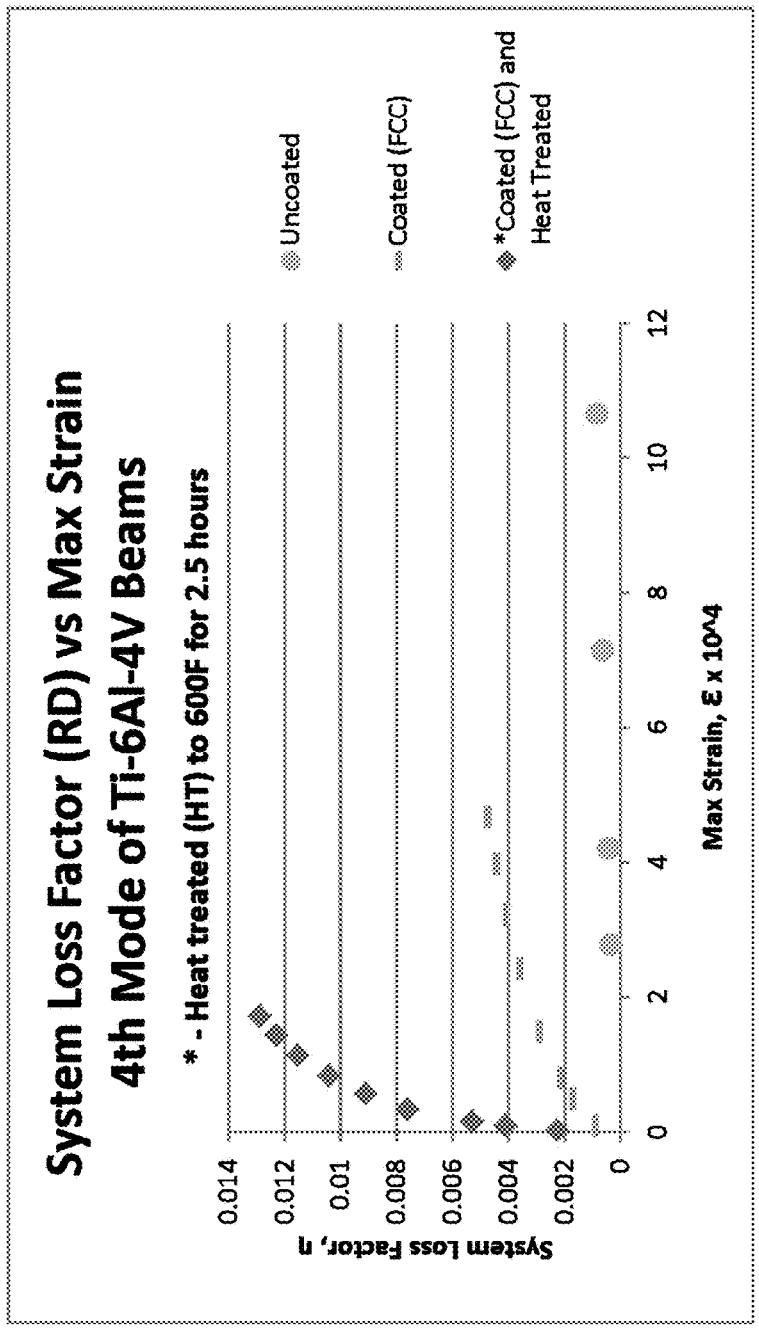
Figure 10:
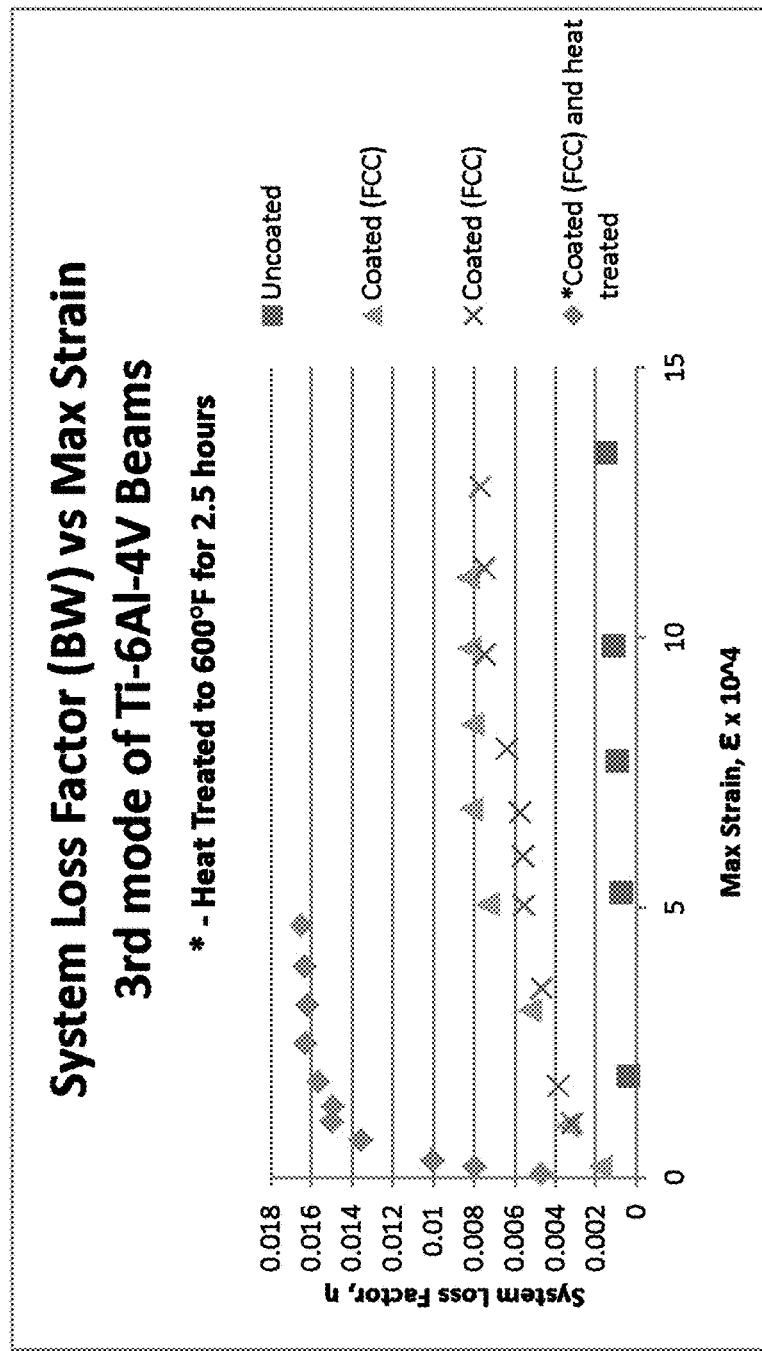
FIGS. 10 & 11 show a graph of a coated beam system loss factor versus max strain at the third bending mode for several test specimens.
Figure 11:
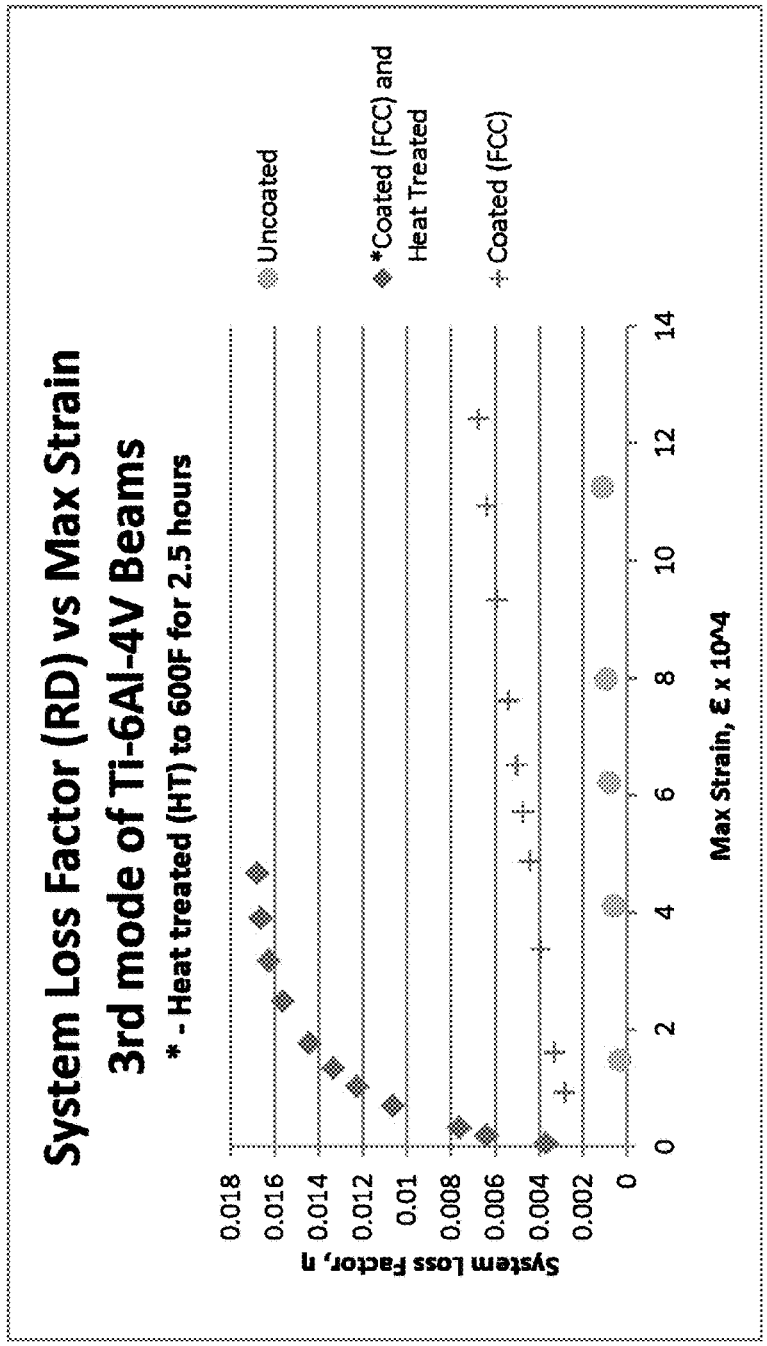
Figure 12:
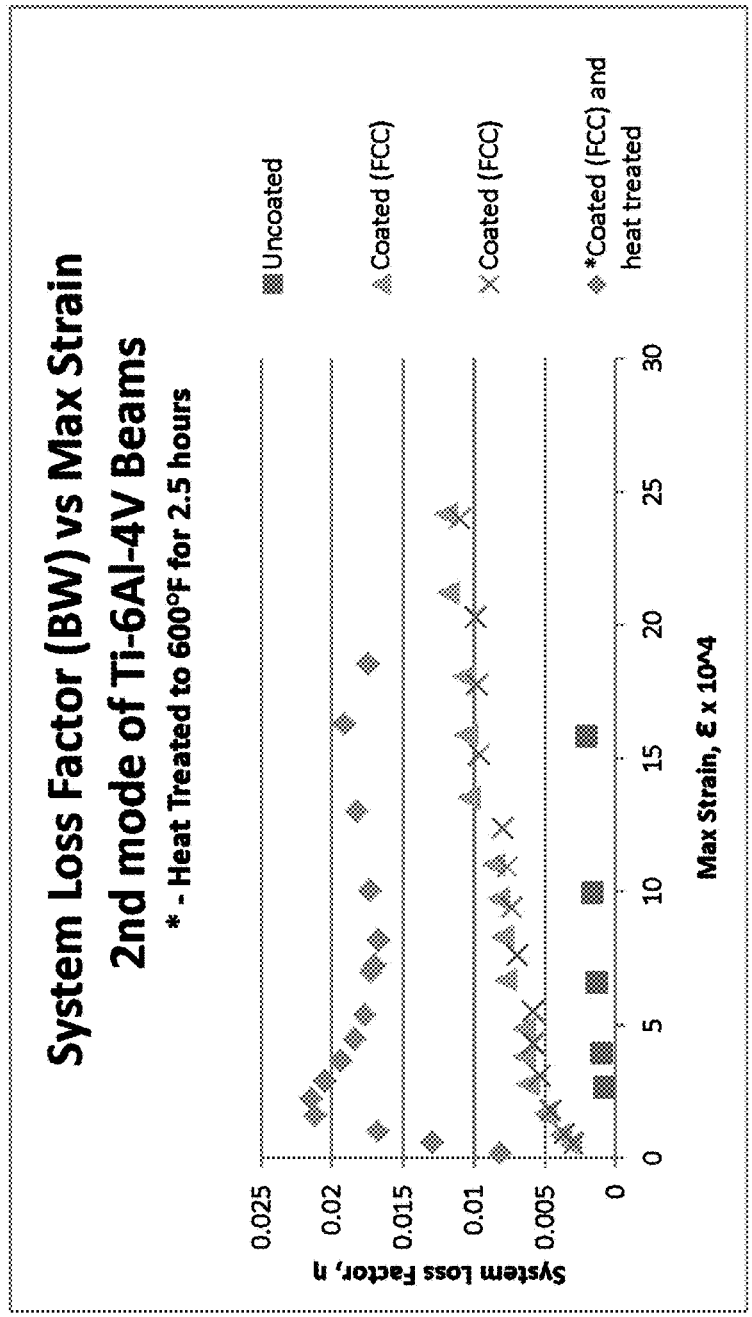
FIGS. 12 & 13 show a graph of a coated beam system loss factor versus max strain at the second bending mode for several test specimens.
Figure 13:
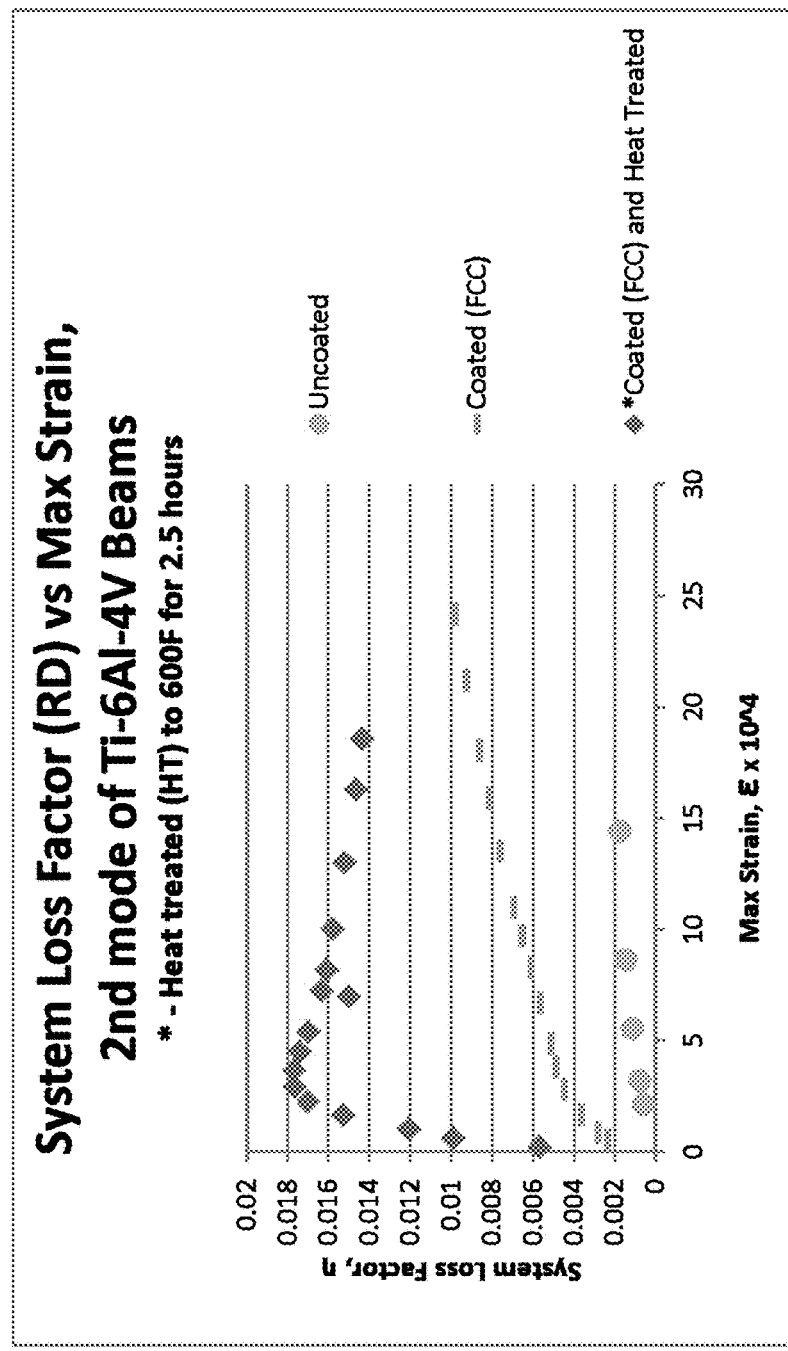

FIGS. 8-13, and 18-22 illustrate the coated beam system loss factor for Ti-6Al-4V specimens having a uniform thickness of 0.063 inches, when the coating was applied using a cold spray embodiment. FIG. 12 illustrate the test results of one uncoated beam system loss factor in the $2^{nd}$ mode; the coated beam system loss factor for two 0.063" thick Ti-6Al-4V FCC coated beams in the $2^{nd}$ mode; and the coated beam system loss factor for one 0.063" thick Ti-6Al-4V FCC coated beams in the $2^{nd}$ mode after being subjected to a low temperature annealing process comprising heating the coated substrate (100) to a temperature of 600° Fahrenheit for 2.5 hours, while FIG. 13 illustrates the same using the resonance dwell method (RD). Likewise, FIG. 10 illustrate the test results of one uncoated beam system loss factor in the $3^{rd}$ mode; the coated beam system loss factor for two 0.063" thick Ti-6Al-4V FCC coated beams in the $3^{rd}$ mode; and the coated beam system loss factor for one 0.063" thick Ti-6Al-4V FCC coated beams in the $3^{rd}$ mode after being subjected to a low temperature annealing process comprising heating the coated substrate (100) to a temperature of 600° Fahrenheit for 2.5 hours, while FIG. 11 illustrates the same using the resonance dwell method (RD). Additionally, FIG. 8 illustrate the test results of one uncoated beam system loss factor in the $4^{th}$ mode; the coated beam system loss factor for two 0.063" thick Ti-6Al-4V FCC coated beams in the $4^{th}$ mode; and the coated beam system loss factor for one 0.063" thick Ti-6Al-4V FCC coated beams in the $4^{th}$ mode after being subjected to a low temperature annealing process comprising heating the coated substrate (100) to a temperature of 600° Fahrenheit for 2.5 hours, while FIG. 9 illustrates the same using the resonance dwell method (RD). FIG. 10 illustrates the coated beam system loss factor for a 0.063" thick Ti-6Al-4V FCC coated beams in the $3^{rd}$ mode; and the coated beam system loss factor for one 0.063" thick Ti-6Al-4V FCC coated beams in the 3rd mode after being subjected to a low temperature annealing process comprising heating the coated substrate (100) to a temperature of 600° Fahrenheit for 2.5 hours, while FIG. 11 illustrates the same using the resonance dwell method (RD).

Each coated test beam was coated on both sides with the face-centered cubic ferromagnetic damping material, specifically a Co—Ni embodiment, to a thickness of 0.0035-0.0075 inches on each side. Each coated beam system loss factor was at least 0.005, and increasing, at 500 micro-strain, for the $2^{nd}$ mode. Further, each coated beam system loss factor was at least 0.0075, and increasing, at 1000 micro-strain, for the $2^{nd}$ and $3^{rd}$ modes. As shown in FIGS. 12 and 10, even the low residual stress face-centered cubic ferromagnetic damping coating (10) applied via the cold spray process exhibited improved damping properties after being subjected to a low temperature annealing process. In fact after the low temperature annealing process the $2^{nd}$ and $3^{rd}$ mode coated beam system loss factors increased to at least 0.014 at 500 micro-strain; and at least 0.014 for the entire range of 500-1000 micro-strain.

Additionally, a series of experiments were conducted on the FCC coated beams at three of temperature levels (room, 500° F., & 650° F.) for characterizing and identifying the FCC damping coating effectiveness at elevated temperatures, as seen in FIGS. 28-31 for Ti-6Al-4V coated test beams using a dual process including a first 0.002" thick EB-PVD coating layer applied at 350° C. and a second 0.002" thick EB-PVD coating layer applied at 500° C.; FIGS. 32-35 for stainless steel coated test beams using a single step process coating a single 0.005" thick EB-PVD coating layer at 500° C.; FIGS. 36-39 for Ti-6Al-4V coated test beams using a single step process coating a single 0.004" thick EB-PVD coating layer at 350° C.; and lastly FIGS. 40-43 for Inconel coated test beams using a dual process including a first 0.002" thick EB-PVD coating layer applied at 350° C. and a second 0.002" thick EB-PVD coating layer applied at 500° C.

Using the same testing procedure the dynamic characteristics (natural frequency, damping coated beam system loss factor, and maximum strain) of the FCC coated beam were accomplished. Tests at 500° F. & 650° F. were conducted by placing a heating chamber over the specimen and mounting fixture. The chamber is heated by two 900 watt ceramic plate heaters mounted on the interior sides of box. The heating chamber is a rectangular box with outside dimensions 26"×15"×16", with bottom cut to fit in the beam fixture blocks.

Comparing the single step embodiment of Ti-6Al-4V coated test beams using a single step process coating a single 0.004" thick EB-PVD coating layer at 350° C. of FIGS. 36-39 with the dual step embodiment of Ti-6Al-4V coated test beams using a dual process including a first 0.002" thick EB-PVD coating layer applied at 350° C. and a second 0.002" thick EB-PVD coating layer applied at 500° C. reveals interesting high temperature damping benefits afforded by the dual process embodiment. The dual step embodiment not only improves the quality of the face-centered cubic ferromagnetic damping coating but it also improves the speed of the process, reduces the likelihood of fatigue issues, and increases the test beam system loss factor, particularly in high temperature environments as illustrated by the 650° F. test data of FIG. 28 versus that of FIG. 36. In fact, in one dual step embodiment the second mode coated beam system loss factor is at least 0.010 at 500 micro-strain and at least 0.020 at 1000 micro-strain, when tested at 650° F. In another embodiment the high temperature second mode coated beam system loss factor data has a slope of greater than 0.00001, when tested at 650° F.; while another embodiment has a high temperature second mode coated beam system loss factor data has a slope of greater than 0.000015, when tested at 650° F.; and an even further embodiment has a high temperature second mode coated beam system loss factor data has a slope of greater than 0.00002.

Similarly, in another dual step embodiment the second mode coated beam system loss factor is at least 0.005 at 500 micro-strain and at least 0.010 at 1000 micro-strain, when tested at 500° F. In another embodiment the high temperature second mode coated beam system loss factor data has a slope of greater than 0.000005, when tested at 500° F.; while another embodiment has a high temperature second mode coated beam system loss factor data has a slope of greater than 0.00001, when tested at 500° F. Additionally, another dual step embodiment the second mode coated beam system loss factor is at least 0.005 at 500 micro-strain and at least 0.008 at 1000 micro-strain, when tested at room temperature. In another embodiment the second mode coated beam system loss factor data has a slope of greater than 0.000005, when tested at room temperature; while another embodiment has a high temperature second mode coated beam system loss factor data has a slope of greater than 0.00001, when tested at room temperature.

The dual process EB-PVD coating embodiment is a way to control the grain size of the face-centered cubic ferromagnetic damping coating (10). This is important because a coating with a relatively small grain size produces lower strain damping, while a coating with relatively larger grain size produces higher strain damping. Therefore creating a face-centered cubic ferromagnetic damping coating (10) that has at least a small grain size layer and a separate larger grain size layer produces desirable damping characteristics throughout a wide strain range. Thus, in one embodiment a first EB-PVD face-centered cubic ferromagnetic damping coating layer is applied to a substrate maintained at a first layer temperature of 275° C.-350° C., and a second EB-PVD face-centered cubic ferromagnetic damping coating layer is applied to the substrate while maintaining it at a second layer temperature that is at least 25° C. greater than the first layer temperature, thereby providing a minimum disparity of grain size, and thus strain damping characteristics. In a further embodiment the grain size disparity is increased by having the second layer temperature at least 50° C. greater than the first layer temperature, while an even further embodiment has the second layer temperature at least 100° C. greater than the first layer temperature. Yet a further embodiment has a second layer temperature that is at least 20% greater than the first layer temperature; and another embodiment has a second layer temperature that is at least 40% greater than the first layer temperature, and even further a second layer temperature that is 40%-100% greater than the first layer temperature. One skilled in the art will appreciate that in one embodiment the different temperatures may be achieved by adjusting the distance between the substrate and the vapor source.

Figure 36:
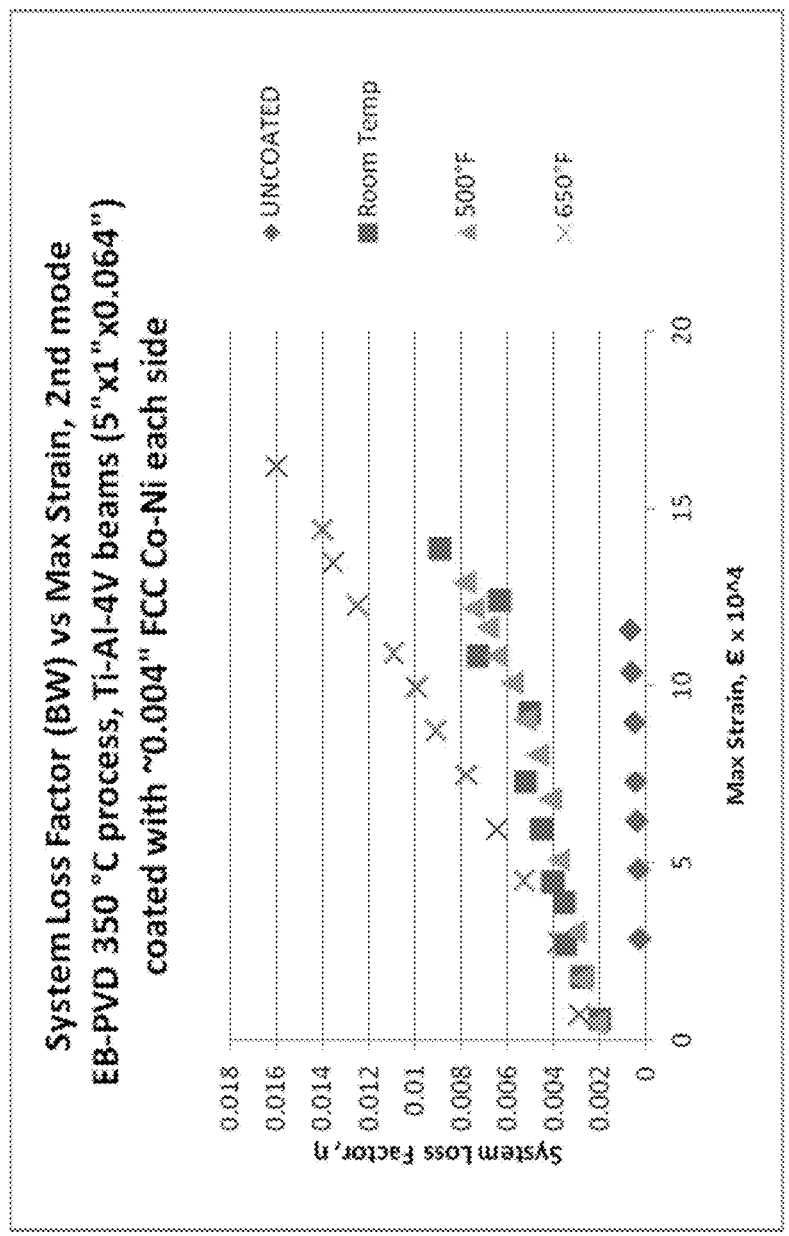
FIGS. 36 & 37 show a graph of a coated beam system loss factor versus max strain at the second bending mode for several test specimens.
Figure 37:
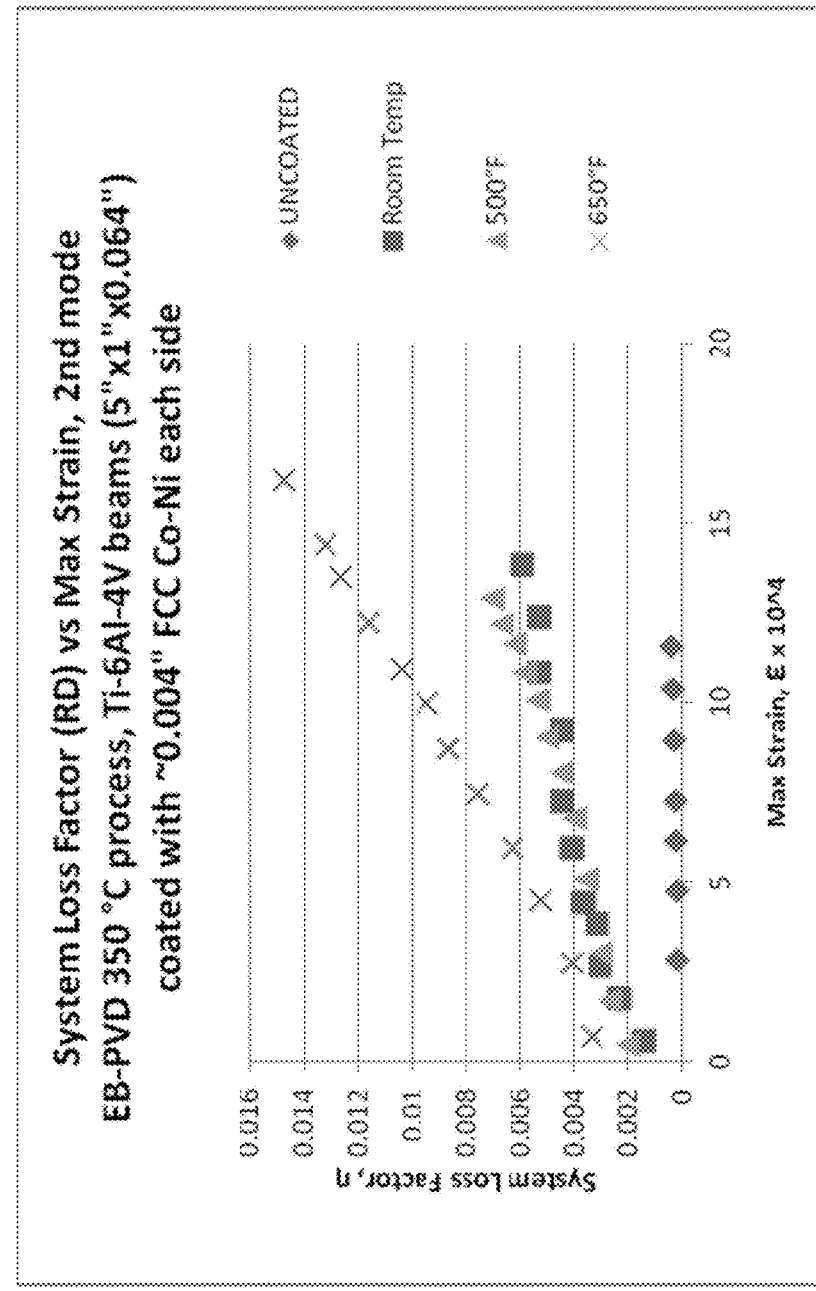
Figure 38:
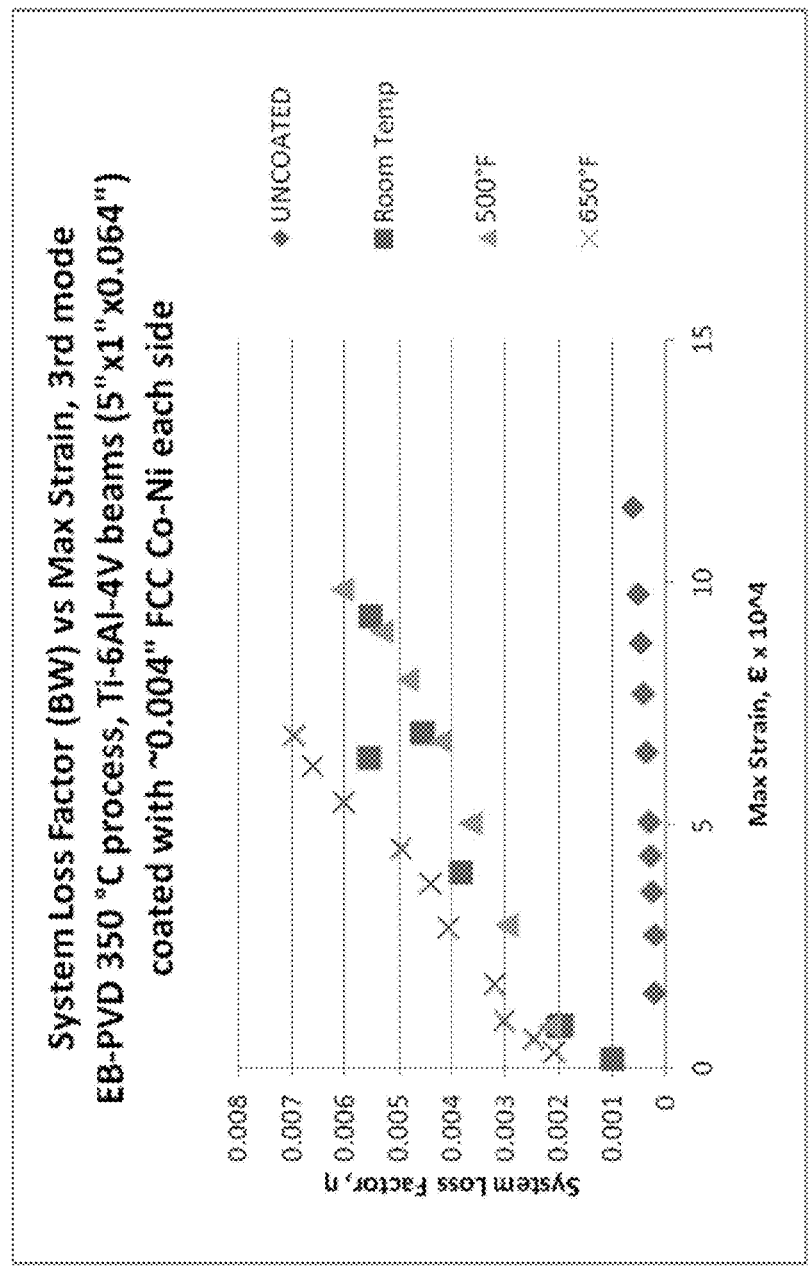
FIGS. 38 & 39 show a graph of a coated beam system loss factor versus max strain at the third bending mode for several test specimens.
Figure 39:
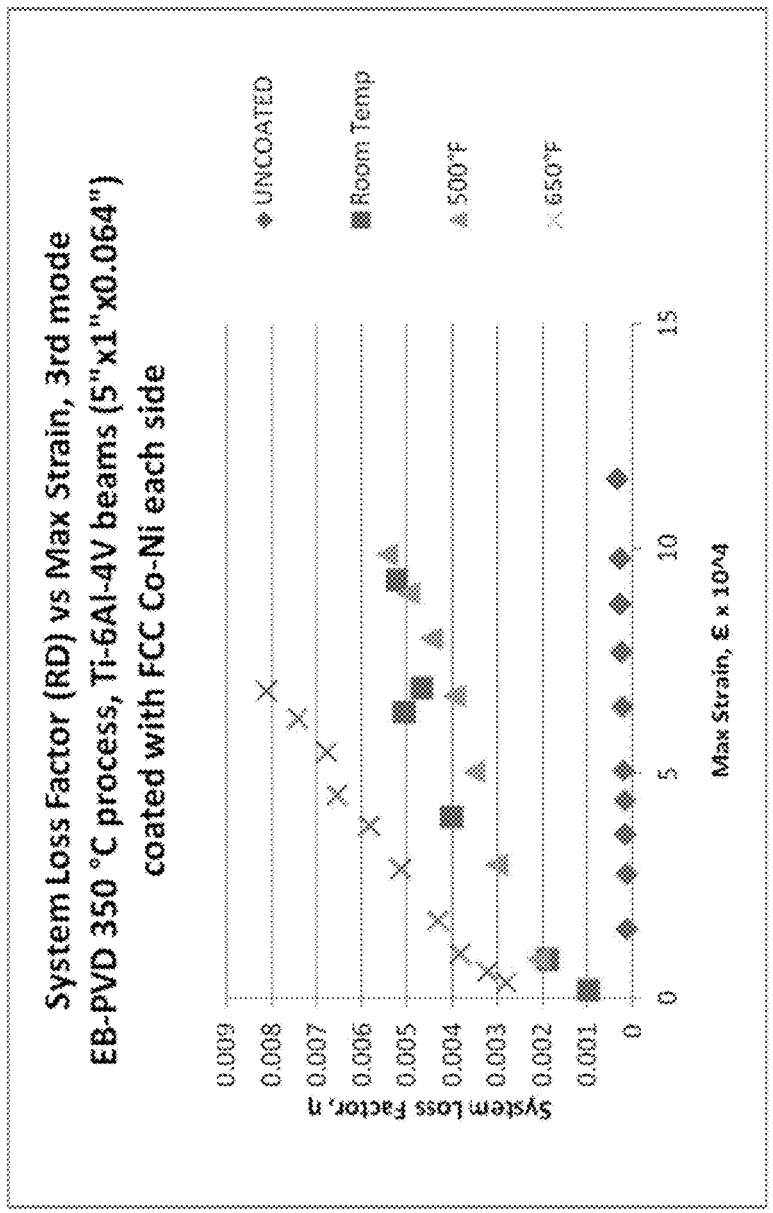
Figure 40:
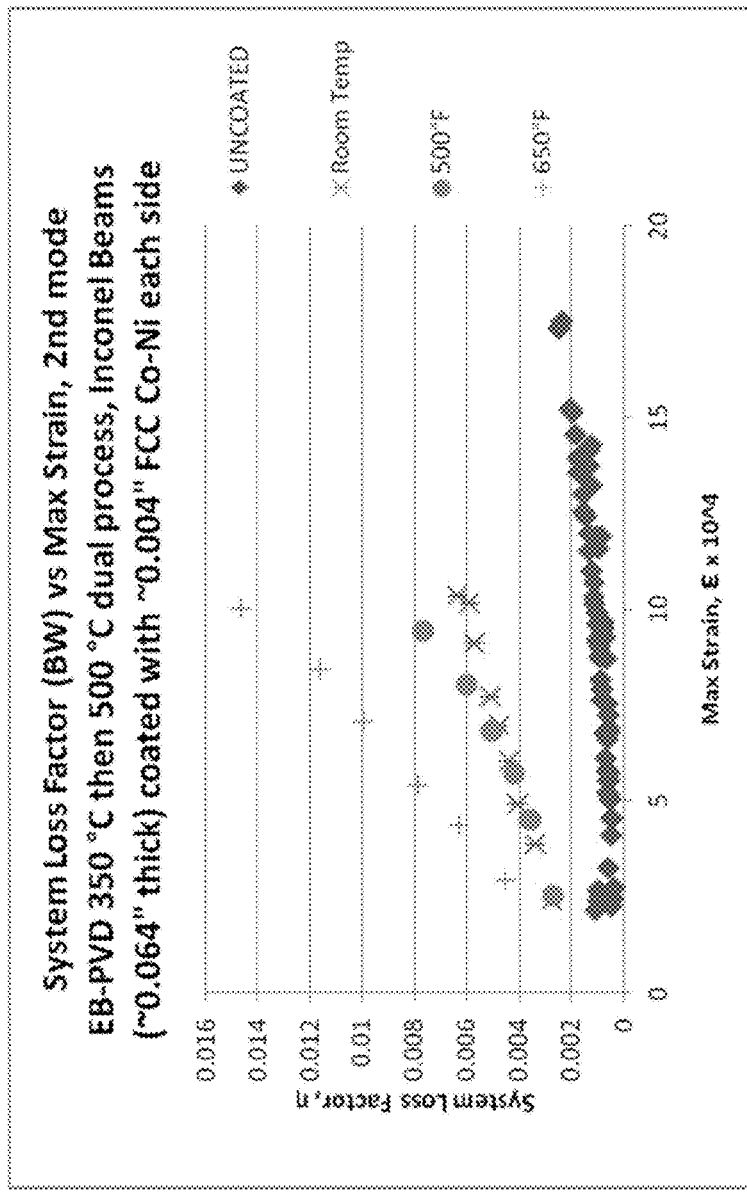
FIGS. 40 & 41 show a graph of a coated beam system loss factor versus max strain at the second bending mode for several test specimens.
Figure 41:
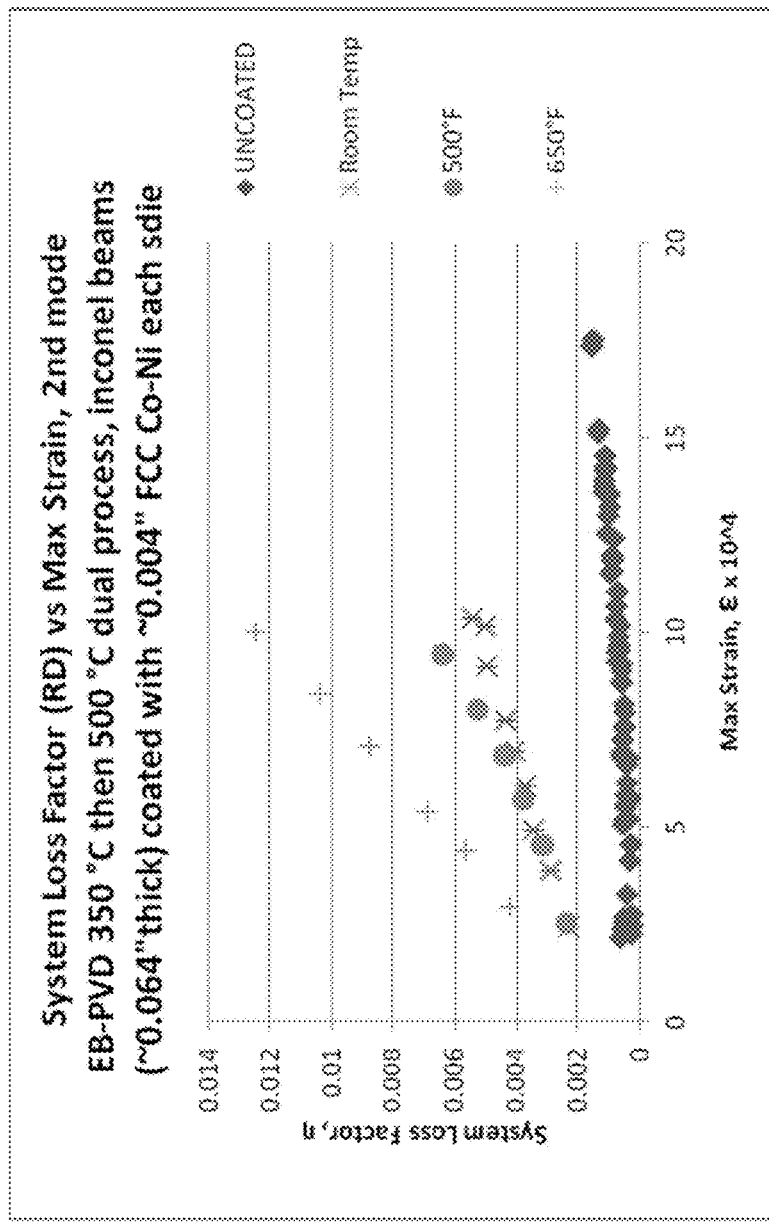
Figure 42:
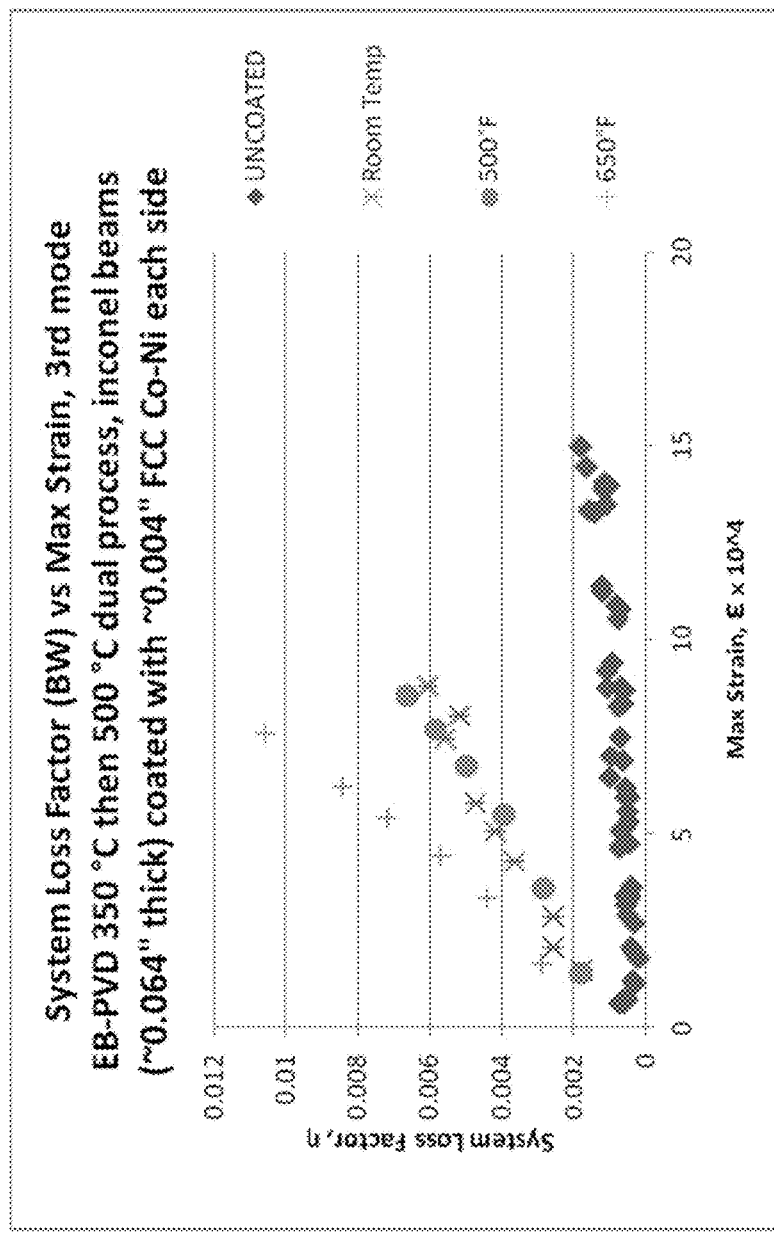
FIGS. 42 & 43 show a graph of a coated beam system loss factor versus max strain at the third bending mode for several test specimens.
Figure 43:
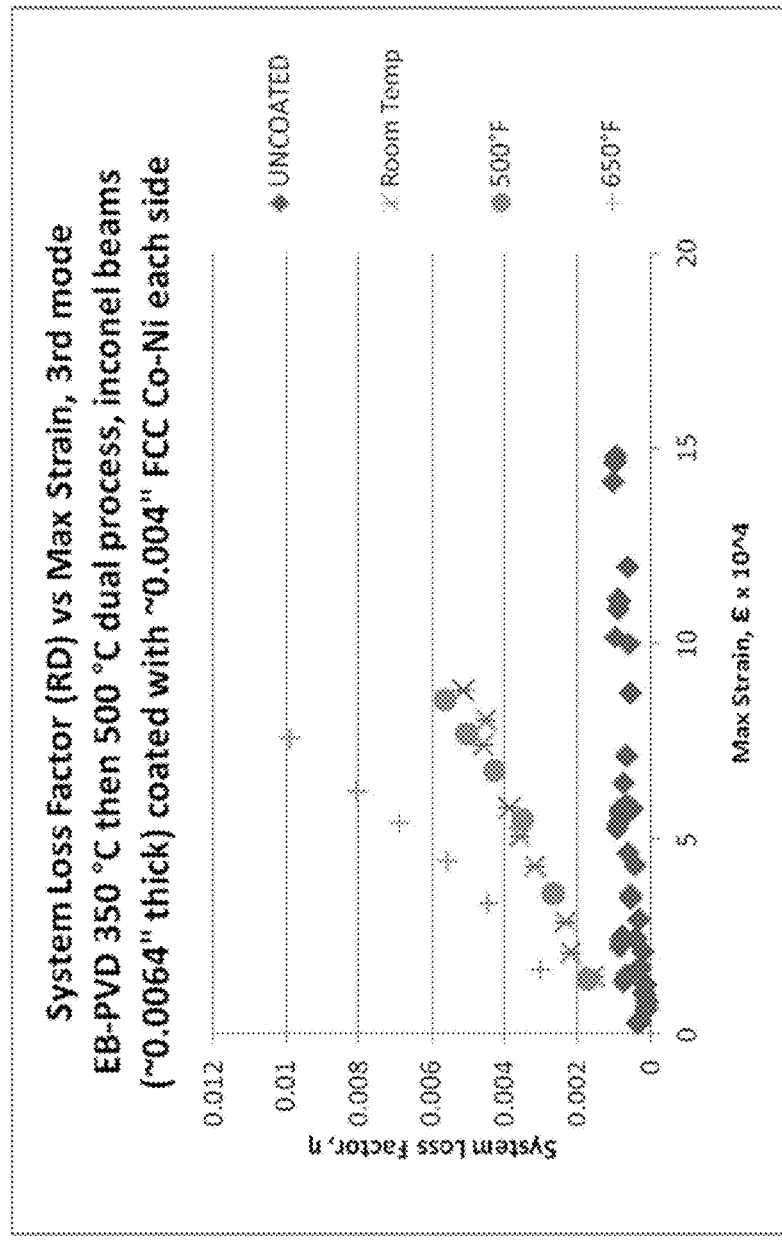

A comparison of FIG. 36 and FIG. 15 illustrates the shift in damping capabilities when the application temperature of the face-centered cubic ferromagnetic damping coating (10) is varied. FIG. 36 illustrates the second mode coated beam system loss factor of a Ti—Al-4V coated beam embodiment with the face-centered cubic ferromagnetic damping coating applied to the beam at 350° C., whereas FIG. 15 illustrates the second mode coated beam system loss factor of a Ti—Al-4V coated beam embodiment, a slightly different size, with the face-centered cubic ferromagnetic damping coating applied to the beam at 500° C. Comparing the diamonds of FIG. 15 with the squares of FIG. 36 it is easy to see that at 500 micro-strain level the second mode coated beam system loss factor of FIG. 36 is approximately 0.004 when applied at 350° C., whereas at the 500 micro-strain level the second mode coated beam system loss factor of FIG. 15 is approximately 0.008 when applied at 500° C. Likewise at 1000 micro-strain the second mode coated beam system loss factor of FIG. 36 is approximately 0.006 when applied at 350° C., whereas at the 1000 micro-strain level the second mode coated beam system loss factor of FIG. 15 is approximately 0.015 when applied at 500° C. Thus the test results on coated beams indicate that low temperature EB-PVD process embodiments (<350° C.) usually produces small grain size in the face-centered cubic ferromagnetic damping coating (10) which in turn leads to a significant increase of their damping capacity at low strain. However, the damping capacity at high strain decreases approximately 25% in maximum strain level in comparison with a higher temperature EB-PVD process embodiment (>500° C.). This behavior is determined to be contributed from the change of the mechanism of vibratory energy dissipation associated with the domain walls movement. Therefore, by controlling the substrate temperature from 275-550° C. during the EB-PVD process, predetermined damping characteristics can be achieved with respect to desired strain regions or vibration modes.

An even further embodiment incorporates three or more distinct layers of the face-centered cubic ferromagnetic damping coating (10), each applied at a different temperature to achieve a desired damping profile across a wide strain range, and/or target damping in specific modes, via the control of coating's grain size in each layer. Thus, in one embodiment a first PVD face-centered cubic ferromagnetic damping coating layer is applied to a substrate maintained at a first layer temperature of 275° C.-350° C., a second PVD face-centered cubic ferromagnetic damping coating layer is applied to the substrate while maintaining it at a second layer temperature that is at least 25° C. greater than the first layer temperature, and a third PVD face-centered cubic ferromagnetic damping coating layer is applied to the substrate while maintaining it at a third layer temperature that is at least 25° C. greater than the second layer temperature, thereby providing a minimum disparity of grain size, and thus strain damping characteristics. In a further embodiment the grain size disparity is increased by having the second layer temperature at least 50° C. greater than the first layer temperature and the third layer temperature at least 50° C. greater than the second layer temperature, while an even further embodiment has the second layer temperature at least 100° C. greater than the first layer temperature and the third layer temperature at least 100° C. greater than the second layer temperature. Yet a further embodiment has a third layer temperature that is at least 20% greater than the second layer temperature; and another embodiment has a third layer temperature that is at least 40% greater than the second layer temperature, and an even further embodiment has a third layer temperature that is 40%-100% greater than the second layer temperature.

In another embodiment variable grain size, and thus damping properties, is achieved in a single layer of the face-centered cubic ferromagnetic damping coating (10) by controlling different areas of the substrate at different temperatures during the coating process. In many applications that benefit from damping coatings the weight of the coating is important. One way of controlling the weight added to the substrate is to accomplish several goals within a single layer of the face-centered cubic ferromagnetic damping coating (10). This may be accomplished by maintaining different regions of the substrate at different temperatures during the coating process by a heat sink in contact with the substrate. The heat sink may be an external heat sink in contact with a particular portion of the substrate, or may be an internal heat sink designed into the substrate, such as one designed to receive a cooling medium. Conversely, the maintenance of different regions of the substrate at different temperatures may be accomplished with localized heating of the substrate rather than localized cooling. The localized heating may be achieved via an external heat source or an internal heat source. Regardless of whether local cooling or heating is used, a first substrate region is maintained at a first region temperature during the coating process and a second substrate region is maintained at a second region temperature during the coating process. In one embodiment the second region temperature that is at least 25° C. greater than the first region temperature, thereby providing a minimum disparity of grain size within a single layer of face-centered cubic ferromagnetic damping coating (10). In a further embodiment the grain size disparity is increased by having the second region temperature at least 50° C. greater than the first region temperature, while an even further embodiment has the second region temperature at least 100° C. greater than the first region temperature. Yet a further embodiment has a second region temperature that is at least 20% greater than the first region temperature; and another embodiment has a second region temperature that is at least 40% greater than the first region temperature, and an even further embodiment has a second region temperature that is 40%-100% greater than the first region temperature. On example where such embodiments may be desirable is in a rotating blade application in which greater high strain damping is desired toward the tip of the blade. Alternative embodiments may be designed to have different damping properties toward the leading edge of a rotating blade.

Alternatively the single layer may be applied in a stepwise process to eliminate the need for localized heating or cooling. For instance, the substrate may be masked to expose the first region to the face-centered cubic ferromagnetic damping coating process at a first temperature, then the substrate may be masked to expose the second region to the face-centered cubic ferromagnetic damping coating process at a second temperature. The first region and the second region need not come in contact with one another, but may. Thus, in this embodiment the substrate ends up with a single thickness of face-centered cubic ferromagnetic damping coating (10) having different grain sizes and damping attributes in light of the different temperature relationships previously disclosed but not repeated here for brevity.

Much like the Ti-6Al-4V coated test beams benefited from a dual process coating, so to did the Inconel coated test beams illustrated in FIGS. 40-43, while the stainless steel test beams performed well when the lower temperature 350° C. EB-PVD coating step was skipped and the entire coating was applied in one step at the elevated temperature of 500° C. Applying the lower temperature 350° C. EB-PVD coating step to the titanium and Inconel substrates provided a protective layer to shield at least a portion of the substrate from the higher temperature 500° C. EB-PVD coating step, thereby reducing potential spalling and fatigue issues. The dual step embodiment of ~0.064" thick Inconel coated test beams using a dual process including a first 0.002" thick EB-PVD coating layer applied at 350° C. and a second 0.002" thick EB-PVD coating layer applied at 500° C. reveals interesting high temperature damping benefits afforded by the dual process embodiment. The dual step embodiment not only improves the quality of the face-centered cubic ferromagnetic damping coating but it also improves the speed of the process, reduces the likelihood of fatigue issues, and increases the test beam system loss factor, particularly in high temperature environments as illustrated by the 650° F. test data of FIG. 40. In fact, in one dual step embodiment the second mode coated beam system loss factor is at least 0.006 at 500 micro-strain and at least 0.012 at 1000 micro-strain, when tested at 650° F. In another embodiment the high temperature second mode coated beam system loss factor data has a slope of greater than 0.00001, when tested at 650° F.; while another embodiment has a high temperature second mode coated beam system loss factor data has a slope of greater than 0.000015, when tested at 650° F.; and an even further embodiment has a high temperature second mode coated beam system loss factor data has a slope of greater than 0.00002.

Similarly 0.079" thick stainless steel coated test beams coated using the present face-centered cubic ferromagnetic damping coating (10) using the disclosed methods also exhibits excellent high temperature damping characteristics, even without the use of a dual step coating process. The stainless steel coated test beams of FIGS. 32-35 were coated in a single step applied at 500° C. using an EB-PVD embodiment to a coating thickness of ~0.005" on each side of the test beam. This high temperature application improves the quality of the face-centered cubic ferromagnetic damping coating and also improves the speed of the process, and may increase the test beam system loss factor in high temperature environments. In fact, in one embodiment the second mode coated beam system loss factor is at least 0.006 at 500 micro-strain and at least 0.012 at 1000 micro-strain, when tested at 650° F. In another embodiment the high temperature second mode coated beam system loss factor data has a slope of greater than 0.00001, when tested at 650° F.; while another embodiment has a high temperature second mode coated beam system loss factor data has a slope of greater than 0.000015, when tested at 650° F.; and an even further embodiment has a high temperature second mode coated beam system loss factor data has a slope of greater than 0.00002.

The vibration damping associated with each coated beams is depicted graphically in terms of the system loss factor (η) versus max strain (ε). Each coated beam was cantilever clamped on a high power vibration shaker. Frequency response functions for each coated beam were measured utilizing an accelerometer and a laser-vibrometer for measuring the velocity or displacement of a point on the coated beam. In many of the figures including "(BW)" in the title the system loss factor was calculated using the half-power bandwidth method, hence the abbreviation "(BW)" in the titles. According to the half-power bandwidth method, a reference point on the frequency response function of √2/2, or 0.707, of the maximum amplitude is chosen. This amplitude crosses the frequency response function at two different frequencies, with the difference between these two different frequencies being the half-power band. The relationship between the half-power band and the frequency of the maximum amplitude (i.e., resonant frequency) is the measurement of the system loss factor (ii), which can be seen by the following equation:

$$\eta \approx \frac{\text{half} - \text{power band}}{\text{resonant frequency}}$$

The strain on each coated beam was determined via finite element method to correlate the displacement of the coated beam at a point to the strain at the root of the coated beam. The actual displacement at a specific point was then calculated from the measured velocity at that point while vibrating in a resonant mode. The following equation was used to calculate the displacement:

$$d = v/(2\pi f)$$

where "v" is the measured velocity of the coated beam at a point and "f" is the measured resonant frequency.

The strain at any point on the coated beam can then be determined from the calculated displacement of the coated beam and the mode shape. The coated beams were excited in cantilever bending modes (i.e., second bending mode, third bending mode, and fourth bending mode) and the data is referred to in terms of the max strain amplitude in the mode shape, which occurs at the root of the specimen. Using the finite element method, it is possible to find a conversion factor between observed displacement and root strain.

Regardless of the application technique, the face-centered cubic ferromagnetic damping coating (10) is applied as one or more thin layers. Applicant has found that applying the face-centered cubic ferromagnetic damping coating (10) having a coating thickness (12) of about 1% to about 30% of the substrate thickness (22) allows the ferromagnetic damping coating (10) to provide high damping at high strain levels without having an adverse effect on the substrate (20). For example, when the substrate (20) comprises a component of a gas turbine, a coating thickness (12) that is too large can decrease the efficiency and operability of the gas turbine component. In one embodiment, the face-centered cubic ferromagnetic damping coating (10) may be deposited one side of the substrate (20); while in other embodiments, the face-centered ferromagnetic damping coating (10) may be deposited on more than one side of the substrate (20). As used herein, coating thickness (12) refers to the total thickness of the face-centered ferromagnetic damping coating (10) applied to the substrate (20).

While the above disclosure describes the damping capabilities afforded by the face-centered cubic ferromagnetic damping materials, coatings, and methods with reference to the face-centered cubic ferromagnetic damping material test beam and its associated first mode test beam system loss factors for simplicity, as well as a face-centered cubic ferromagnetic damping coated test beam and its associated second mode coated beam system loss factor, one skilled in the art will appreciate that the damping capabilities may also be expressed in terms of a local loss factor, seen in FIG. 14. With reference again to FIG. 14, the local loss factor produced by the present method is unique in that it produces a face-centered cubic ferromagnetic damping coating having (a) a high local loss factor when a strain amplitude is 500-2000 micro-strain, and/or (b) a maximum local loss factor that occurs when the strain amplitude is greater than 250 micro-strain. In the past ferromagnetic damping coatings have generally been low strain coatings, seen in FIG. 14, which quickly reach their maximum local loss factor at a very low strain value, often less than 0.0001. Utilizing the unique face-centered cubic ferromagnetic damping coating materials and processes herein the maximum local loss factor can be achieved where it is needed most, namely in high strain values.

For example, the "low strain coating" illustrated in FIG. 14 is a body-centered cubic (BCC) low strain ferromagnetic damping coating characterized by a maximum local loss factor of approximately 0.0385 at a local strain of less than 100 micro-strain, and the local loss factor quickly falls to less than 0.010 by the 400 micro-strain level. The line labeled "cold spray high strain coating pre heat treated test data" illustrates an embodiment of the present invention which produced a local loss factor of at least 0.010 when the strain amplitude is anywhere in the range of 500-2000 micro-strain. Conversely, the prior art "low strain coating" shown in the figure illustrates that the local loss factor has already reached a maximum and is far less than 0.010 in the range of 500-2000 micro-strain. In fact, FIG. 14 illustrates an embodiment in which the line labeled "cold spray high strain coating pre heat treated test data" illustrates that the present invention produces a local loss factor of the coated substrate (100) of at least 0.013 when the strain amplitude is 500-2000 micro-strain. Further, the line labeled "cold spray high strain coating pre heat treated test data" demonstrates a maximum local loss factor occurs where the strain amplitude is greater than 500 micro-strain. Conversely, the prior art "low strain coating" shown in the figure illustrates that the local loss factor reaches a maximum local loss factor at less than 100 micro-strain.

In another embodiment the maximum local loss factor occurs where the strain amplitude is greater than 1500 micro-strain, again as illustrated by the "cold spray high strain coating pre heat treated test data" line of FIG. 14. Achieving a maximum local loss factor above 1500 micro-strain is particularly beneficial in high speed rotating turbines.

A further embodiment is characterized by a local loss factor that is greater than 0.010 throughout a consistent strain range wherein the consistent strain range is specifically defined any continuous range of strain that is at least 250 micro-strain from the lower end of the range to the upper end of the range, and the consistent strain range is above the level of 500 micro-strain. In one embodiment the local loss factor varies by no more than twenty-five percent throughout the consistent strain range. For example, in one embodiment the local loss factor is greater than 0.010 throughout a consistent strain range that stretches from 750-1000 micro-strain and varies by no more than twenty-five percent throughout the range of 750-1000 micro-strain, as illustrated by the "cold spray high strain coating pre-heat treated test data" embodiment of FIG. 14. Additional examples include the "cold spray high strain coating pre-heat treated test data" embodiment between the range of 250-500 micro-strain, between the range of 500-750 micro-strain, and between the range of 1000-1250 micro-strain; the "EB-PVD High Strain Coating" embodiment between the range of 500-750 micro-strain, and between the range of 750-1000 micro-strain; and the "cold spray high strain coating heat treated" embodiment between the range of 250-500 micro-strain, between the range of 500-750 micro-strain, between the range of 750-1000 micro-strain, between the range of 1000-1250 micro-strain, between 1250-1500 micro-strain, between 1500-1750 micro-strain, and between 1750-2000 micro-strain.

In another embodiment the consistent strain range is expanded to any range of at least 500 micro-strain above the level of 500 micro-strain and the variation of local loss factor is expanded only from twenty-five percent to fifty percent. For example, in one such embodiment the local loss factor is greater than 0.010 throughout a consistent strain range that stretches from 500-1000 micro-strain and varies by no more than fifty percent throughout the range of 500-1000 micro-strain. Additional examples include the "cold spray high strain coating pre-heat treated test data" embodiment between the range of 250-750 micro-strain, and between the range of 750-1250 micro-strain; the "EB-PVD High Strain Coating" embodiment between the range of 500-1000 micro-strain; and the "cold spray high strain coating heat treated" embodiment between the range of 250-750 micro-strain, between the range of 500-1000 micro-strain, and between the range of 750-1250 micro-strain.

In another embodiment the consistent strain range is expanded to any range of at least 1000 micro-strain above the level of 500 micro-strain and the variation of local loss factor is no more than fifty percent. For example, one such embodiment has a local loss factor that is greater than 0.010 throughout a consistent strain range that stretches from 250-1250 micro-strain and varies by no more than fifty percent throughout the range of 250-1250 micro-strain.

Such a predictable local loss factor throughout a consistent strain range is particularly desirable and offers excellent predictability for the designers of equipment subject to undesirable vibrations. Further, a drawback with only using a single ferromagnetic damping coating that is governed by either of the high and low strain coatings is that there will be a strain regime were the damping is weak. For a coating with damping characteristics that are described by the low strain coating the strong damping occurs only at low strains (50-100 micro-strain). If the strain is higher than a modest level of 200-300 micro-strain then the damping level is mostly saturated to the baseline level. On the other hand, for a high strain damping coating, the high damping occurs only at high strains. If the strain level is lower than 150 micro-strain then there less damping in the high strain than there would be for the low strain damping coating. Instead of accepting a trade-off between high damping in one strain regime and low damping in another strain regime, the present face-centered cubic ferromagnetic damping coating and method can achieve a highly damped system for low and high strains as shown via the integrated experimental and analytical approach illustrated in FIG. 14.

The previously disclosed method may also include a low temperature annealing process comprising heating the coated substrate (100) to a temperature less than 800 degrees Celsius thereby producing an annealed coated substrate having a local loss factor of at least 0.020 when the strain amplitude is 500-2000 micro-strain, and the maximum damping loss factor occurs where the strain amplitude is greater than 1000 micro-strain. In an even further embodiment the local loss factor of at least 0.030 when the strain amplitude is 500-2000 micro-strain, and the maximum damping loss factor occurs where the strain amplitude is greater than 1000 micro-strain. This embodiment is also illustrated with the test data of FIG. 14 and the line labeled "cold spray high strain coating heat treated." Thus, in this embodiment the low temperature annealing process more than doubles the local loss factor over the "cold spray high strain coating pre heat treated test data" line for the values of local strain in the range of 500 micro-strain to 1750 micro-strain, however it also increases the slope of the local loss factor. One particular low temperature annealing embodiment utilizes a process that heats the coated substrate (100) to a temperature of at least 300 degrees Celsius for an annealing period of less than 4 hours.

It is well known that when titanium and titanium alloys are subjected to a high temperature heat treatment, an oxygen-enriched layer, known as alpha case, will form on the surface of the titanium or titanium alloy. The alpha case is generally much harder and more brittle than the titanium or titanium alloy. For example, the alpha case layer generally has a Vicker's hardness number ranging from about 500 to 600, while the bulk hardness (i.e., the interior hardness) of the titanium or titanium alloy ranges from about 200 to 350. Moreover, a titanium or titanium alloy component that has been coated may still be susceptible to the formation of an alpha case layer. This can occur when oxygen diffuses through the coating layer and into the titanium or titanium alloy substrate microstructure just below the interface created between the coating layer and the surface of the titanium or titanium alloy substrate.

For many applications, an alpha case layer is highly undesirable because it has reduced fatigue resistance and tends to create a series of microcracks, which can reduce the metal's performance and cause failure. Generally, before the heat treated titanium or titanium alloy is utilized, the layer of alpha case must be removed by a chemical etching process or by mechanical means.

Unless noted otherwise, the local loss factors, the test beam system loss factors, and the coated beam system loss factors discussed herein are achieved without the need to perform a high temperature annealing process. By avoiding a high temperature annealing process, the likelihood of developing a very hard and brittle alpha case layer at the coating-substrate interface is substantially reduced. As a result, in one embodiment, a hardness of the titanium based substrate (20) at the coating-substrate interface may be within 25% of the bulk hardness (i.e., the interior hardness) of the titanium based substrate (20). In another embodiment, the hardness of the titanium based substrate (20) at the coating-substrate interface is within 5% of the bulk hardness of the titanium based substrate (20). The proximity of the hardness values indicate that very little, if any, alpha case has formed on the titanium based substrate (20). As a result, the turbine component comprising a titanium based substrate (20) is able to be damped by application of a face-centered cubic ferromagnetic damping coating (10) without having to undergo a high temperature annealing process, and thereby substantially avoids the formation of unwanted alpha case that can lead to early component failure.

The dependence of the damping capability, in terms of loss factor $\eta$ (or $Q^{-1}$), on vibratory strain amplitude of the coated beam and blade has been determined experimentally. The performance and effectiveness of the high strain damping were evaluated and demonstrated by the experimental results from a Ti-6Al-4V beam and a titanium blade coated with a thin layer of face-centered cubic ferromagnetic damping coating (10), specifically a high strain face-centered cubic ferromagnetic Co—Ni based damping coating, which was subjected to various exciting forces at room temperature. The face-centered cubic ferromagnetic damping coating (10) may have a coating thickness (12) of about 1% to about 30% of the substrate thickness (22).

As shown in FIGS. 8-13, in one embodiment the coated substrate (100) has a coated beam system loss factor of approximately 0.005 at strain amplitude of 150-3000 micro-strain without annealing, which increases to approximately 0.015 with a low temperature annealing process at 600° F. for 2.5 hours. FIGS. 8 and 9 illustrate the $4^{th}$ mode with FIG. 8 calculating the coated beam system loss factor via the half-power frequency bandwidth method (BW), while FIG. 9 calculates the coated beam system loss factor via the resonance dwell method (RD). Likewise, FIGS. 10 and 11 illustrate the 3rd mode with FIG. 10 calculating the coated beam system loss factor via the half-power frequency bandwidth method (BW), while FIG. 11 calculates the coated beam system loss factor via the resonance dwell method (RD). Similarly, FIGS. 12 and 13 illustrate the 2nd mode with FIG. 12 calculating the coated beam system loss factor via the half-power frequency bandwidth method (BW), while FIG. 13 calculates the coated beam system loss factor via the resonance dwell method (RD). The system loss factor of the uncoated beam is around 0.0003, which is about $\frac{1}{17}$ of the beam coated with the face-centered cubic ferromagnetic damping coating, and is about $\frac{1}{50}$ of the beam coated with the face-centered cubic ferromagnetic damping coating that has been subjected to the low temperature annealing step. The face-centered cubic ferromagnetic damping coating may provide even higher system loss factors for strain levels greater than 2000 micro-strain. The face-centered cubic ferromagnetic damping coating produces a system loss factor, or the energy dissipation density per cycle of the coating layer, that is largely independent of the vibratory frequency of coated substrates. This frequency independent feature allows this damping system to be capable of enhancing damping significantly at almost all the vibration modes of coated turbine blades including high order stripe modes in particular.

With reference to FIGS. 8-9, the coated beam system loss factor for the $4^{th}$ mode of a test beam coated with the present face-centered cubic ferromagnetic damping coating produces (a) a coated beam system loss factor that is greater than 0.002 when the strain is greater than 150 micro-strain, and (b) a maximum coated beam system loss factor that occurs when the strain amplitude is greater than 200 micro-strain. In a further low temperature heat treated embodiment in which the specimen is heated to 600° F. for 2.5 hours, the present face-centered cubic ferromagnetic damping coating produces (a) a coated beam system loss factor that is greater than 0.010 when the strain is greater than 100 micro-strain, and (b) a maximum coated beam system loss factor that occurs when the strain amplitude is greater than 100 micro-strain. Similarly, with reference to FIGS. 10-11, the coated beam system loss factor for the 3rd mode of a test beam coated with the present face-centered cubic ferromagnetic damping coating produces (a) a coated beam system loss factor that is greater than 0.002 when the strain is greater than 150 micro-strain, and (b) a maximum coated beam system loss factor that occurs when the strain amplitude is greater than 200 micro-strain. In a further low temperature heat treated embodiment in which the specimen is heated to 600° F. for 2.5 hours, the present face-centered cubic ferromagnetic damping coating produces (a) a coated beam system loss factor that is greater than 0.010 when the strain is greater than 100 micro-strain, and (b) a maximum coated beam system loss factor that occurs when the strain amplitude is greater than 100 micro-strain. Similarly, with reference to FIGS. 12-13, the coated beam system loss factor for the $2^{nd}$ mode of a test beam coated with the present face-centered cubic ferromagnetic damping coating produces (a) a coated beam system loss factor that is greater than 0.002 when the strain is greater than 150 micro-strain, and (b) a maximum coated beam system loss factor that occurs when the strain amplitude is greater than 200 micro-strain. In a further low temperature heat treated embodiment in which the specimen is heated to 600° F. for 2.5 hours, the present face-centered cubic ferromagnetic damping coating produces (a) a coated beam system loss factor that is greater than 0.010 when the strain is greater than 100 micro-strain, and (b) a maximum coated beam system loss factor that occurs when the strain amplitude is greater than 100 micro-strain.

While FIGS. 8-13 illustrated specific embodiments in which the face-centered cubic ferromagnetic damping coatings were applied using a cold spray embodiment, FIGS. 15-17 illustrate similar system loss factor data for embodiments in which the face-centered cubic ferromagnetic damping coatings was applied using an EB-PVD process embodiment and a HVOF process embodiment, thereby illustrating similar high strain damping capabilities of the face-centered cubic ferromagnetic damping coating when applied in the partially molten state of the HVOF process or as a vapor via the EB-PVD process. As seen in FIG. 15, the system loss factor for the $2^{nd}$ mode of a test beam coated with the present face-centered cubic ferromagnetic damping coating produces (a) a coated beam system loss factor that is greater than 0.002 when the strain is greater than 150 micro-strain, and (b) a maximum coated beam system loss factor that occurs when the strain amplitude is greater than 200 micro-strain, whether applied using the EB-PVD process or the HVOF process. As seen in FIG. 16, the system loss factor for the $3^{rd}$ mode of a test beam coated with the present face-centered cubic ferromagnetic damping coating produces (a) a coated beam system loss factor that is greater than 0.002 when the strain is greater than 150 micro-strain, and (b) a maximum coated beam system loss factor that occurs when the strain amplitude is greater than 200 micro-strain, whether applied using the EB-PVD process or the HVOF process. Further, as seen in FIG. 25, the system loss factor for the $4^{th}$ mode of a test beam coated with the present face-centered cubic ferromagnetic damping coating produces (a) a coated beam system loss factor that is greater than 0.002 when the strain is greater than 150 micro-strain, and (b) a maximum coated beam system loss factor that occurs when the strain amplitude is greater than 200 micro-strain, whether applied using the EB-PVD process or the HVOF process. FIGS. 15-17 each contains two sets of data labeled as "EB-PVD Coated (FCC)" which simply correspond to data from two different test specimens which is why the data points are virtually identical.

FIG. 7 illustrates the test results in the damping capability in terms of test beam system loss factor ($\eta$ or $Q^{-1}$) with respect to strain amplitude for an embodiment of the present face-centered cubic ferromagnetic damping coating material. For typical body-centered cubic (BCC) low strain damping coating materials, similar to the test results shown in FIG. 6, the test beam system loss factor increases rapidly as the forcing accelerations increases and reaches a stationary value as the maximum strain of the beam approaching 80 to 100 micro-strain and then decreases relatively quickly at higher strain regions. On the other hand, the present face-centered cubic ferromagnetic damping coating material produces a test beam system loss factor, without heat treatment, that increases rapidly as the forcing accelerations increases and reaches a stationary value as the maximum strain of the coated beam approaching 250 micro-strain and then remains in the high damping region to about 1200 micro-strain, after which the test beam system loss factor increases rapidly at higher strain regions. Further, as disclosed elsewhere, embodiments incorporating a low temperature annealing step further increase the coated beam system loss factors.

As previously mentioned, the present methods produces a coating with low residual stress. In one particular embodiment the face-centered cubic ferromagnetic damping coating (10) has a low residual stress within a range of ±50 MPa without the coated substrate ever being subjected to an annealing temperature of above 700° C. for an annealing period of longer than 30 minutes. In another embodiment the majority of the residual stress present in the face-centered cubic ferromagnetic damping coating (10) is compressive residual stress. In an even further embodiment produced by the solid state cold spray application method there is no tensile residual stress present in the face-centered cubic ferromagnetic damping coating (10).

The cold spray process and HVOF processes disclosed herein produce many great advantages in creating a low residual stress high strain face-centered cubic ferromagnetic damping coating (10), however the processes tend to produce a coating that is relatively rough. Therefore another embodiment incorporates a polishing step wherein majority of the surface area of the coated substrate (100) has a surface roughness of less than 0.635 μm for Ra. An even further embodiment polishes the face-centered cubic ferromagnetic damping coating (10) so that majority of the surface area has a surface roughness of less than 0.127 μm for Ra, less than 0.254 μm for Rq, and less than 0.762 μm for Rt.

One particular embodiment produces a coated substrate (100) has a Vickers hardness of at least 250 HV. An even further embodiment has a coated substrate (100) with a Vickers hardness of at least 350 HV, and yet another embodiment the hardness of the coated substrate (100) is at least 10% greater than the hardness of the substrate (20). Such hardness embodiments may be achieved by introducing a carbide material such as silicon carbide (SiC) in the face-centered cubic damping powder, or including a step of applying a separate erosion-resistant damping coating (16) or a separate erosion-resistant coating, seen in FIG. 3, onto the face-centered cubic ferromagnetic damping coating (10), identified as element #14 in the illustrated multi-layer embodiments, to create the coated substrate (100). Such an erosion-resistant damping coating may achieve high erosion and wear resistance along with increased stiffness, strength, hardness, improved corrosion resistance, and high temperature oxidation resistance. Other hard metal carbides such as tungsten carbine and boron carbide may also be used. In the multiple layer embodiment one particular subembodiment is designed so that the face-centered cubic ferromagnetic damping coating (14) has a Vickers hardness of less than 300 HV, while the erosion-resistant damping coating (16) contains a carbide material and increases the hardness of the coated substrate (100) to a Vickers hardness of at least 350 HV. In this embodiment the softer face-centered cubic ferromagnetic damping coating (14) layer significantly suppresses blade vibration and improves interface adhesion. The combination of a hard erosion-resistant damping coating (16) and a soft interior face-centered cubic ferromagnetic damping coating (14) provides the ability to withstand very high stress and fatigue which therefore can act as a damage barrier to prevent cracks from penetrated into the substrate and to arrest cracks initiated from the substrate.

Figure 3:
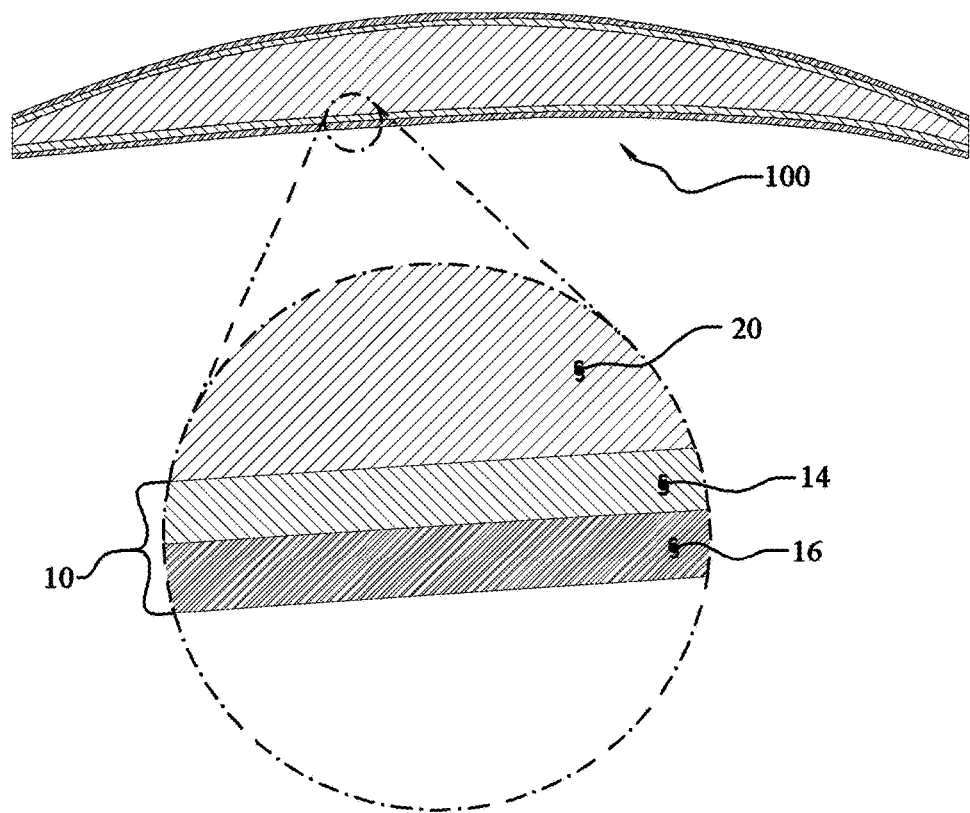
FIG. 3 is a cross-sectional view of a substrate with a face-centered cubic ferromagnetic damping coating applied to a surface thereof, not to scale.

Extraordinary hardness may be achieved using a PVD process, including but not limited to EB-PVD, arc-PVD, and sputtering, to apply a separate erosion-resistant damping coating (16) or a separate erosion-resistant coating with minimal damping attributes such as a composite ceramic material to increases the hardness of the coated substrate (100) to a Vickers hardness of at least 500 HV, seen in FIG. 3, onto the face-centered cubic ferromagnetic damping coating (10). One multilayered titanium nitride embodiment (TiN/Ti or TiN/TiCN or TiN/CrN), or nanocomposite layer of TiSiCN, achieves a Vickers hardness of at least 1000 HV, and in embodiment achieves a Vickers hardness of at least 1500 HV.

In the embodiments in which a carbide material is mixed in with the face-centered cubic damping powder, the powder composition of the face-centered cubic ferromagnetic damping powder material and carbide material may be varied from 2:1 up to 20:1 (weight %) depending on the desired hardness and/or erosion capability. In the embodiment in which a separate erosion-resistant damping coating is created, an erosion-resistant damping powder is directed at the face-centered cubic ferromagnetic damping coating (10), identified as element #14 in the illustrated multi-layer embodiments, at an application velocity of at least 300 meters/second using an erosion-resistant damping coating carrier gas at an erosion-resistant damping coating application pressure such that at least a portion of the erosion-resistant damping powder bonds to the face-centered cubic ferromagnetic damping coating (10) to create the coated substrate (100).

FIGS. 18-23 show the test results of Ti-6Al-4V beams coated with a two layer face-centered cubic ferromagnetic damping coating (10) having a first face-centered cubic ferromagnetic damping coating (14), as seen in FIG. 3, applied to the substrate (20) via a cold spray process, and an erosion-resistant damping coating (16) applied to the first face-centered cubic ferromagnetic damping coating (14) via a cold spray process. The erosion-resistant damping coating (16) layer includes a face-centered cubic damping coating powder mixed with silicon carbide powder. The comparison of damping test results of coated, coated and heat treated, and uncoated beams illustrates that the coated beam system loss factor is increased approximately ten-fold which indicates that vibratory stresses are reduced on the order of 80% compared to the uncoated beam. Such multi-layer embodiments of the face-centered cubic ferromagnetic damping coating (10) also produce a maximum coated beam system loss factor occurs where the strain amplitude is greater than 250 micro-strain. Additionally, in some embodiments the coated substrate (100) has a coated beam system loss factor of at least 0.010 when the strain amplitude is 500-2000 micro-strain. Upon review of FIGS. 18-23 one skilled in the art will recognize the multi-layer embodiments of the face-centered cubic ferromagnetic damping coating (10) may also achieve any of the coated beam system to strain relationships that have been previously disclosed, which will not be repeated again here for the sake of brevity.

Lastly, one skilled in the art will appreciate that the present invention is not limited to the method of increasing the damping of the substrate (20), but includes the products produced. Thus, the substrate (20) may comprise a turbine component, such as a fan blade, compressor blade, impeller, blisk, or integrally bladed rotor; a sports implement; automotive component; or virtually any component that subjected to vibrations in use that are undesirable, just to name a few. The substrate (20) may be formed of virtually any metal including, but not limited to, titanium, titanium-based alloys, steel alloys, nickel, nickel-based alloys, aluminum, and aluminum-based alloys. As used herein, the term "turbine" may refer to gas turbines, steam turbines, water turbines, wind turbines, or any other type of turbine or components thereof that experience vibrational stresses. Further, one skilled in the art will recognize that although the experimental examples described throughout this disclosure repeatedly refer to EB-PVD, the present invention is not limited to EB-PVD and may incorporate other physical vapor deposition (PVD) variants including, but not limited to, cathodic arc deposition, evaporative deposition, pulsed laser deposition, and sputter deposition, just to name a few.

Numerous alterations, modifications, and variations of the preferred embodiments disclosed herein will be apparent to those skilled in the art and they are all anticipated and contemplated to be within the spirit and scope of the method for applying a low residual stress face-centered cubic ferromagnetic damping coating, as claimed below. For example, although specific embodiments and examples have been described in detail, those with skill in the art will understand that the preceding embodiments and variations can be modified to incorporate various types of substitute and or additional or alternative processes and materials, relative arrangement of elements, and dimensional configurations. Accordingly, even though only few variations of the method are described herein, it is to be understood that the practice of such additional modifications and variations and the equivalents thereof, are within the spirit and scope of the method as defined in the following claims.

I claim:

1. A method to increase the damping of a substrate, comprising:
   a) creating a face-centered cubic damping material ingot comprising a face-centered cubic damping material;
   b) placing the face-centered cubic damping material ingot and the substrate in a vacuum chamber;
   c) heating the substrate to a first layer temperature;
   d) forming a vapor from the face-centered cubic damping material ingot;
   e) condensing the vapor on a surface of the substrate to create a first layer face-centered cubic ferromagnetic damping coating having a first grain size on the surface of the substrate;
   f) heating the substrate and the first layer face-centered cubic ferromagnetic damping coating to a second layer temperature that is at least 25 degrees Celsius greater than the first layer temperature; and
   g) condensing the vapor on at least a portion of the first layer face-centered cubic ferromagnetic damping coating to create a second layer face-centered cubic ferromagnetic damping coating having a second grain size different than the first grain size, resulted in a coated substrate.

2. The method according to claim 1, wherein the first layer face-centered cubic ferromagnetic damping coating and the second layer face-centered cubic ferromagnetic damping coating have a low residual stress within a range of ±50 MPa without the coated substrate ever being subjected to an annealing temperature of above 700° C. for an annealing period of longer than 30 minutes.

3. The method according to claim 1, further including a polishing step wherein majority of the surface area of the coated substrate has a surface roughness of less than 0.635 μm for Ra.

4. The method according to claim 1, wherein the coated substrate has a Vickers hardness of at least 250 HV.

5. The method according to claim 4, wherein the coated substrate has a Vickers hardness of at least 500 HV.

6. The method according to claim 1, wherein the face-centered cubic damping material is selected from the group consisting of Co—Ni based face-centered cubic compositions, Co—Mn based face-centered cubic compositions, and Fe—Mn based face-centered cubic compositions.

7. The method according to claim 1, wherein the first layer temperature is 50-350 degrees Celsius.

8. The method according to claim 1, wherein the second layer temperature that is at least 50 degrees Celsius greater than the first layer temperature.

9. The method according to claim 1, wherein the second layer temperature is 20-100% greater than the first layer temperature.

10. The method according to claim 1, wherein the substrate comprises a component of a turbine.

11. The method according to claim 1, wherein the combination of the first layer face-centered cubic ferromagnetic damping coating and the second layer face-centered cubic ferromagnetic damping coating has preferential high temperature damping properties characterized by a high temperature second mode coated beam system loss factor that increases from 500 micro-strain to 1000 micro-strain with a slope of greater than 0.00001, when tested at 500° F.

12. A method to increase the damping of a substrate, comprising:
   a) creating a face-centered cubic damping material ingot comprising a face-centered cubic damping material selected from the group consisting of Co—Ni based face-centered cubic compositions having 20-40 weight % nickel, Co—Mn based face-centered cubic compositions having 15-26 weight % manganese, and Fe—Mn based face-centered cubic compositions having 13-25 weight % manganese;
   b) placing the face-centered cubic damping material ingot and the substrate in a vacuum chamber;
   c) heating the substrate to a first layer temperature;
   d) forming a vapor from the face-centered cubic damping material ingot;
   e) condensing the vapor on a surface of the substrate to create a first face-centered cubic ferromagnetic damping coating, having a first grain size, on the surface of the substrate; and
   f) applying a separate erosion-resistant coating onto at least a portion of the first face-centered cubic ferromagnetic damping coating at a temperature different than the first layer temperature, wherein the erosion-resistant coating increases the hardness to a Vickers hardness of at least 500 HV, wherein the step of applying the erosion-resistant coating includes the steps of:
   i) creating an erosion-resistant material ingot;
   ii) placing the erosion-resistant material ingot and the substrate having the first face-centered cubic ferromagnetic damping coating in a vacuum chamber;
   iii) heating the substrate and the first face-centered cubic ferromagnetic damping coating to a second layer temperature that is at least 25 degrees Celsius greater than the first layer temperature;
   iv) forming a second vapor from the erosion-resistant material ingot and reacting the second vapor with nitrogen within the vacuum chamber; and
   v) condensing the second vapor on at least a portion of the first layer face-centered cubic ferromagnetic damping coating to create the erosion-resistant coating having a second grain size different than the first grain size.

13. The method according to claim 12, wherein the erosion-resistant coating contains a carbide material.

14. The method according to claim 12, wherein the erosion-resistant coating contains a composite ceramic material.

15. The method according to claim 12, wherein the second layer temperature that is at least 50 degrees Celsius greater than the first layer temperature.

16. The method according to claim 12, wherein the second layer temperature is 20-100% greater than the first layer temperature and the erosion-resistant coating increases the hardness to a Vickers hardness of at least 1000 HV.

17. The method according to claim 16, wherein the erosion-resistant coating includes at least one of TiN, TiCN, CrN, and TiSiCN.

18. The method according to claim 12, wherein the first face-centered cubic ferromagnetic damping coating has a Vickers hardness of less than 300 HV.

* * * * *